US011581480B2

(12) United States Patent
Akahane

(10) Patent No.: US 11,581,480 B2
(45) Date of Patent: Feb. 14, 2023

(54) SIGNAL TRANSMITTING DEVICE

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 1404 days.

(21) Appl. No.: 15/879,713

(22) Filed: Jan. 25, 2018

(65) Prior Publication Data

US 2018/0151796 A1 May 31, 2018

Related U.S. Application Data

(63) Continuation of application No. PCT/JP2017/000332, filed on Jan. 6, 2017.

(30) Foreign Application Priority Data

Feb. 18, 2016 (JP) .............................. JP2016-028705
Jul. 13, 2016 (JP) .............................. JP2016-138834

(51) Int. Cl.
*H01L 41/09* (2006.01)
*B81B 7/02* (2006.01)
(Continued)

(52) U.S. Cl.
CPC ................ *H01L 41/09* (2013.01); *B81B 7/02* (2013.01); *G01D 11/24* (2013.01); *H01L 23/04* (2013.01);
(Continued)

(58) Field of Classification Search
CPC .............................. H01L 41/311; H01L 27/20
See application file for complete search history.

(56) References Cited

U.S. PATENT DOCUMENTS 5,766,975 A  6/1998 Templeton, Jr. et al.
6,188,322 B1 2/2001 Yao et al.
(Continued)

FOREIGN PATENT DOCUMENTS

JP   S52-134481 A   11/1977
JP   S59-149750 U   10/1984
(Continued)

*Primary Examiner* — Farun Lu
(74) *Attorney, Agent, or Firm* — Rabin & Berdo, P.C.

(57) ABSTRACT

A pressure sensor element and a receiving circuit are formed on an IC chip. A transmitting circuit and a piezoelectric element of an actuator are respectively formed on a transmitting chip and a piezoelectric chip. The piezoelectric chip and the pressure sensor face each other separated by a distance in an airtight first space surrounded by a package main body and a base substrate. Dielectric breakdown voltage of signal transmission from the primary side to the secondary side is set by the distance. The first space is a pressure propagation region including an insulating medium capable of transmitting vibrations of the piezoelectric element as pressure. The signal transmission is performed with high insulation by the pressure generated in the pressure propagation region between components integrated in a single module by insulating the primary side and the secondary side from each other by the insulating medium of the pressure propagation region.

19 Claims, 31 Drawing Sheets

(51) Int. Cl.
*H01L 23/04* (2006.01)
*H04B 11/00* (2006.01)
*H01L 25/18* (2006.01)
*H01L 25/04* (2014.01)
*G01D 11/24* (2006.01)
*H01L 25/16* (2006.01)
*H01L 27/20* (2006.01)
*H01L 41/311* (2013.01)
*H01L 27/12* (2006.01)
*H01L 29/786* (2006.01)
*H05K 1/11* (2006.01)
*H05K 1/18* (2006.01)

(52) U.S. Cl.
CPC ............ *H01L 25/04* (2013.01); *H01L 25/162* (2013.01); *H01L 25/18* (2013.01); *H01L 27/1255* (2013.01); *H01L 27/20* (2013.01); *H01L 29/7869* (2013.01); *H01L 41/311* (2013.01); *H04B 11/00* (2013.01); *H05K 1/115* (2013.01); *H05K 1/182* (2013.01); *B81B 2201/0264* (2013.01); *B81B 2207/096* (2013.01); *H01L 2224/48091* (2013.01); *H01L 2224/48137* (2013.01); *H01L 2224/48227* (2013.01)

(56) References Cited

U.S. PATENT DOCUMENTS

| | | | |
|---|---|---|---|
| 7,525,398 B2 * | 4/2009 | Nishimura | H04B 11/00 375/302 |
| 2006/0001123 A1 | 1/2006 | Heck et al. | |
| 2007/0158826 A1 * | 7/2007 | Sakakibara | B81B 7/0064 257/723 |
| 2011/0134725 A1 | 6/2011 | Su et al. | |
| 2012/0086305 A1 | 4/2012 | Ngo et al. | |
| 2014/0016558 A1 | 1/2014 | Lawry et al. | |

FOREIGN PATENT DOCUMENTS

| | | |
|---|---|---|
| JP | S61-033129 U | 2/1986 |
| JP | S63-126054 A | 5/1988 |
| JP | H04-015799 U | 2/1992 |
| JP | H11-340031 A | 12/1999 |
| JP | 2000-183828 A | 6/2000 |
| JP | 2007-536105 A | 12/2007 |
| JP | 2008-244244 A | 10/2008 |
| JP | 2009-066750 A | 4/2009 |
| JP | 2010-242806 A | 10/2010 |
| WO | WO-2012/141891 A1 | 10/2012 |

* cited by examiner

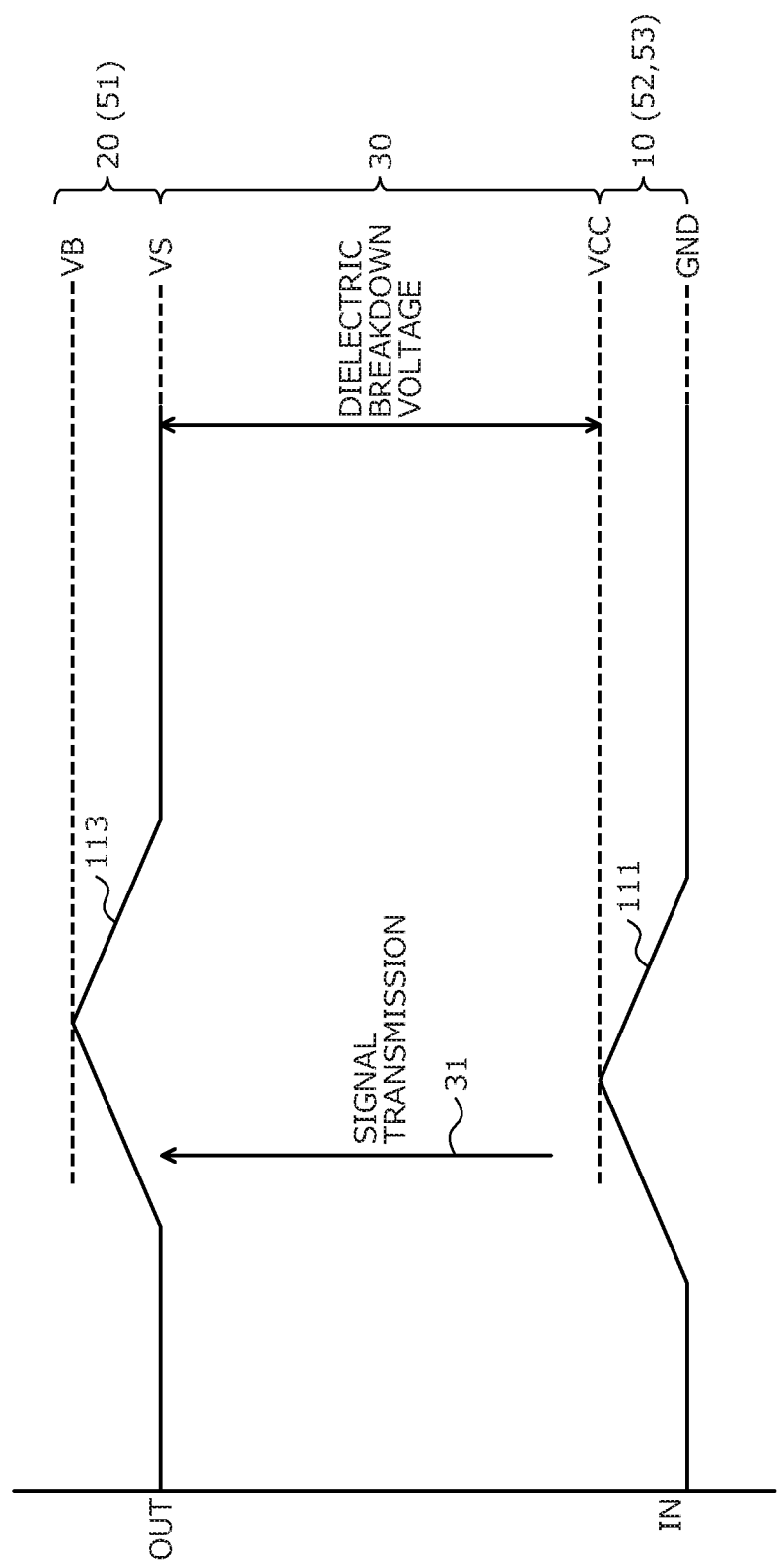

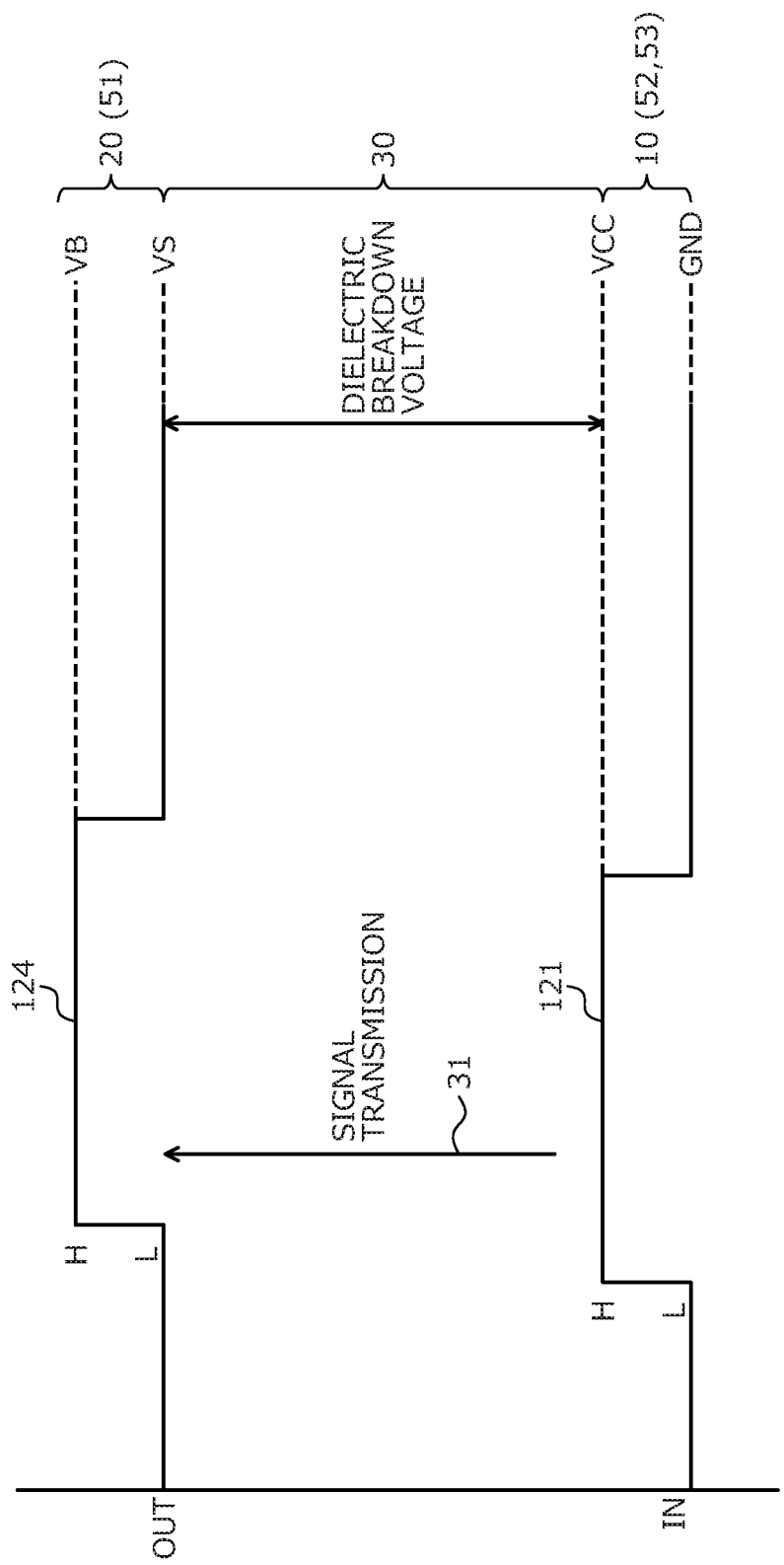

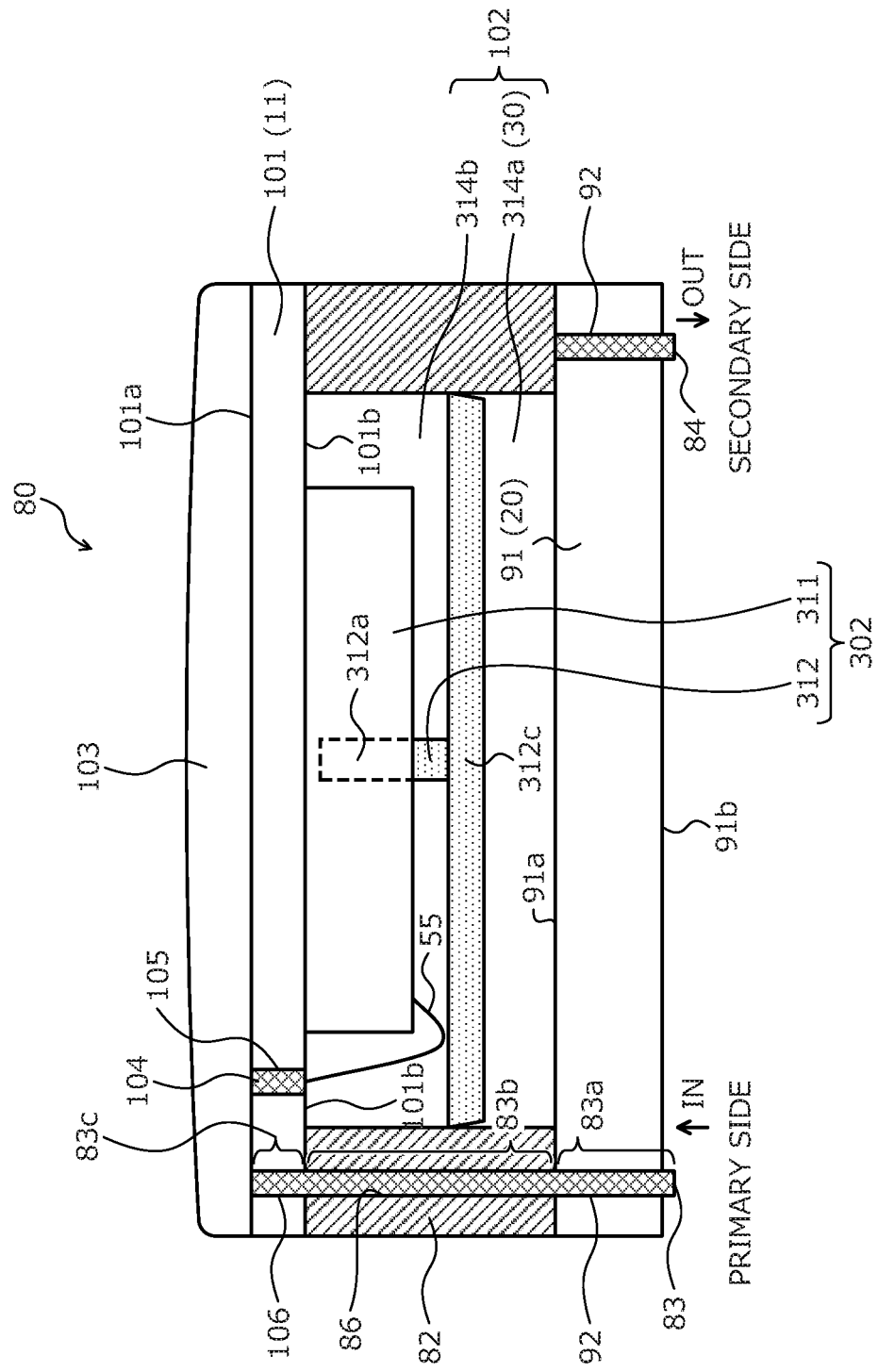

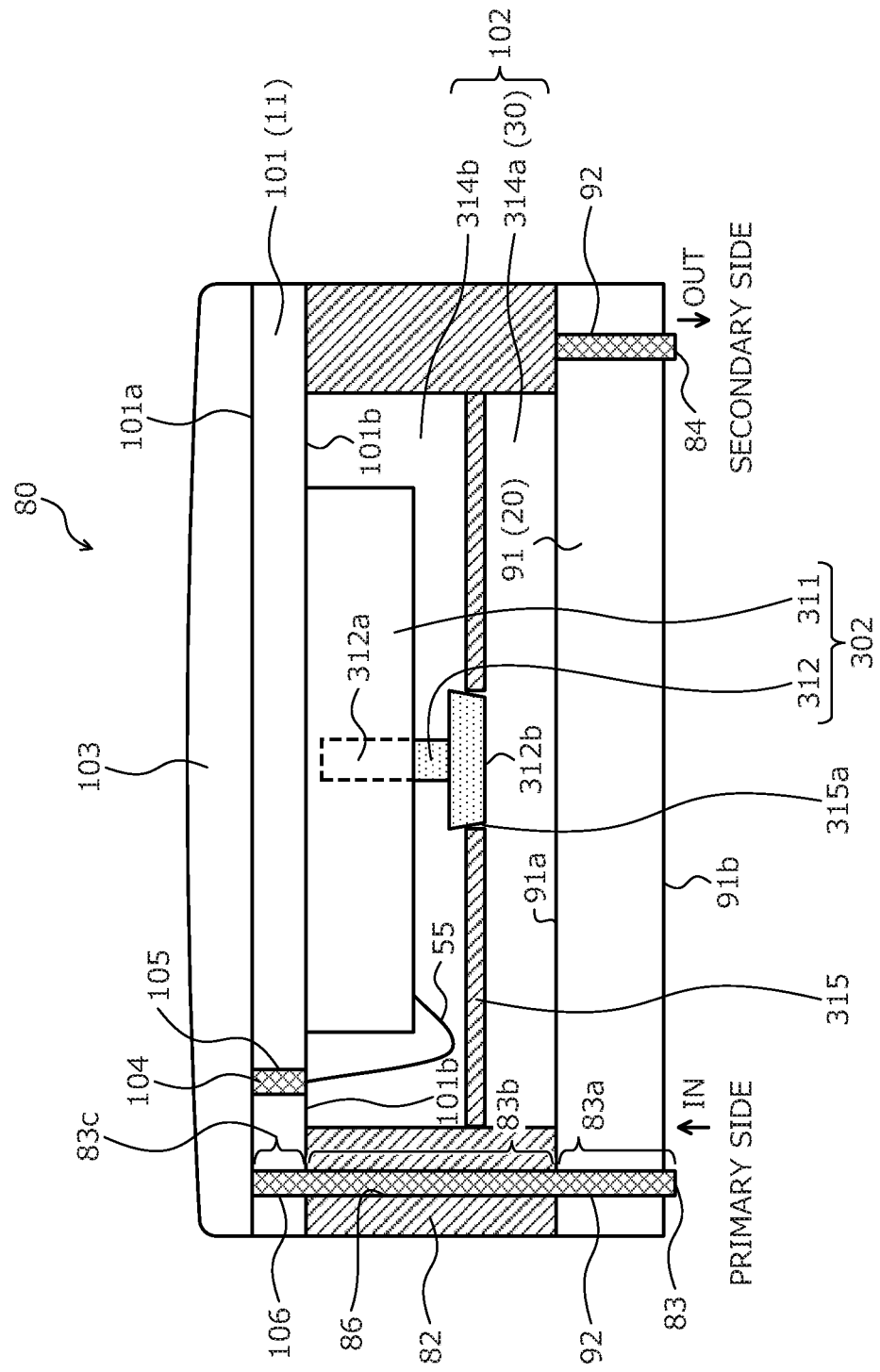

US 11,581,480 B2

SIGNAL TRANSMITTING DEVICE

CROSS REFERENCE TO RELATED APPLICATIONS

This is a continuation application of International Application PCT/JP2017/000332 filed on Jan. 6, 2017 which claims priority from a Japanese Patent Application Nos. 2016-028705 filed on Feb. 18, 2016, and 2016-138834 filed on Jul. 13, 2016, the contents of which are incorporated herein by reference.

BACKGROUND OF THE INVENTION

1. Field of the Invention

Embodiments of the present invention relate to a signal transmitting device.

2. Description of the Related Art

A conventionally know micro device has different elements such as a sensor and an actuator formed therein on a single substrate using a micro electro mechanical systems (MEMS) technique (hereinafter, referred to as "MEMS device") (see, e.g., Japanese Laid-Open Patent Publication No. 2009-066750). A module is known that has MEMS devices therein integrated on a semiconductor substrate (see, e.g., Published Japanese-Translation of PCT Application, Publication No. 2007-536105 and Japanese Laid-Open Patent Publication No. 2008-244244). Japanese Laid-Open Patent Publication No. 2009-066750 proposes a machine isolator that includes a sensor that detects displacement of a movable beam (a beam-like part). Published Japanese-Translation of PCT Application, Publication No. 2007-536105 proposes a technique of joining a MEMS device and a passive element to different substrates to be integrated in a single module. Japanese Laid-Open Patent Publication No. 2008-244244 proposes a technique of hermetically sealing a MEMS device.

The structure of a conventional MEMS device or a module having the MEMS devices integrated therein will be described. FIG. 17 is a simplified block diagram of the structure of a conventional MEMS device. FIG. 17 is FIG. 1 of Japanese Laid-Open Patent Publication No. 2009-066750. The MEMS device depicted in FIG. 17 is an analog isolator that includes an actuator 201, a control element 202, a sensor 203, and movable beams 204, on a single semiconductor substrate. The actuator 201, the sensor 203, and the movable beams 204 are formed using the MEMS technique. The actuator 201 and the control element 202 are, and the control element 202 and the sensor 203 are mechanically connected to each other through the movable beams 204.

The actuator 201 receives an input of an input signal 211 and moves the movable beam 204 to a direction opposite to that toward the position at which the sensor 203 is arranged (hereinafter, referred to as "actuation direction"). The sensor 203 detects the movement of the movable beam 204 and transmits an electrical signal to a processing circuit 205. The processing circuit 205 compares the electrical signal from the sensor 203 with a reference signal 212 and produces an output signal 213, an error signal 214, and the like. The output signal 213 is an analog signal that indicates the movement of the movable beam 204. The control element 202 receives an input of the error signal 214 from the processing circuit 205 directly or through a feedback network 206, and moves the movable beam 204 in two directions 222.

The movable beams 204 include conductive portions 231a and 231b that respectively constitute portions of the actuator 201 and the sensor 203. The conductive portions 231a and 231b of the movable beams 204 are electrically insulated from conductive portion 231c of the control element 202 respectively by insulating portions 232a and 232b. Three separated regions 233a to 233c are formed by the insulating portions 232a and 232b, and the actuator 201, the control element 202, and the sensor 203 are arranged respectively in the separated regions 233a to 233c. The control element 202 is electrically insulated from the input signal 211 and the output signal 213. The sensor 203 is electrically insulated from the input signal 211.

FIG. 18 is a cross-sectional diagram of the structure of a module that has the conventional MEMS devices integrated therein. FIG. 18 is FIG. 1 of Published Japanese-Translation of PCT Application, Publication No. 2007-536105. In the module depicted in FIG. 18, a MEMS device 241 is integrated with a passive element 242 without individually packaging the MEMS device 241 by joining the MEMS device 241 and the passive element 242 respectively to different substrates 243 and 244. The substrates 243 and 244 are aligned such that the MEMS device 241 and the passive element 242 are arranged in a space 245 between the substrates 243 and 244, are joined to each other by an interconnector 246. A reference numeral "247" denotes a member that surrounds the circumference of the space 245 between the substrates 243 and 244. A reference numeral "248" denotes a via that is connected to the interconnector 246.

FIG. 19 is a cross-sectional diagram of another example of a structure of a module that has conventional MEMS devices integrated therein. FIG. 19 is FIG. 1 of Japanese Laid-Open Patent Publication No. 2008-244244. In the module depicted in FIG. 19, a MEMS device 254 is arranged on a first substrate 251. The MEMS device 254 is covered by a second substrate 252 that faces the first substrate 251. A signal of the MEMS device 254 is extracted to the exterior by a wire 256 that penetrates an extraction electrode 255 and a third substrate 253 that are on the second substrate 252. The third substrate 253 faces the second substrate 252 sandwiching the first substrate 251 therebetween, and is joined to the second substrate 252 through a joining layer 257. The MEMS device 254 is hermetically sealed between the second substrate 252 and the third substrate 253.

A module having an actuator and a control circuit that drives and controls the actuator consolidated therein in a package has been proposed (see, e.g., Japanese Laid-Open Patent Publication No. 2010-242806 (Paragraph 0023)). Japanese Laid-Open Patent Publication No. 2010-242806 discloses a solenoid valve (an electromagnetic valve) control device that opens and closes a valve using a linear solenoid that converts electrical energy into mechanical kinetic energy using a principle of an electromagnet as an actuator. According to a device proposed as a solenoid valve control device, a plunger of an electromagnetic valve is controlled to be movable by a solenoid coil that includes plural insulating substrates each having a spiral coil formed on a surface, the insulating substrates are stacked on each other for the spiral coils to be connected with each other in series (see, e.g., Japanese Laid-Open Patent Publication No. H11-340031).

FIG. 28 is a block diagram of a configuration of a conventional solenoid module. FIG. 28 is FIG. 1 of Japanese Laid-Open Patent Publication No. 2010-242806. The module 261 depicted in FIG. 28 includes a linear solenoid 263 and a linear solenoid control circuit 264 including a semiconductor chip driving and controlling the linear solenoid 263 that are consolidated in a package 262. In the linear solenoid control circuit 264, a pulse width modulation (PWM) control circuit 267 executes a PWM control process based on an input value of an interface circuit 265 and output values of an average current detecting circuit 269 and a temperature sensor 270, and outputs a pulse width modulation signal.

The interface circuit 265 of the linear solenoid control circuit 264 is connected to an output port of a microcomputer in an electronic control unit that controls an automatic transmission. The PWM control circuit 267 calculates an actual resistance value of the linear solenoid 263 based on a temperature detection value detected by the temperature sensor 270 and a temperature property value stored in a property parameter storage element 266, and calculates a PWM duty (a duty factor) based on the actual resistance value. A driving circuit 268 is controlled to be turned on or off based on a PWM pulse signal formed by the PWM control circuit 267 based on the PWM duty, and supplies an excitation current that is tempered with the temperature property, to the linear solenoid 263 to execute driving and control associated with a thermal correction for the linear solenoid 263.

FIGS. 29 and 30 are explanatory diagrams of the configuration of a conventional solenoid coil. FIGS. 29 and 30 respectively are FIGS. 1 and 4 of Japanese Laid-Open Patent Publication No. H11-340031. FIG. 30 is an enlarged schematic cross-sectional diagram of a longitudinal cross-section taken near a via hole 277b depicted in FIG. 29. A solenoid coil 271 includes a spiral coil 272 formed on a face of an insulating substrate, a lead wire 273 and a land portion 274a that are provided in contact with an end portion (the end of the spiral) on the outer side of the spiral coil 272, and a land portion 274b provided in another end portion (the start of the spiral) on the inner side of the spiral coil 272. A reference numeral "275" denotes a heat conductive layer that externally dissipates the heat generated in the spiral coil 272. A reference numeral "276" denotes an opening that is provided in the central portion of the spiral coil 272 and into which a plunger is inserted. Reference numerals "277a" and "277b" denote via holes to respectively connect the land portions 274a on the outer sides of plural film solenoid coils 280 with each other, and the land portions 274b on the inner sides thereof with each other.

The solenoid coil 271 has a layered structure formed by stacking the plural film solenoid coils 280 on each other through a bonding sheet 291 to be connected with each other, and is covered with an insulating layer 292 to be protected. The film solenoid coils 280 are each constituted by stacking an adhesive layer 282, a conductive thin film layer 283, and a plated layer 284 in this order on both faces of the insulating substrate 281. On the conductive thin film layer 283, patterns of the spiral coil 272, the lead wire 273, the land portions 274a and 274b, the heat conductive layer 275, and the via holes 277a and 277b are formed using a known etching technique. The inner wall of the via hole 277b is covered with a plated layer 285, and the conductive thin film layers 283 and the plated layers 284 on both faces of the insulated substrate 281 are electrically connected to each other by the plated layer 285.

SUMMARY OF THE INVENTION

According to an embodiment of the present invention, a signal transmitting device includes a transmitting circuit configured to receive an input signal from a primary side, the transmitting circuit transmitting a first electrical signal; a passive element configured to generate a pressure based on the first electrical signal; a sensor element configured to detect the pressure, the sensor element converting the pressure into a second electrical signal; a receiving circuit configured to output to a secondary side, an output signal that is based on the second electrical signal; a first semiconductor substrate on which the sensor element is provided; an insulating medium that electrically insulates the passive element and the sensor element from each other; and a pressure propagation region in which the passive element and the first semiconductor substrate facing each other across the insulating medium and are separated from each other by a predetermined distance, the pressure being propagated from the passive element to the sensor element through the insulating medium. Signal transmission is performed from the primary side to the secondary side by propagation of the pressure.

In the embodiment, the transmitting circuit receives the input of the input signal in an analog form and transmits the first electrical signal, an amplitude of the first electrical signal continuously increasing or decreasing. The receiving circuit outputs the second electrical signal as the output signal, the receiving circuit outputting the second electrical signal to the secondary side, an amplitude of the second electrical signal continuously increasing or decreasing based on the first electrical signal.

In the embodiment, the transmitting circuit receives the input of the input signal in a digital form and transmits the first electrical signal, an amplitude of the first electrical signal discretely increasing or decreasing. The receiving circuit compares a reference voltage and a voltage value of the second electrical signal, an amplitude of the second electrical signal discretely increasing or decreasing based on the first electrical signal, the receiving circuit outputting the output signal to the secondary side, an amplitude of the output signal discretely increasing or decreasing.

In the embodiment, the output signal for one cycle is output for one cycle of the input signal.

In the embodiment, the transmitting circuit receives the input of the input signal in a digital form for plural cycles in a predetermined time period and transmits the first electrical signal for the plural cycles, an amplitude of the first electrical signal discretely increasing or decreasing non-linearly. The receiving circuit outputs the output signal to the secondary side, an amplitude of the output signal continuously increasing or decreasing linearly in a pseudo manner for one cycle that includes plural cycles of the second electrical signal, an amplitude of the second electrical signal discretely increasing or decreasing based on non-linearity of the first electrical signal for the plural cycles.

In the embodiment, the passive element and the sensor element face each other in the pressure propagation region.

In the embodiment, the signal transmitting device further includes a high hardness member bonded to the passive element, the high hardness member being positioned between the passive element and the sensor element, the high hardness member containing a material having a hardness higher than a hardness of the insulating medium.

In the embodiment, the signal transmitting device further includes a package member including a concave portion in which the first semiconductor substrate is arranged; and a base substrate on which the passive element is arranged. The base substrate is arranged at a position to close the concave portion such that the passive element is arranged inside the concave portion of the package member, the base substrate being bonded to the package member. The pressure propagation region is a space surrounded by the package member and the base substrate.

In the embodiment, the signal transmitting device further includes a package member in which the first semiconductor substrate is arranged; a base substrate on which the passive element is arranged; and a relaying member joining the first semiconductor substrate and the base substrate to each other. The pressure propagation region is a space surrounded by the first semiconductor substrate, the base substrate, and the relaying member.

In the embodiment, the signal transmitting device further includes a second semiconductor substrate on which the transmitting circuit is provided. The second semiconductor substrate is arranged on the base substrate to be separated from the passive element.

In the embodiment, the signal transmitting device further includes a second semiconductor substrate on which the transmitting circuit is provided; and a relaying member having a frame-like planar shape, the relaying member joining the first semiconductor substrate and the second semiconductor substrate to each other. The pressure propagation region is a space surrounded by the first semiconductor substrate, the second semiconductor substrate, and the relaying member.

In the embodiment, the signal transmitting device further includes a first external connection terminal integrally formed with the package member. A first end of the first external connection terminal is exposed from a bottom face of the package member to an exterior, the first end being electrically connected to an external circuit on the primary side. A second end of the first external connection terminal penetrates a through hole of the base substrate, the second end being electrically connected to the transmitting circuit through the through hole of the base substrate.

In the embodiment, the signal transmitting device further includes a first external connection terminal integrally formed with the package member. A first end of the first external connection terminal is exposed from the package member to an exterior, the first end being electrically connected to an external circuit on the primary side. A second end of the first external connection terminal penetrates a via of the first semiconductor substrate, a through hole of the base substrate and the relaying member, the second end being electrically connected to the transmitting circuit through the through hole of the base substrate.

In the embodiment, the signal transmitting device further includes a first external connection terminal penetrating a via of the first semiconductor substrate, a through hole of the relaying member, and a via of the second semiconductor substrate. A first end of the first external connection terminal is exposed from the via of the first semiconductor substrate to an exterior, the first end being electrically connected to an external circuit on the primary side. A second end of the first external connection terminal is electrically connected to the transmitting circuit through the via of the second semiconductor substrate.

In the embodiment, the receiving circuit is provided on the first semiconductor substrate on which the sensor element is provided.

In the embodiment, the signal transmitting device further includes a third semiconductor substrate on which the receiving circuit is provided. The third semiconductor substrate is arranged on a face of the package member, the face on which the first semiconductor substrate is arranged, the third semiconductor substrate being separated from the first semiconductor substrate.

In the embodiment, the signal transmitting device further includes a second external connection terminal integrally formed with the package member. A first end of the second external connection terminal is exposed from a bottom face of the package member to an exterior, the first end being electrically connected to an external circuit on the secondary side. A second end of the second external connection terminal is exposed in the pressure propagation region, the second end being electrically connected to the receiving circuit.

In the embodiment, the signal transmitting device further includes a second external connection terminal integrally formed with the package member. A first end of the second external connection terminal is exposed from the package member to an exterior, the first end being electrically connected to an external circuit on the secondary side. A second end of the second external connection terminal is electrically connected to the receiving circuit through a via of the first semiconductor substrate.

In the embodiment, the signal transmitting device further includes a second external connection terminal penetrating a via of the first semiconductor substrate. A first end of the second external connection terminal is electrically connected to an external circuit on the primary side. A second end of the second external connection terminal is electrically connected to the receiving circuit through a via of the first semiconductor substrate.

In the embodiment, the passive element is formed by a piezoelectric and ferroelectric material that generates the pressure by deforming or vibrating when the input of the first electrical signal is received, or the passive element has a movable element constituted by a magnetic body that generates the pressure by being moved when the input of the first electrical signal is received and a magnetic field is generated or when the input of the first electrical signal is discontinued and the magnetic field disappears.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 12 is a time chart of an operation waveform produced in a case where an analog output method is applied;

FIG. 14 is a time chart of an operation waveform acquired when a digital output method is applied;

FIG. 25 is a cross-sectional diagram of a circuit configuration of a signal transmitting device according to a sixteenth embodiment;

FIG. 26 is a cross-sectional diagram of a circuit configuration of a signal transmitting device according to a seventeenth embodiment;

DETAILED DESCRIPTION OF THE INVENTION

Figure 17:
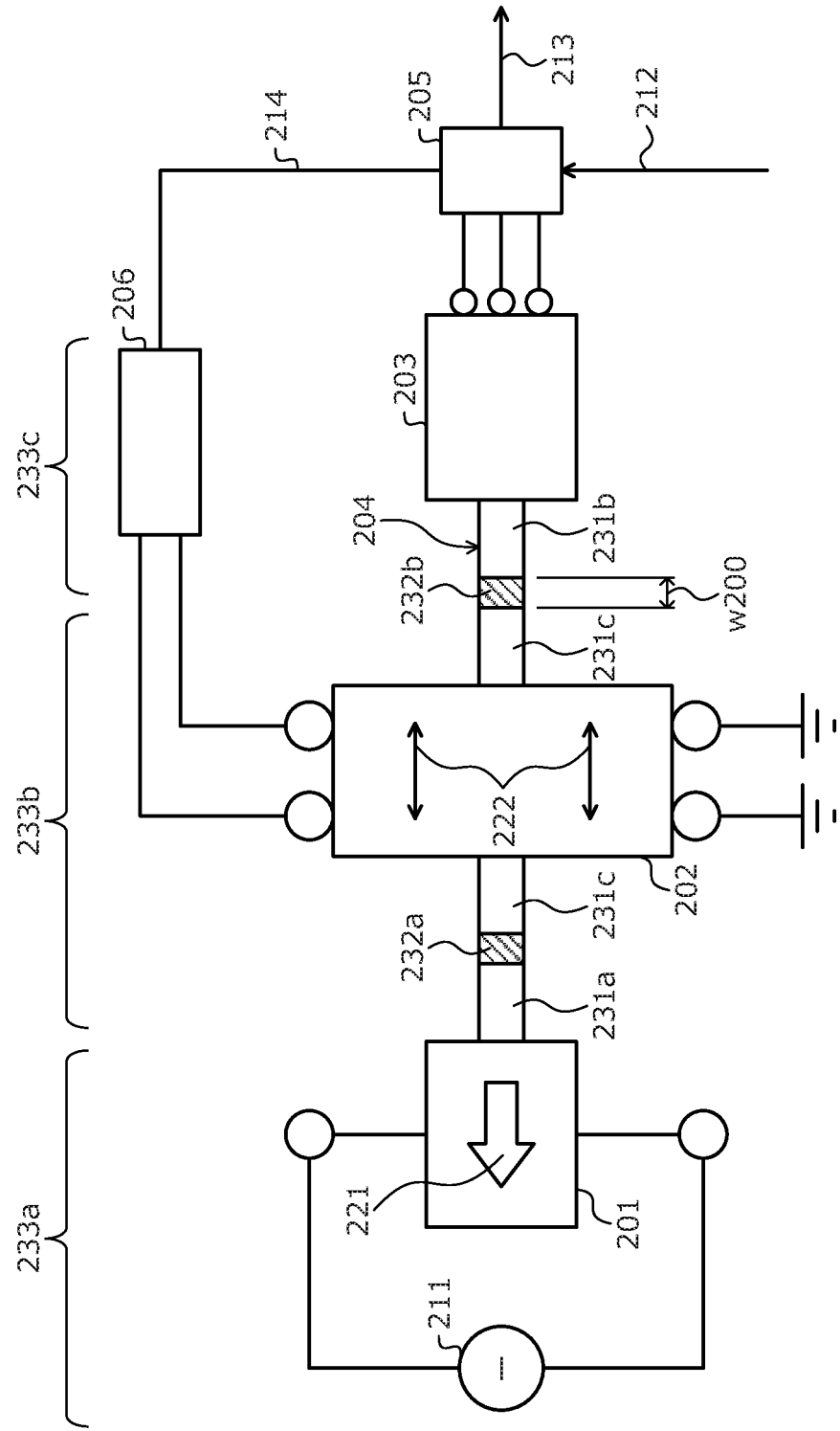
FIG. 17 is a simplified block diagram of a structure of a conventional MEMS device.

Problems associated with the conventional techniques will be described. In Japanese Laid-Open Patent Publication No. 2009-066750 (see FIG. 17), the insulating portions 232a and 232b electrically insulating the actuator 201 and the sensor 203 from each other are also formed on the same single semiconductor substrate as that of the actuator 201 and the sensor 203 by the MEMS technique. A width (the width in an actuation direction 221 of the movable beams 204) w200 of each of the insulating portions 232a and 232b is constrained by the chip size and becomes small. The width w200 of each of the insulating portions 232a and 232b is a factor that determines the dielectric breakdown voltage (the breakdown voltage) between the actuator 201 and the sensor 203, and a problem, therefore, arises in that the dielectric breakdown voltage is reduced.

Figure 18:
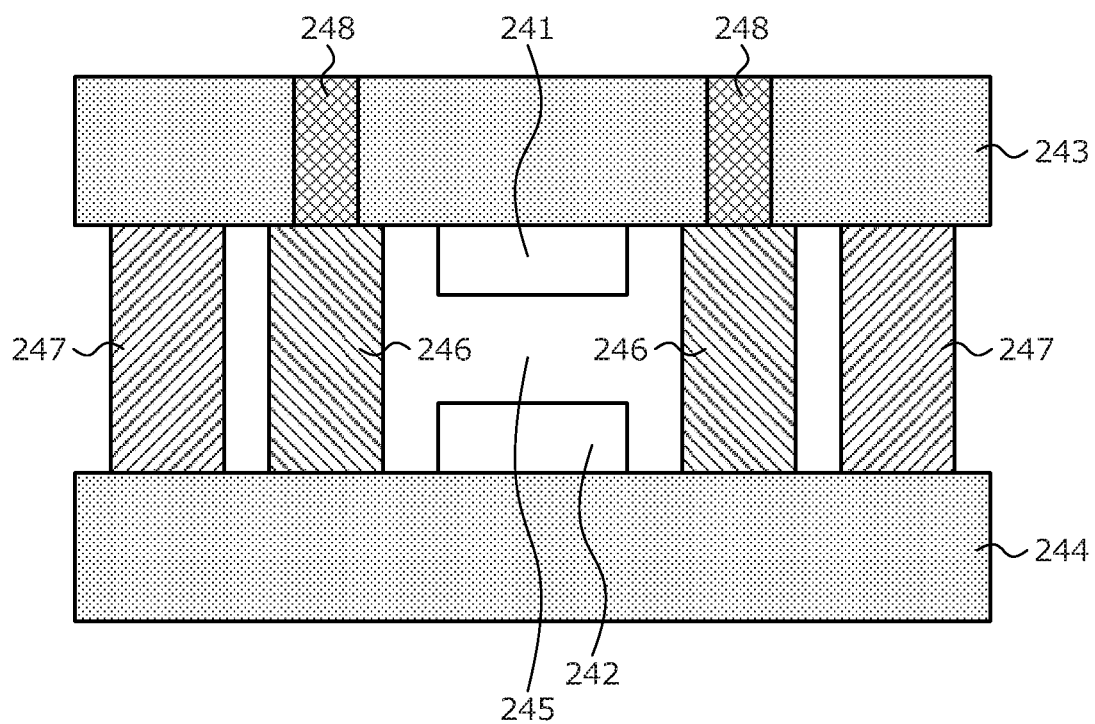
FIG. 18 is a cross-sectional diagram of a structure of a module that has conventional MEMS devices integrated therein.

In Published Japanese-Translation of PCT Application, Publication No. 2007-536105 (see FIG. 18), the MEMS device 241 and the passive element 242 are electrically insulated from an external signal transmitting medium (not depicted) by an insulating layer (not depicted) located between the substrates 243 and 244, and execute the signal transmission for the signal transmitting medium through the interconnector 246. Published Japanese-Translation of PCT Application, Publication No. 2007-536105 does not describe that the MEMS device 241 and the passive element 242 are electrically insulated from each other in the same space 245 between the substrates 243 and 244, and the signal transmission is executed between the MEMS device 241 and the passive element 242 through the space 245.

Figure 19:
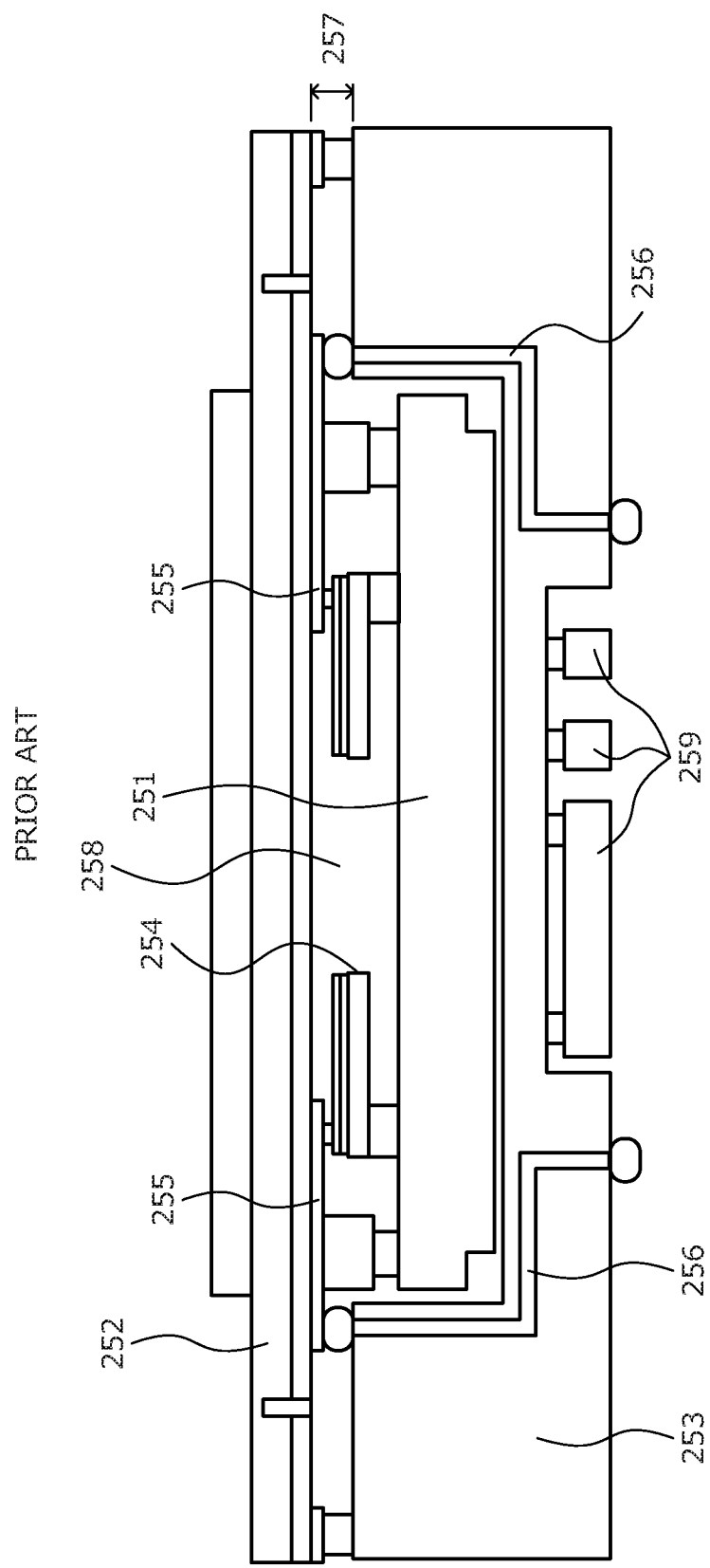
FIG. 19 is a cross-sectional diagram of another example of a structure of a module that has conventional MEMS devices integrated therein.

In Japanese Laid-Open Patent Publication No. 2008-244244 (see FIG. 19), the MEMS device 254 is arranged in the hermetically sealed space 258 between the second and the third substrates 252 and 253 while components 259 other than the MEMS device 254 such as a passive element are not arranged in the space 258. Japanese Laid-Open Patent Publication No. 2008-244244 does not describe that the MEMS device 254 and the passive element are electrically insulated from each other in the same space 258 and the signal transmission is executed between the MEMS device 254 and the passive element through the space 258.

Figure 28:
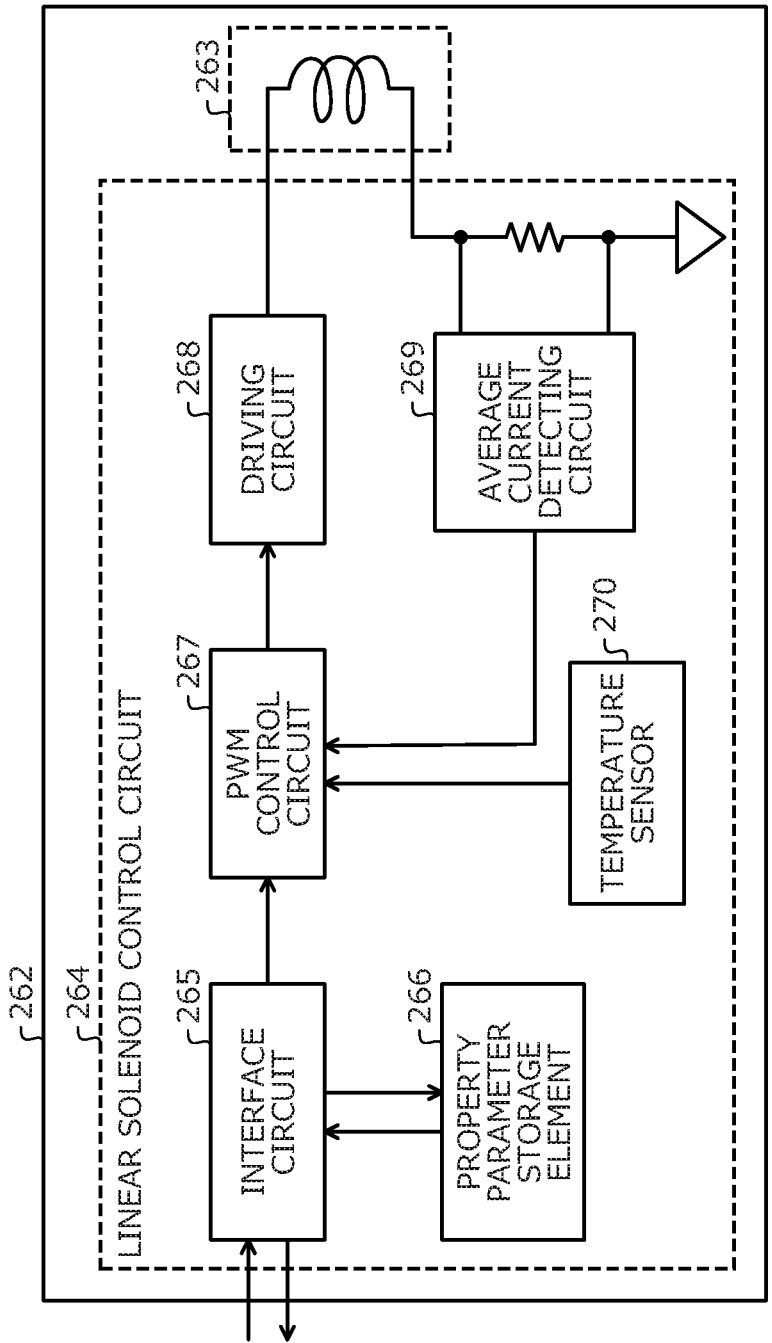
FIG. 28 is a block diagram of a configuration of a conventional solenoid module.
Figure 29:
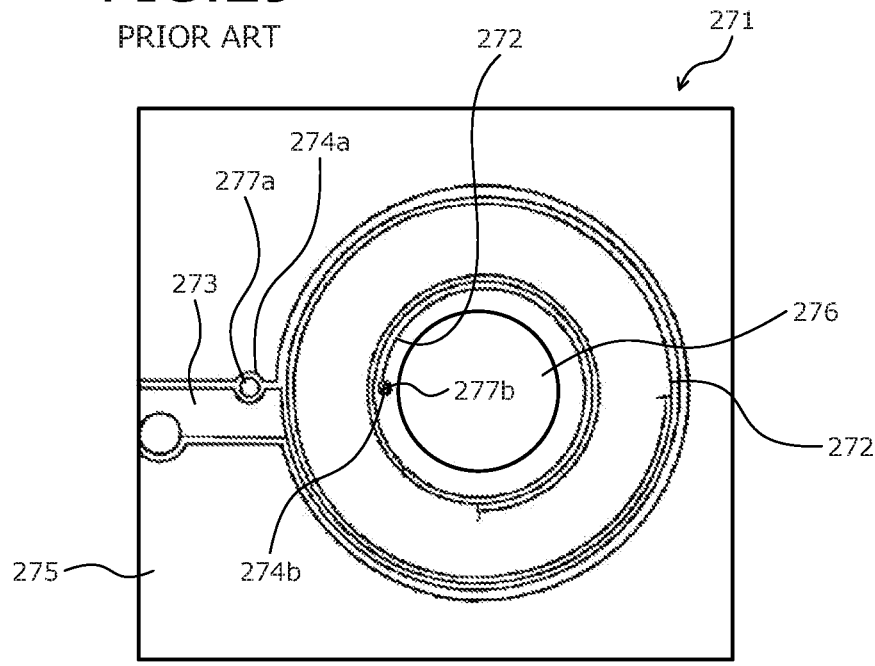
FIGS. 29 and 30 are explanatory diagrams of a configuration of a conventional solenoid coil.
Figure 30:
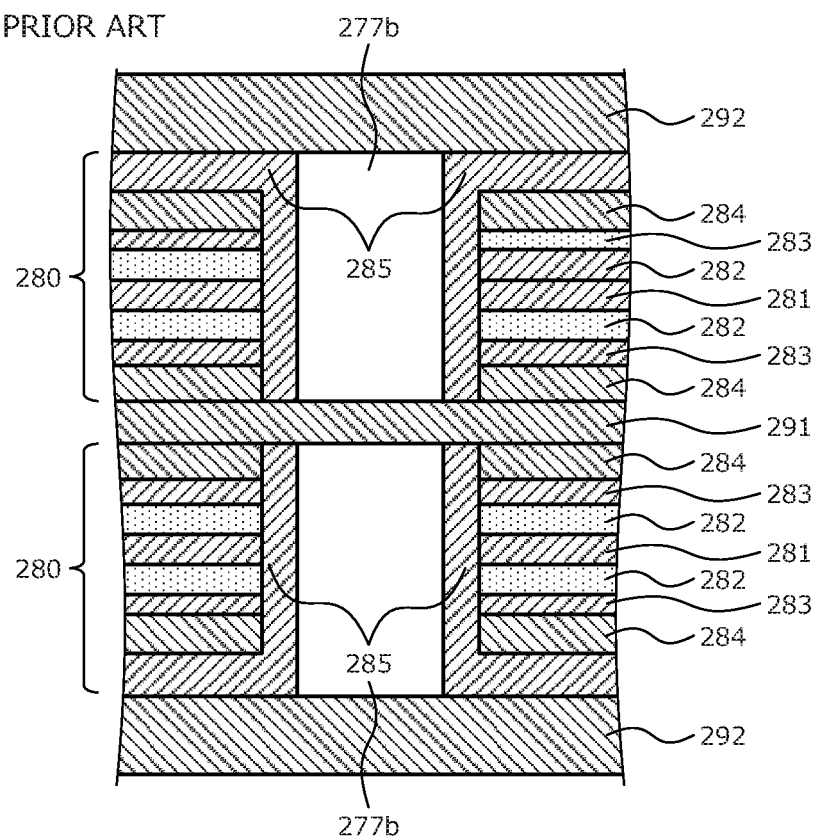

Japanese Laid-Open Patent Publication No. 2010-242806 (see FIG. 28) describes the technique in relation to the control of the linear solenoid 263 and dose not describe that the transmitting unit and the receiving unit are electrically insulated from each other and the signal transmission is executed. Japanese Laid-Open Patent Publication No. H11-340031 (see FIG. 29) describes the technique in relation to the structure of the solenoid coil 271 and does not describe that the transmitting unit and the receiving unit are electrically insulated from each other and the signal transmission is executed.

Embodiments of a signal transmitting device according to the present invention will be described in detail with reference to the accompanying drawings. In the description of the embodiments below and the accompanying drawings, main portions that are identical will be given the same reference numerals and will not be repeatedly described.

Figure 1:
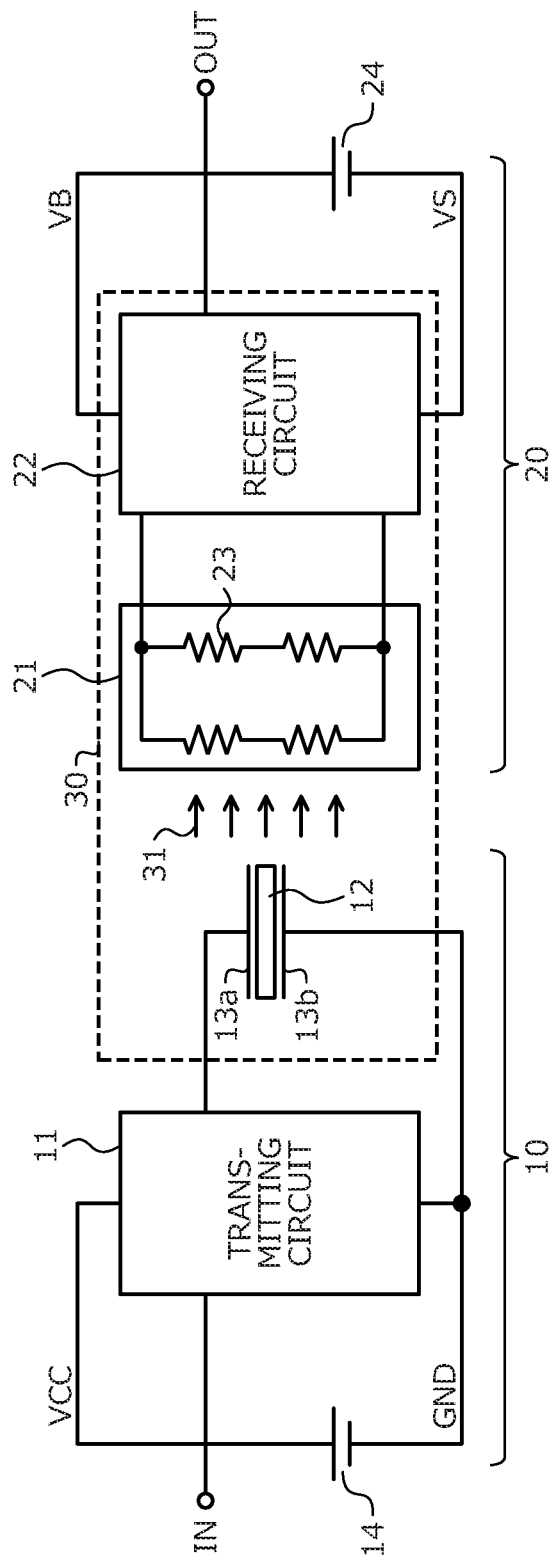
FIG. 1 is a circuit diagram of a circuit configuration of a signal transmitting device according to a first embodiment.

A circuit configuration of a signal transmitting device according to a first embodiment will be described. FIG. 1 is a circuit diagram of a circuit configuration of a signal transmitting device according to the first embodiment. The signal transmitting device according to the first embodiment depicted in FIG. 1 is a module that has an actuator 10 and a pressure sensor 20 arranged therein in a single package (a case) and that executes signal transmission from a primary side (the side toward the actuator 10) to a secondary side (the side toward the pressure sensor 20) through a pressure propagation region 30 in the package. A pressure 31 is used in the signal transmission from the primary side to the secondary side.

The actuator 10 includes a transmitting circuit 11 and a piezoelectric element (a Piezo element) 12. The transmitting circuit 11 is an integrated circuit (IC) that operates using, for example, the ground potential GND to be the lowest potential of a first power source 14 as a reference and operates using a power source voltage VCC of the first power source 14 as a highest potential. The transmitting circuit 11 receives an input of an input signal IN, transmits an electrical signal, and applies a voltage to the piezoelectric element 12 to drive the piezoelectric element 12. For example, when a digital output method is employed, the transmitting circuit 11 transmits a digital electrical signal (a pulse wave) with an amplitude, at a frequency, and in a phase based on a predetermined modulation method.

The piezoelectric element 12 is a passive element that is formed using an ordinary piezoelectric material (a piezoelectric and ferroelectric material). The piezoelectric element 12 is driven (deformed or vibrated) due to generation of a stress or a distortion caused by the electric field and thereby, converts the electrical signal into the pressure 31. For example, the piezoelectric element 12 has a structure formed by stacking metal electrodes (for example, metal plates) 13a and 13b to sandwich a substrate of a piezoelectric material. The metal electrode 13b of the piezoelectric element 12 is at, for example, the ground potential GND. The piezoelectric element 12 is deformed or vibrated by application of a voltage between the metal electrodes 13a and 13b.

The pressure sensor 20 includes a sensor element 21 and a receiving circuit 22. The sensor element 21 converts the pressure 31 generated in the pressure propagation region 30 into an electrical signal. The sensor element 21 may be, for example, a strain gauge-type sensor element that converts a deformation amount of a diaphragm that is formed by processing a portion of a semiconductor substrate into a thin film, into an electrical signal using a strain gauge formed by a diffusion layer in the surface layer of the diaphragm. The sensor element 21 may be, for example, a sensor element of an electrostatic capacitance type, converting the electrostatic capacitance that corresponds to the displacement amount of the interval between parallel plate electrodes into an electrical signal. FIG. 1 depicts the sensor element 21 of a strain gauge type, formed by a Wheatstone bridge 23 to which a strain gauge is connected in a bridge form.

The receiving circuit 22 is an IC that operates using the lowest potential VS of a second power source 24 as a reference and a power source potential VB of the second power source 24 as a highest potential. The lowest potential VS of the second power source 24 may be different from the ground potential GND of the first power source 14 such as, for example, higher than the ground potential GND of the first power source 14. The power source potential VB of the second power source 24 may be different from the power source potential VCC of the first power source 14 such as, for example, higher than the power source potential VCC of the first power source 14.

The receiving circuit 22 externally outputs the electrical signal of the sensor element 21 as an output signal OUT. For example, when the digital output method is employed, the receiving circuit 22 demodulates the electrical signal of the sensor element 21 using a demodulating method that corresponds to the modulation method and externally outputs the demodulated electrical signal as the output signal OUT.

The pressure propagation region 30 may propagate the fine move and the fine vibrations of the piezoelectric element 12 to the sensor element 21 as the pressure 31, and includes a medium capable of electrically insulating the piezoelectric element 12 and the sensor element 21 from each other (hereinafter, referred to as "insulating medium"). For example, the pressure propagation region 30 includes the insulating medium such as, for example, air (the gas surrounding the earth), an insulating gel, or an insulating oil that fills an airtight space having the piezoelectric element 12 and the sensor element 21 arranged therein.

Figure 2:
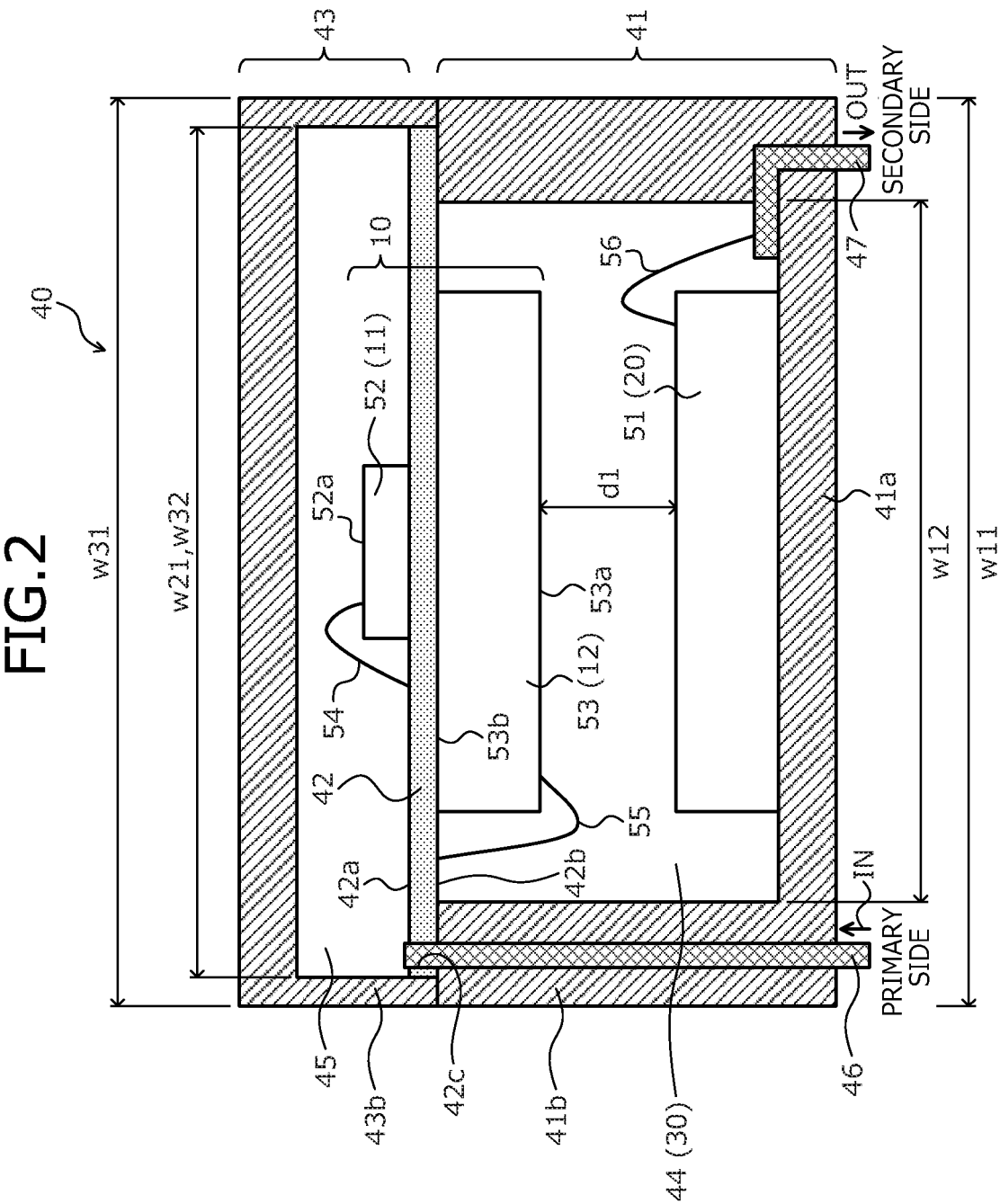
FIG. 2 is a cross-sectional diagram of a configuration of a package of FIG. 1.

The configuration of the package (the case) having the actuator 10 and the pressure sensor 20 integrated therein will be described. FIG. 2 is a cross-sectional diagram of the configuration of the package of FIG. 1. As depicted in FIG. 2, the package 40 includes a package main body (a package member) 41, a base substrate 42, and a package cap 43, and has the actuator 10 and the pressure sensor 20 integrated therein. The package main body 41 is a member having a concave-like cross-sectional shape, and is integrally formed with a first and a second external connection terminals 46 and 47 using an ordinary package material such as, for example, a resin or a ceramic. A material having hardness to the extent that the package main body 41 is not distorted by an internal pressure or an external pressure during fabrication or practical use may be used as the package material of the package main body 41.

In a concave portion of the package main body 41, a pressure sensor IC chip (a first semiconductor substrate) 51 is arranged on a bottom face 41a of the package main body 41. The pressure sensor IC chip 51 is a semiconductor chip with which the sensor element 21 and the receiving circuit 22 of the pressure sensor 20 are integrally formed. The sensor element 21 includes a diaphragm formed by processing a portion of the semiconductor substrate into a thin film, a strain gauge using a diffusion resistor formed in the surface layer thereof, and the like that are formed in, for example, a substantially circular planar layout on the pressure sensor IC chip 51. The receiving circuit 22 is arranged on, for example, the semiconductor substrate surrounding the substantially circular diaphragm on the pressure sensor IC chip 51.

The base substrate 42 is a wiring substrate that has a circuit pattern (not depicted) formed by a copper foil on each of both faces of an insulating substrate. The back face of a transmitting chip (a second semiconductor substrate) 52 is joined to the front face 42a of the base substrate 42. A transmitting chip 52 is a semiconductor chip that constitutes the transmitting circuit 11 of the actuator 10. An electrode provided on a front face 52a of the transmitting chip 52 (not depicted: hereinafter, referred to as "front face electrode") is electrically connected to the circuit pattern on the front face 42a of the base substrate 42 by a bonding wire 54.

A back face 53b of a piezoelectric chip 53 is joined to the back face 42b of the base substrate 42. The piezoelectric chip 53 is a passive element constituting the piezoelectric element 12 of the actuator 10. For example, the piezoelectric element 53 has a structure formed by stacking a substrate made from a piezoelectric material to be sandwiched by the metal electrodes 13a and 13b therebetween (see FIG. 1). The piezoelectric chip 53 faces the transmitting chip 52 sandwiching the base substrate 42 therebetween. Either the metal electrode 13a or the metal electrode 13b of the piezoelectric chip 53 is electrically connected to the circuit pattern on the back face 42b of the base substrate 42 by a bonding wire 55.

To avoid suppression of the deformation and the vibration of the piezoelectric chip 53, the other one of the metal electrode 13a and the metal electrode 13b of the piezoelectric chip 53 may be electrically connected to the circuit pattern on the back face 42b of the base substrate 42 by a conductive buffer material (not depicted). Deformation and vibration of the piezoelectric chip 53 are not suppressed because the displacement and the vibration of the piezoelectric chip 53 are absorbed by the conductive buffer material. Therefore, degradation of the pressure conversion efficiency of the piezoelectric chip 53 may be suppressed. A conductive spacer using a metal or an organic material instead of the conductive buffer material is also usable. An opening may be provided in the base substrate 42 instead of the conductive buffer material. The circuit patterns on the front face 42*a* and the back face 42*b* of the base substrate 42 are electrically connected to each other through a through hole not depicted, and the piezoelectric chip 53 and the transmitting chip 52 are thereby electrically connected to each other.

The base substrate 42 is arranged on an opening end of a side wall 41*b* of the package main body 41 to close the concave portion of the package main body 41 with the back face 42*b* facing toward the package main body 41. The base substrate 42 is bonded by, for example, an adhesive injected between the base substrate 42 and the opening end of the side wall 41*b* of the package main body 41. The package main body 41 and the base substrate 42 need not be bonded to each other when the airtightness of a first space 44 described later is secured by bonding the package main body 41 and the package cap 43 to each other, or the like. In this case, the base substrate 42 is arranged on the opening end of the side wall 41*b* of the package main body 41 by, for example, being fixed on a first external connection terminal 46.

A width w21 of the base substrate 42 is larger than a width w12 between the side walls 41*b* of the package main body 41 (w12<w21). The width w21 of the base substrate 42 may be smaller than a width w11 of the package main body 41 (w12<w21<w11). The reason for this is as follows. The opening ends of the side walls 41*b* and 43*b* of the package main body 41 and the package cap 43 may be bonded to each other by setting the width w11 of the package main body 41 and a width w31 of the package cap 43 to be equal to each other (w11=w31). A configuration having the most downsized package 40 may be established thereby.

The space 44 surrounded by the package main body 41 and the base substrate 42 (hereinafter, referred to as "first space") is the pressure propagation region 30. The first space 44 is set to be airtight by bonding the package main body 41 and the base substrate 42 to each other or by bonding the package main body 41 and the package cap 43 to each other as described later. The pressure sensor IC chip 51 and the piezoelectric chip 53 are arranged in the first space 44. The pressure sensor IC chip 51 and the piezoelectric chip 53 face each other across the insulating medium that constitutes the pressure propagation region 30. The airtightness of the inside of the package 40 (the space surrounded by the package main body 41 and the package cap 43) suffices to be secured to an extent that the pressure 31 generated in the pressure propagation region 30 is maintained, and the first space 44 and a second space 45 described later may be spaces continuous with each other.

The dielectric breakdown voltage (the breakdown voltage) between the actuator 10 and the pressure sensor 20 is determined by a distance d1 between the pressure sensor IC chip 51 and the piezoelectric chip 53. For example, the distance d1 between the pressure sensor IC chip 51 and the piezoelectric chip 53 is the distance between the sensor element 21 of the pressure sensor IC chip 51 and an acting part of the piezoelectric chip 53. The acting part of the piezoelectric chip 53 is a portion that is driven (deformed or vibrated) by application of a voltage from the transmitting chip 52 and that thereby generates the pressure 31 in the pressure propagation region 30.

When the distance d1 between the pressure sensor IC chip 51 and the piezoelectric chip 53 is increased, the dielectric breakdown voltage between the actuator 10 and the pressure sensor 20 becomes higher while the pressure 31 tends to be dispersed and the sensitivity of the sensor element 21 of the pressure sensor 20 is degraded. Therefore, the distance d1 between the pressure sensor IC chip 51 and the piezoelectric chip 53 may be set based on the trade-off relation between the dielectric breakdown voltage between the actuator 10 and the pressure sensor 20, and the sensitivity of the sensor element 21 of the pressure sensor 20.

The positions of the pressure sensor IC chip 51 and the piezoelectric chip 53 in the lateral direction (the direction parallel to the chip surface) may be each variously varied and at least the sensor element 21 of the pressure sensor IC chip 51 and the acting part of the piezoelectric chip 53 suffice to face each other across the insulating medium. For example, of the pressure sensor IC chip 51 and the piezoelectric chip 53, one semiconductor chip is caused to face the overall face of the other semiconductor chip whose size is relatively small, whereby downsizing of the package 40 may be facilitated.

The package cap 43 is a member having a concave-like cross-sectional shape and formed using an ordinary package material such as, for example, a resin or a ceramic. Conditions for the package material of the package cap 43 are same as conditions for the package material of the package main body 41. The planar shape of the package cap 43 is a same as the planar shape of the bottom face 41*a* of the package main body 41, and is, for example, a substantially rectangular shape whose dimensions are equal to those of the bottom face 41*a* of the package main body 41. The package cap 43 covers the front face 42*a* of the base substrate 42 with the concave portion thereof facing toward the base substrate 42. The package cap 43 has a function of protecting the transmitting chip 52. The package cap 43 faces the package main body 41 sandwiching the base substrate 42 therebetween.

The opening end of the side wall 41*b* of the package main body 41 and the opening end of a side wall 43*b* of the package cap 43 are bonded to each other by, for example, an adhesive injected into a gap between these members. The base substrate 42 is positioned between the side walls 43*b* of the package cap 43. The width w21 of the base substrate 42 may be equal to a width w32 between the side walls 43*b* of the package cap 43 (w21=w32). The space 45 surrounded by the package cap 43 and the base substrate 42 (hereinafter, referred to as "second space") is set to be airtight. When the first and the second spaces 44 and 45 are continuous with each other, the first and the second continuous spaces 44 and 45 are set to be airtight. The transmitting chip 52 is arranged in the second space 45. A sealant (not depicted) may fill (be molded in) the second space 45.

The first external connection terminal 46 penetrates the side wall 41*b* of the package main body 41 in the depth direction. One end of the first external connection terminal 46 is exposed from the bottom face 41*a* of the package main body 41 to the exterior of the package 40. One end of the first external connection terminal 46 is electrically connected to an external circuit (not depicted) and the first power source 14 on the primary side. Various signals are input from the external circuit on the primary side into the first external connection terminal 46. The other end of the first external connection terminal 46 is exposed at the front face 42*a* of the base substrate 42 through a through hole 42*c* of the base substrate 42. The other end of the first external connection terminal 46 is electrically connected to the transmitting chip 52 through a circuit pattern on the front face 42*a* of the base substrate 42.

An electrical signal input at the bottom face 41*a* side of the package main body 41 may be transmitted to the components on the base substrate 42 by arranging the first external connection terminal 46 as above. The plural (for example, at least three) first external connection terminals 46 are arranged. For example, the first external connection terminals 46 are a terminal for receiving an input of an input signal IN from the external circuit on the primary side, a terminal for applying the power source potential VCC of the first power source 14, a terminal for applying the lowest potential (the ground potential GND) of the first power source 14, and the like (see FIG. 1). Though FIG. 2 depicts only one of the first external connection terminals 46, the other first external connection terminals 46 not depicted are also arranged on the side wall 41b of the package main body 41 in the same manner as that of the depicted first external connection terminal 46.

The second external connection terminal 47 penetrates the bottom face 41a of the package main body 41 in the depth direction. One end of the second external connection terminal 47 is exposed from the bottom face 41a of the package main body 41 to the exterior of the package 40. The plural (for example, at least three) second external connection terminals 47 are arranged. For example, the second external connection terminals 47 are a terminal for outputting an output signal OUT to the external circuit on the secondary side, a terminal for applying the power source potential VB of the second power source 24, a terminal for applying the lowest potential VS of the second power source 24, a terminal for adjusting the property of the pressure sensor, and the like (see FIG. 1). Though FIG. 2 depicts only one of the second external connection terminals 47, the other second external connection terminals 47 not depicted are also arranged on the package main body 41 in the same manner as that of the depicted second external connection terminal 47. One end of the second external connection terminal 47 is electrically connected to an external circuit (not depicted) on the secondary side, and the output signal OUT is output to the external circuit on the secondary side. The other end of the second external connection terminal 47 bends in, for example, a substantially L-shape and is exposed in the first space 44. The other end of the second external connection terminal 47 is electrically connected to the receiving circuit 22 formed on the pressure sensor IC sensor 51 by, for example, a bonding wire 56.

The external circuit on the secondary side is, for example, a switching element such as, for example, a metal oxide semiconductor field effect transistor (MOSFET) or an insulated gate bipolar transistor (IGBT) that constitutes an inverter. In a case where the signal transmitting device according to the first embodiment is used as an alarm output circuit that acts when an abnormality of a gate driver that drives the switching element or the switching element is detected, the package 40 is, for example, incorporated in an intelligent power module (IPM) (not depicted) together with the switching element and is sealed therein.

A case will be described where the signal transmitting device according to the first embodiment is used as a gate driver. When the external circuit on the secondary side is an IGBT, for example, a collector terminal of the IGBT is connected to a high potential side (for example, 400 V) of a high voltage power source and an emitter terminal of the IGBT is connected to a collector terminal of another IGBT, a terminal for applying the lowest potential VS of the second power source 24. The gate terminal of the IGBT is connected to the output signal OUT. The emitter terminal of the other IGBT is connected to a low potential side (for example, the ground potential (GND)) of the high voltage power source. The IGBT and the other IGBT are controlled each to complementarily be turned on or off. When the IGBT is turned on, the potential of the terminal for applying the lowest potential VS is about 400 V.

The present invention is also usable as a gate driver of the other IGBT. A case will be described where the signal transmitting device according to the first embodiment is used as an alarm output circuit. In FIG. 1, the transmitting circuit 11 is connected to the terminal for applying the lowest potential VS of the second power source 24 and the receiving circuit 22 is connected to, for example, the ground potential GND to be the lowest potential of the first power source 14. In this case, the receiving circuit 22 receives an input of a signal from a status detecting circuit (not depicted) that detects the status of the IGBT. The status detecting circuit detects an abnormality such as an excessive voltage, overheating, or the like of the IGBT. The status detecting circuit may be provided inside the transmitting circuit 11. When the transmitting circuit 11 receives from the status detecting circuit, a signal indicating that an abnormality is detected, the transmitting circuit 11 transmits the signal to the receiving circuit 22 through the actuator 10 and the sensor element 21 as above. The receiving circuit 22 externally outputs the alarm signal as the output signal OUT. In a case where the signal transmitting device as the alarm output circuit is concurrently used with the signal transmitting device as the gate driver, when the receiving circuit 22 of the alarm output circuit receives the abnormality signal, the receiving circuit 22 may output a signal to turn off the IGBT, to the transmitting circuit 11 of the gate driver. The present invention is also usable as the alarm output circuit of the other IGBT.

As described, according to the first embodiment, the piezoelectric element of the actuator and the sensor element of the pressure sensor are formed on different members and are integrated in a single module, whereby the physical distance may be secured between the piezoelectric element and the sensor element that are arranged in the same first space. Therefore, the dielectric breakdown voltage between the actuator and the pressure sensor may be set by the distance between the piezoelectric element and the sensor element (the distance between the piezoelectric chip and the semiconductor chip). Thus, the distance between the piezoelectric element and the sensor element may be set without being constrained by the chip size, and the dielectric breakdown voltage between the actuator and the pressure sensor may be set variously based on the magnitude of the voltage to be applied. Signal transmission with high insulation performance may be executed between the piezoelectric element and the pressure sensor that are integrated in the single module and that are electrically insulated from each other.

According to the first embodiment, the module may be fabricated easily using existing fabrication apparatuses and an existing fabrication method because ordinary commercially marketed products are usable for the pressure sensor IC chip, the piezoelectric chip, the transmitting chip, and the package. According to the first embodiment, the life time is longer than that in a case where, for example, a photocoupler is used because the signal transmission is executed using pressure as the medium. According to the first embodiment, the range of applications is wide and the signal transmitting device is applicable to various modules because not only digital signals but also analog signals (only AC signals) may be transmitted.

Figure 3:
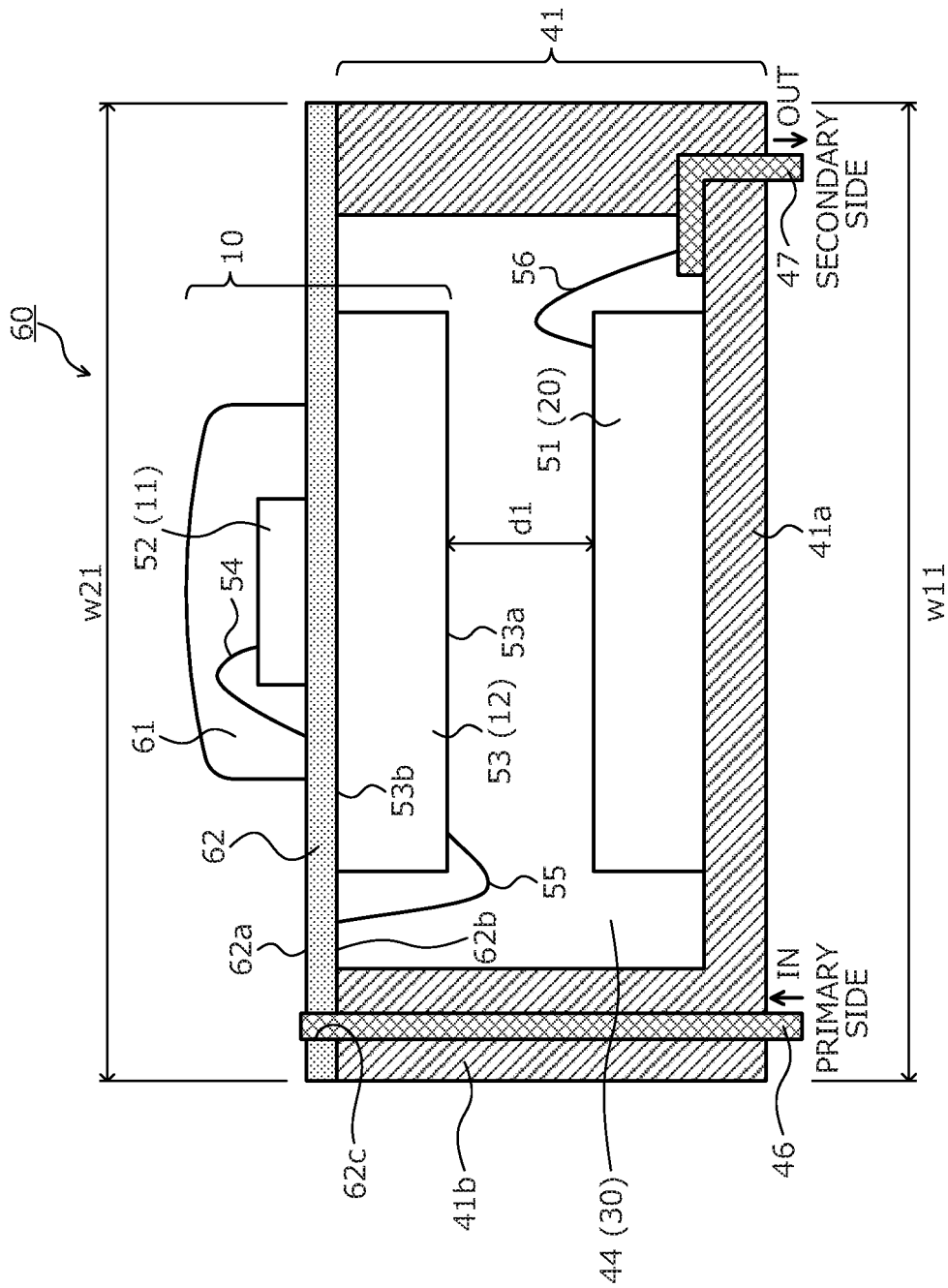
FIG. 3 is a cross-sectional diagram of a configuration of a signal transmitting device according to a second embodiment.

A configuration of the signal transmitting device according to a second embodiment will be described. FIG. 3 is a cross-sectional diagram of the configuration of a signal transmitting device according to the second embodiment. The circuit configuration of the signal transmitting device according to the second embodiment is a same as that of the signal transmitting device according to the first embodiment (see FIG. 1). The signal transmitting device according to the second embodiment differs from the signal transmitting device according to the first embodiment in that the transmitting chip 52 is protected by a sealing resin 61 without provision of a package cap. A package 60 only includes the package main body 41 and a base substrate 62, and only has therein the first space 44 that is surrounded by the package main body 41 and the base substrate 62 so as to be airtight.

The pressure sensor IC chip 51 and the piezoelectric chip 53 are arranged inside the package 60 (the first space 44) in a same manner as that of the first embodiment. The back face of the transmitting chip 52 is joined to a front face 62a of the base substrate 62, whereby the transmitting chip 52 is arranged outside the package 60. Reference numerals "62b" and "62c" respectively denote a back face of the base substrate 62 and a through hole. The sealing resin 61 covers the transmitting chip 52 and the bonding wire 54. The width w21 of the base substrate 62 is equal to, for example, the width w11 of the package main body 41 (w21=w11).

As described, according to the second embodiment, effects similar to those of the first embodiment may be achieved even when the package cap is not provided, because the airtightness of the first space may be secured by bonding the package main body and the base substrate with each other.

Figure 4:
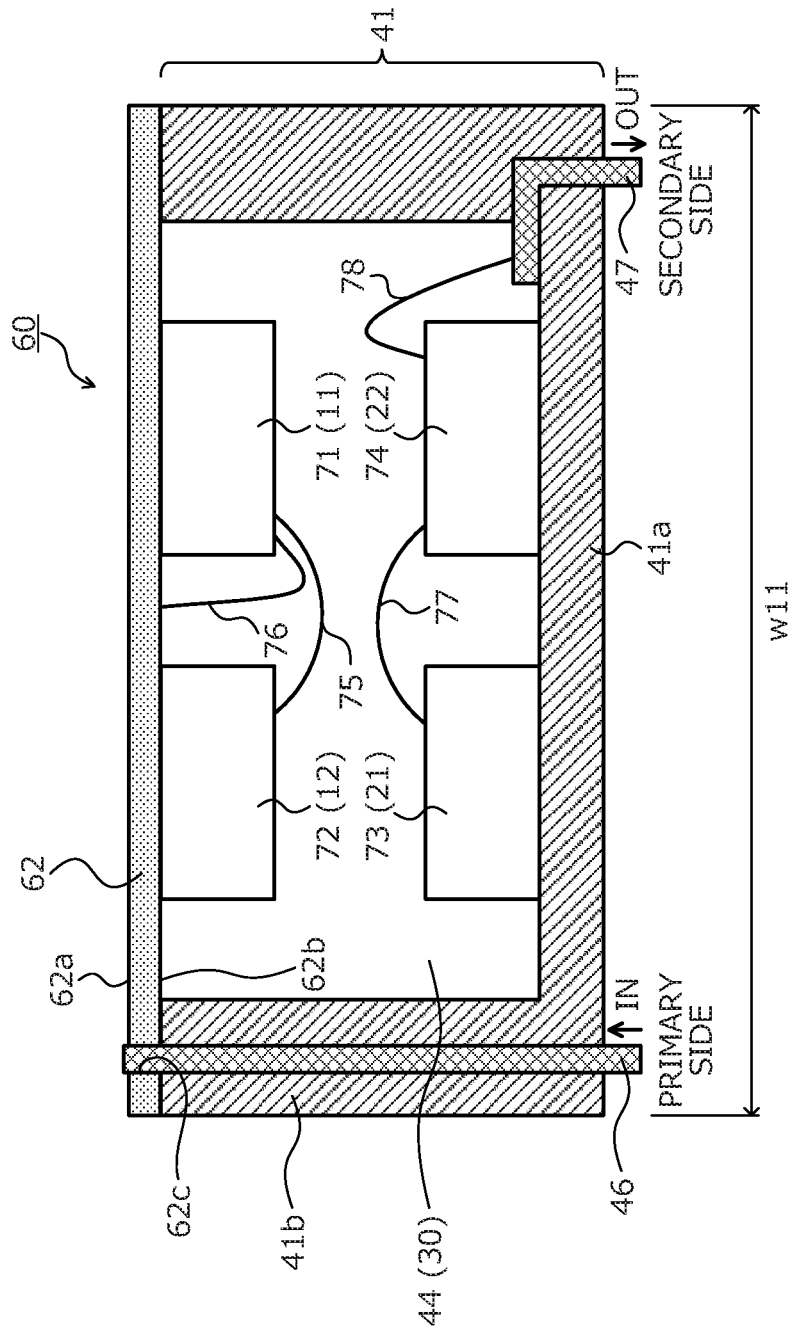
FIG. 4 is a cross-sectional diagram of a configuration of a signal transmitting device according to a third embodiment.

A configuration of the signal transmitting device according to a third embodiment will be described. FIG. 4 is a cross-sectional diagram of the configuration of a signal transmitting device according to the third embodiment. The circuit configuration of the signal transmitting device according to the third embodiment is a same as that of the signal transmitting device according to the first embodiment (see FIG. 1). The signal transmitting device according to the third embodiment differs from the signal transmitting device according to the second embodiment in that the transmitting chip 52 is integrated inside the package 60. All the semiconductor chips constituting the actuator 10 and the pressure sensor 20 are integrated in the first space 44 that is the pressure propagation region 30.

For example, a transmitting chip 71, a piezoelectric chip 72, a sensor chip (the first semiconductor substrate) 73, and a receiving chip (a third semiconductor substrate) 74 are arranged in the first space 44. The sensor chip 73 is a semiconductor chip that constitutes the sensor element 21 of the pressure sensor 20. The receiving chip 74 is a semiconductor chip that constitutes the receiving circuit 22 of the pressure sensor 20. Instead of the sensor chip 73 and the receiving chip 74, a pressure sensor IC chip having the sensor element 21 and the receiving circuit 22 integrally formed thereon may be arranged.

The back face of the transmitting chip 71 and the back face of the piezoelectric chip 72 are joined to the back face 62b of the base substrate 62. The transmitting chip 71 and the piezoelectric chip 72 are arranged to be separated from each other. A front face electrode of the transmitting chip 71 is electrically connected to either the metal electrode 13a or the metal electrode 13b of the piezoelectric chip 72 by a bonding wire 75. The front face electrode of the transmitting chip 71 is electrically connected to the other one of the metal electrode 13a and the metal electrode 13b of the piezoelectric chip 72 through a circuit pattern (not depicted) of the back face 62b of the base substrate 62 by a bonding wire 76.

The back face of the sensor chip 73 and the back face of the receiving chip 74 are joined to the bottom face 41a of the package main body 41 in the concave portion of the package main body 41. The sensor chip 73 and the receiving chip 74 are arranged to be separated from each other. The front face electrodes (not depicted) of the sensor chip 73 and the receiving chip 74 are electrically connected by, for example, a bonding wire 77. The front face electrode of the receiving chip 74 is electrically connected to the other end of the second external connection terminal 47 by, for example, a bonding wire 78.

As described, according to the third embodiment, effects similar to those of the first and the second embodiments may be achieved even when all the semiconductor chips are integrated in the space surrounded by the package main body and the base substrate (the first space).

Figure 5:
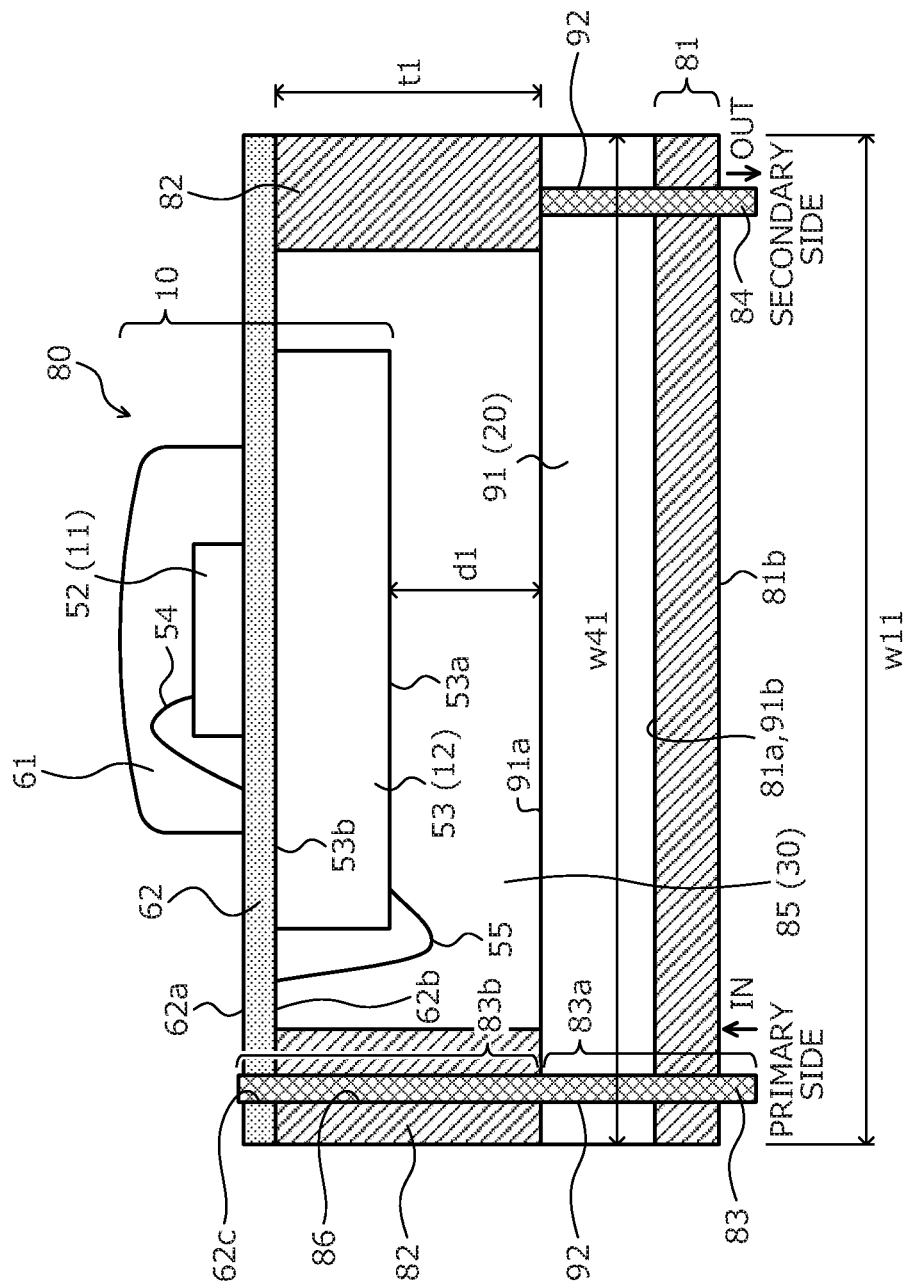
FIG. 5 is a cross-sectional diagram of a configuration of a signal transmitting device according to a fourth embodiment.

A configuration of the signal transmitting device according to a fourth embodiment will be described. FIG. 5 is a cross-sectional diagram of the configuration of a signal transmitting device according to the fourth embodiment. The circuit configuration of the signal transmitting device according to the fourth embodiment is a same as that of the signal transmitting device according to the first embodiment (see FIG. 1). The signal transmitting device according to the fourth embodiment differs from the signal transmitting device according to the second embodiment in that a package 80 is configured by bonding a package main body 81 and the base substrate 62 to each other through an interposer (a relaying member) 82. A space (the first space) 85 surrounded by the base substrate 62, the interposer 82, and a pressure sensor IC chip 91 so as to be airtight is the pressure propagation region 30.

For example, the package main body 81 is a member having a flat plate-like cross-sectional shape, integrally formed with a first and a second external connection terminals 83 and 84. A back face 91b of the pressure sensor IC chip 91 is joined to the front face 81a of the package main body 81. The planar shape of the pressure sensor IC chip 91 is, for example, a substantially rectangular shape whose dimensions are equal to those of the package main body 81. A width w41 of the pressure sensor IC chip 91 is equal to the width w11 of the package main body 81 (w41=w11). A through silicon via (TSV) 92 penetrating the pressure sensor IC chip 91 is formed in the pressure sensor IC chip 91.

The interposer 82 is joined to the front face 91a of the pressure sensor IC chip 91. For example, end portions of a terminal member 83a penetrating the TSV 92 of the pressure sensor IC chip 91 and a terminal member 83b penetrating the through hole 86 of the interposer 82 are joined to each other by solder. The pressure sensor IC chip 91 and the interposer 82 are thereafter bonded to each other by an adhesive that is injected into a gap between these members. The terminal members 83a and 83b whose end portions are joined to each other by solder constitute a first external connection terminal 83. The interposer 82 has a rectangular frame-like planar shape whose dimensions are equal to those of, for example, the pressure sensor IC chip 91. The interposer 82 may be formed using, for example, an ordinary package material.

The base substrate 62 is bonded to the interposer 82 with the back side 62b facing toward the pressure sensor IC chip 91, and faces the pressure sensor IC chip 91 sandwiching the interposer 82 therebetween. The base substrate 62 and the interposer 82 are bonded to each other by an adhesive that is injected into the gap between these members. The transmitting chip 52 is joined to the front face 62a of the base substrate 62 and is covered with the sealing resin 61 on the exterior of the package 80 in the same manner as that of the second embodiment. The back face 53b of the piezoelectric chip 53 is joined to the back face 62b of the base substrate 62 and the piezoelectric chip 53 is arranged in the first space 85 in the same manner as that of the second embodiment. The distance d1 between the pressure sensor IC chip 91 and the piezoelectric chip 53 may be adjusted variously by a thickness t1 of the interposer 82.

The first and the second external connection terminals 83 and 84 penetrate the package main body 81 in the depth direction to be arranged substantially perpendicular to the front face 81a and the back face 81b of the package main body 81. The plural first external connection terminals 83 are arranged in the same manner as those of the first embodiment. One end of the first external connection terminal 83 is exposed from the back face 81b of the package main body 81 to the exterior of the package 80. One end of the first external connection terminal 83 is electrically connected to the external circuit (not depicted) and the first power source 14 (see FIG. 1) on the primary side in the same manner as that of the first embodiment. The other end of the first external connection terminal 83 is exposed at the front face 62a of the base substrate 62 through the TSV 92 of the pressure sensor IC chip 91 and the through holes 86 and 62c of the interposer 82 and the base substrate 62 in the same manner as that of the first embodiment.

The other end of the first external connection terminal 83 is electrically connected to the circuit pattern on the front face 62a of the base substrate 62 in the same manner as that of the first embodiment. One end of the second external connection terminal 84 is exposed from the back face 81a of the package main body 81 to the exterior of the package 80. The one end of the second external connection terminal 84 is electrically connected to the external circuit (not depicted) and the second power source 24 (see FIG. 1) on the secondary side in the same manner as that of the first embodiment. The other end of the second external connection terminal 84 reaches the interposer 82 through the TSV 92 of the pressure sensor IC chip 91. The other end of the second external connection terminal 84 may be exposed in the first space 85 through the TSV 92 of the pressure sensor IC chip 91. The second external connection terminal 84 is electrically connected to the pressure sensor IC chip 91 through the TSV 92 of the pressure sensor IC chip 91.

As described, according to the fourth embodiment, effects similar to those of the first to the third embodiments may be achieved. According to the fourth embodiment, the pressure sensor IC chip and the second external connection terminal may be electrically connected to each other through the TSV of the pressure sensor IC chip. Therefore, the cost for wire-bonding the pressure sensor IC chip and the second external connection terminal to each other may be reduced. According to the fourth embodiment, the module may be fabricated using an ordinary commercially marketed pressure sensor IC chip that has therein the terminal member embedded in the TSV, and the general-versatility is therefore high.

Figure 6:
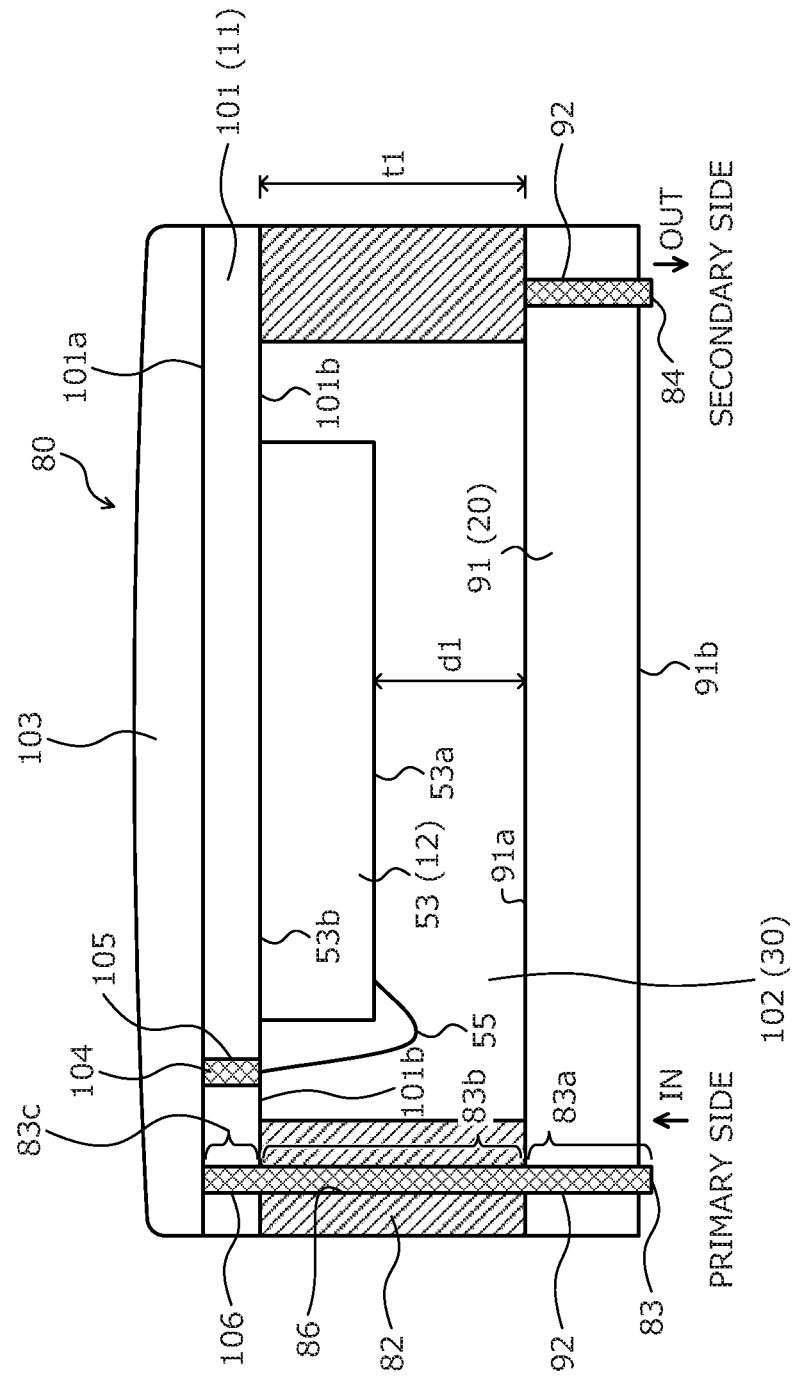
FIG. 6 is a cross-sectional diagram of a configuration of a signal transmitting device according to a fifth embodiment.

A configuration of the signal transmitting device according to a fifth embodiment will be described. FIG. 6 is a cross-sectional diagram of the configuration of a signal transmitting device according to the fifth embodiment. The circuit configuration of the signal transmitting device according to the fifth embodiment is a same as that of the signal transmitting device according to the first embodiment (see FIG. 1). The signal transmitting device according to the fifth embodiment differs from the signal transmitting device according to the fourth embodiment in that a space (the first space) 102 surrounded by the interposer 82, the pressure sensor IC chip 91, and a transmitting chip 101 is used as the pressure propagation region 30 without using the package (the case) and the base substrate.

For example, a front face 101a of the transmitting chip 101 is protected by, for example, a sealing resin 103 that covers the face overall. Instead of the sealing resin 103, a protective sheet may be used. When the front face 101a of the transmitting chip 101 does not need to be protected, the sealing resin 103 may be omitted. The back face 53b of the piezoelectric chip 53 is joined to a back face 101b of the transmitting chip 101. The transmitting chip 101 is joined to the interposer 82 with the back face 101b thereof facing toward the pressure sensor IC chip 91, and the transmitting chip 101 faces the pressure sensor IC chip 91 sandwiching the interposer 82 therebetween. The configurations and the joining method of the pressure sensor IC chip 91 and the interposer 82 are same as those of the fourth embodiment.

The interposer 82 is joined to the back face 101b of the transmitting chip 101. For example, the end portions of the terminal member 83b penetrating the through hole 86 of the interposer 82 and a terminal member 83c penetrating a TSV 106 of the transmitting chip 101 are joined to each other by solder. The pressure sensor IC chip 91 and the interposer 82 are thereafter bonded to each other by an adhesive that is injected into a gap between these members. The terminal members 83a to 83c whose end portions are joined by solder constitute the first external connection terminal 83. The airtightness of the first space 102 is secured by joining the interposer 82, and the pressure sensor IC chip 91 and the transmitting chip 101 to each other as above. The widths of the interposer 82, the pressure sensor IC chip 91, and the transmitting chip 101 may have the dimensions with which the first space 102 may be formed or each may differ.

The piezoelectric chip 53 is arranged in the first space 102. Either the metal electrode 13a or the metal electrode 13b (see FIG. 1) of the piezoelectric chip 53 is electrically connected to the transmitting circuit 11 of the transmitting chip 101 through the bonding wire 55 and a silicon penetrating electrode 104. The silicon penetrating electrode 104 is the electrode buried in the via (the TSV) 105 that penetrates the transmitting chip 101. The interposer 82 is formed by, for example, an ordinary package material as above, and the pressure sensor IC chip 91 and the transmitting chip 101 are each, for example, a silicon (Si) chip (a semiconductor chip). Therefore, the strength of the device may be such that the device is not distorted by an internal pressure or an external pressure during fabrication or practical use even when the package and the base substrate are not used.

The first external connection terminal 83 penetrates the TSV 92 of the pressure sensor IC chip 91, the through hole 86 of the interposer 82, and the TSV 106 of the transmitting chip 101. The plural first external connection terminals 83 are arranged in the same manner as those of the first embodiment. One end of the first external connection terminal 83 is exposed at the back face 91b of the pressure sensor IC chip 91. The one end of the first external connection terminal 83 is electrically connected to the external circuit (not depicted) and the first power source 14 (see FIG. 1) on the primary side in the same manner as that of the first embodiment. The other end of the first external connection terminal 83 is exposed at the front face 101a of the transmitting chip 101 and is electrically connected to the transmitting circuit 11.

The second external connection terminal 84 penetrates the TSV 92 of the pressure sensor IC chip 91. One end of the second external connection terminal 84 is exposed at the back face 91b of the pressure sensor IC chip 91. The one end of the second external connection terminal 84 is electrically connected to the external circuit (not depicted) and the second power source 24 (see FIG. 1) on the secondary side in the same manner as that of the first embodiment. The other end of the second external connection terminal 84 reaches the front face 91a of the pressure sensor IC chip 91. The other end of the second external connection terminal 84 may be in contact with the interposer 82 or may be exposed in the first space 102. The other end of the second external connection terminal 84 is electrically connected to the receiving circuit 22 on the front face 91a of the pressure sensor IC chip 91.

As described, according to the fifth embodiment, effects similar to those of the first to the fourth embodiments may be achieved even when the first space is formed only by the interposer and the semiconductor chip. According to the fifth embodiment, the constituent members may be reduced, a simplified configuration may be established, and the cost for the module may be reduced.

Figure 7:
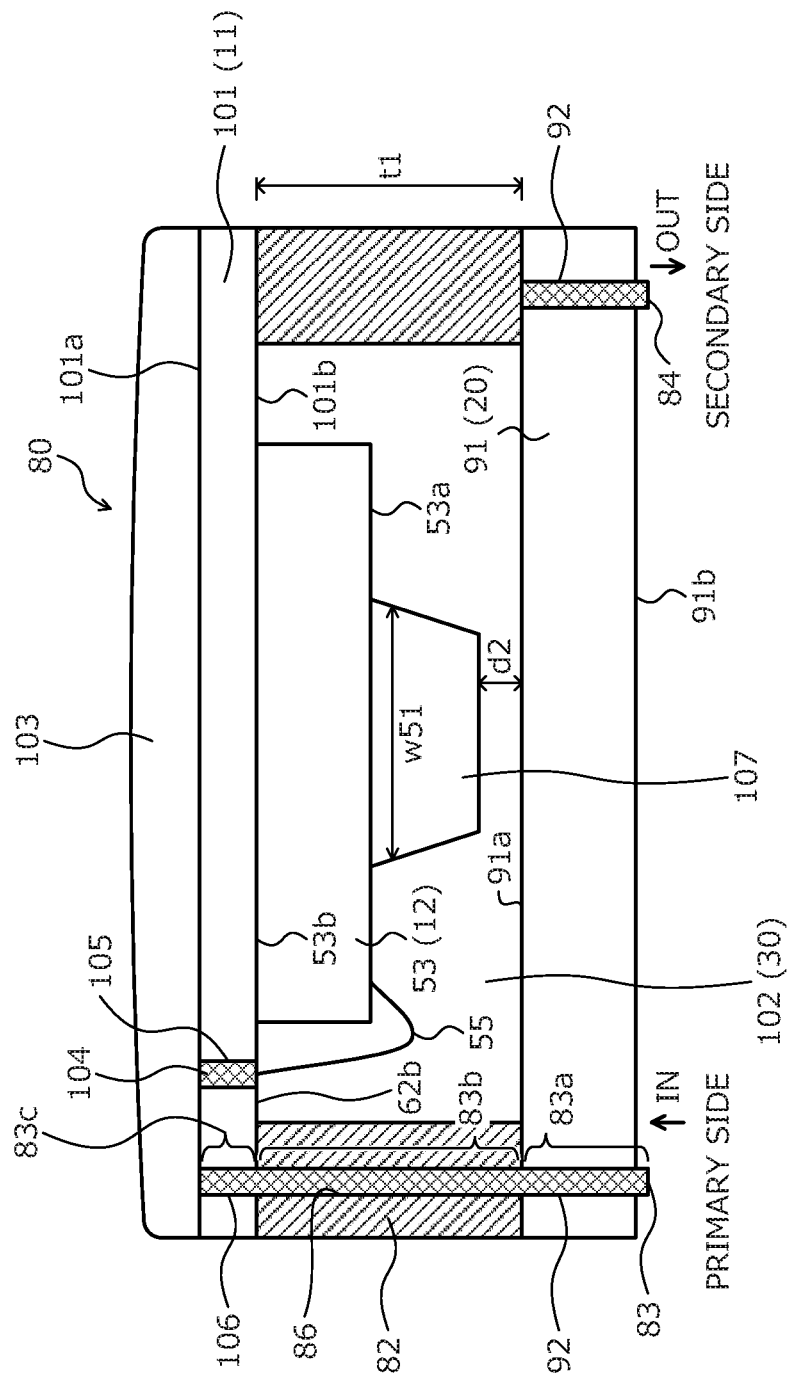
FIG. 7 is a cross-sectional diagram of a configuration of a signal transmitting device according to a sixth embodiment.

A configuration of the signal transmitting device according to a sixth embodiment will be described. FIG. 7 is a cross-sectional diagram of the configuration of a signal transmitting device according to the sixth embodiment. The circuit configuration of the signal transmitting device according to the sixth embodiment is a same as that of the signal transmitting device according to the first embodiment (see FIG. 1). The signal transmitting device according to the sixth embodiment differs from the signal transmitting device according to the fifth embodiment in that a member 107 including a material of high hardness (hereinafter, referred to as "high hardness member") is bonded to the front face 53a of the piezoelectric chip 53 to reduce the distance to the sensor element 21 of the pressure sensor IC chip 91 (see FIG. 1). The sensitivity of the sensor element 21 of the pressure sensor 20 is improved by reducing the distance to the sensor element 21 of the pressure sensor IC chip 91 by providing the high hardness member 107.

For example, the high hardness member 107 is bonded to the acting part of the piezoelectric chip 53. The high hardness member 107 is an insulating medium constituting the pressure propagation region 30 and includes a material whose hardness is higher than the other insulating mediums constituting the pressure propagation region 30 (a gas, a liquid, and a gel). For example, the high hardness member 107 may be formed by, for example, aluminum (Al) or a ceramic and a ceramic having no conductivity may be used. The high hardness member 107 faces at least the sensor element 21 formed on the pressure sensor IC chip 91, through other insulating mediums constituting the pressure propagation region 30.

The planar shape of the high hardness member 107 may be a same as the planar shape of the sensor element 21 of the pressure sensor IC chip 91 (that is, the substantially circular shape) and may face the overall sensor element 21. For example, the high hardness member 107 may have a truncated cone-like shape whose width w51 decreases with proximity to the pressure sensor IC chip 91. Although the high hardness member 107 and the pressure sensor IC chip 91 may be in contact with each other (that is, d2=0), the high hardness member 107 and the pressure sensor IC chip 91 may be arranged to be separated from each other to secure the dielectric breakdown voltage by the pressure propagation region 30 (d2>0).

The sixth embodiment may be applied to each of the first to the fourth embodiments.

As described, according to the sixth embodiment, effects similar to those of the first to the fifth embodiments may be achieved. According to the sixth embodiment, the sensitivity of the sensor element of the pressure sensor may be improved because the distance to sensor element of the pressure sensor may be reduced by bonding the high hardness member to the piezoelectric chip.

Figure 8:
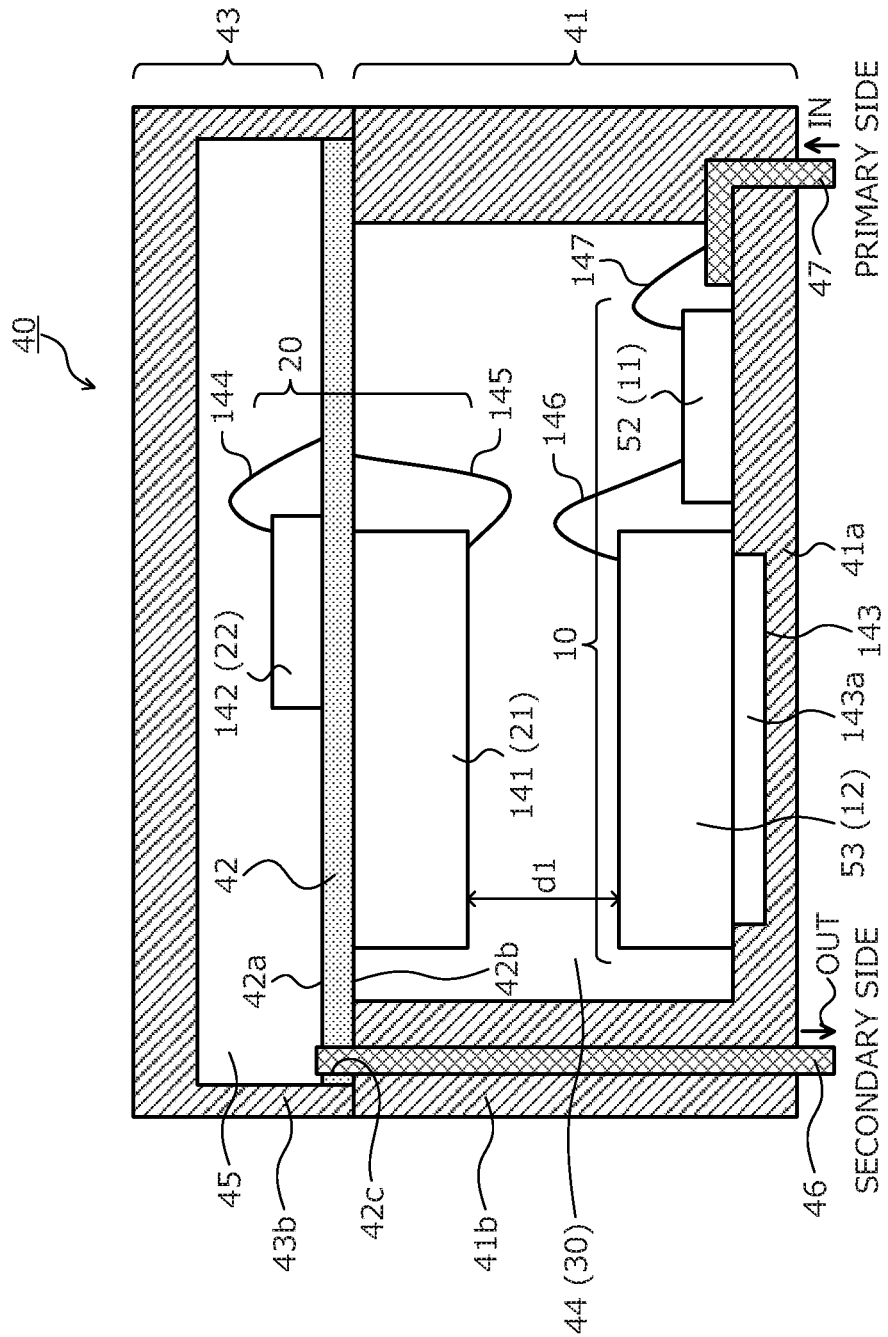
FIG. 8 is a cross-sectional diagram of a configuration of a signal transmitting device according to a seventh embodiment.

A configuration of the signal transmitting device according to a seventh embodiment will be described. FIG. 8 is a cross-sectional diagram of the configuration of a signal transmitting device according to the seventh embodiment. The circuit configuration of the signal transmitting device according to the seventh embodiment is a same as that of the signal transmitting device according to the first embodiment (see FIG. 1). The signal transmitting device according to the seventh embodiment differs from the signal transmitting device according to the first embodiment in that the arrangement positions of the actuator 10 and the pressure sensor 20 are interchanged with each other. The transmitting chip 52 and the piezoelectric chip 53 are arranged on the bottom face 41a of the package main body 41, and a sensor chip 141 and a receiving chip 142 are arranged on the base substrate 42.

For example, in the concave portion of the package main body 41, the back face of the transmitting chip 52 is joined to the bottom face 41a of the package main body 41. The front face electrode of the transmitting chip 52 is electrically connected to one end of the second external connection terminal 47 by a bonding wire 147. In the concave portion of the package main body 41, a concave portion 143 is provided on the bottom face 41a of the package main body 41, and the back face of the piezoelectric chip 53 is joined to the bottom face 41a of the package main body 41 to close the concave portion 143. The transmitting chip 52 and the piezoelectric chip 53 are arranged to be separated from each other.

A gap 143a is formed between the bottom face 41a of the package main body 41 and the piezoelectric chip 53 by the concave portion 143 of the bottom face 41a of the package main body 41 so that deformation and vibration of the piezoelectric chip 53 is not suppressed. Degradation of the pressure conversion efficiency of the piezoelectric chip 53 may be suppressed. Instead of the concave portion 143 of the bottom face 41a of the package main body 41, a conductive buffer material (not depicted) absorbing the deformation and the vibration of the piezoelectric chip 53 may be arranged. Either the metal electrode 13a or the metal electrode 13b of the piezoelectric chip 53 (see FIG. 1) is electrically connected to the transmitting chip 52 by a bonding wire 146. The other of the metal electrode 13a and the metal electrode 13b of the piezoelectric chip 53 is electrically connected to the circuit pattern on the bottom face 41a of the package main body 41. The other of the metal electrode 13a and the metal electrode 13b of the piezoelectric chip 53 is electrically connected to the transmitting chip 52 by connecting the circuit pattern on the bottom face 41a and the front face electrode of the transmitting chip 52 to each other using a bonding wire not depicted.

The back face of the receiving chip 142 is joined to the front face 42a of the base substrate 42. The front face electrode of the receiving chip 142 is electrically connected to the circuit pattern on the front face 42a of the base substrate 42 by a bonding wire 144. The back face of the sensor chip 141 is joined to the back face 42b of the base substrate 42. The front face electrode of the sensor chip 141 is electrically connected to the circuit pattern on the back face 42b of the base substrate 42 by a bonding wire 145. The sensor chip 141, in the same manner as that of the first embodiment, is arranged securing the physical distance d1 to the piezoelectric chip 53 in the same first space 44 in which the piezoelectric chip 53 is provided.

The configuration of the package 40 is same as that of the first embodiment. In the seventh embodiment, the second external connection terminal 47 acts as the terminal on the primary side and the first external connection terminal 46 acts as the terminal on the secondary side. The external circuit (not depicted) on the primary side is electrically connected to one end of the second external connection terminal 47, and various signals are input from the external circuit on the primary side into the second external connection terminal 47. The external circuit (not depicted) on the secondary side is electrically connected to one end of the first external connection terminal 46 and the output signal OUT is output from the first external connection terminal 46 to the external circuit on the secondary side.

As described, according to the seventh embodiment, effects similar to those of the first to the sixth embodiments may be achieved even when the arrangement positions of the piezoelectric chip and the sensor chip are interchanged with each other. The sensor element of the pressure sensor IC chip and the acting part of the piezoelectric chip suffice to face each other through the insulating medium, and the arrangement of the piezoelectric chip and the sensor chip may be changed variously in the same airtight space.

Figure 9:
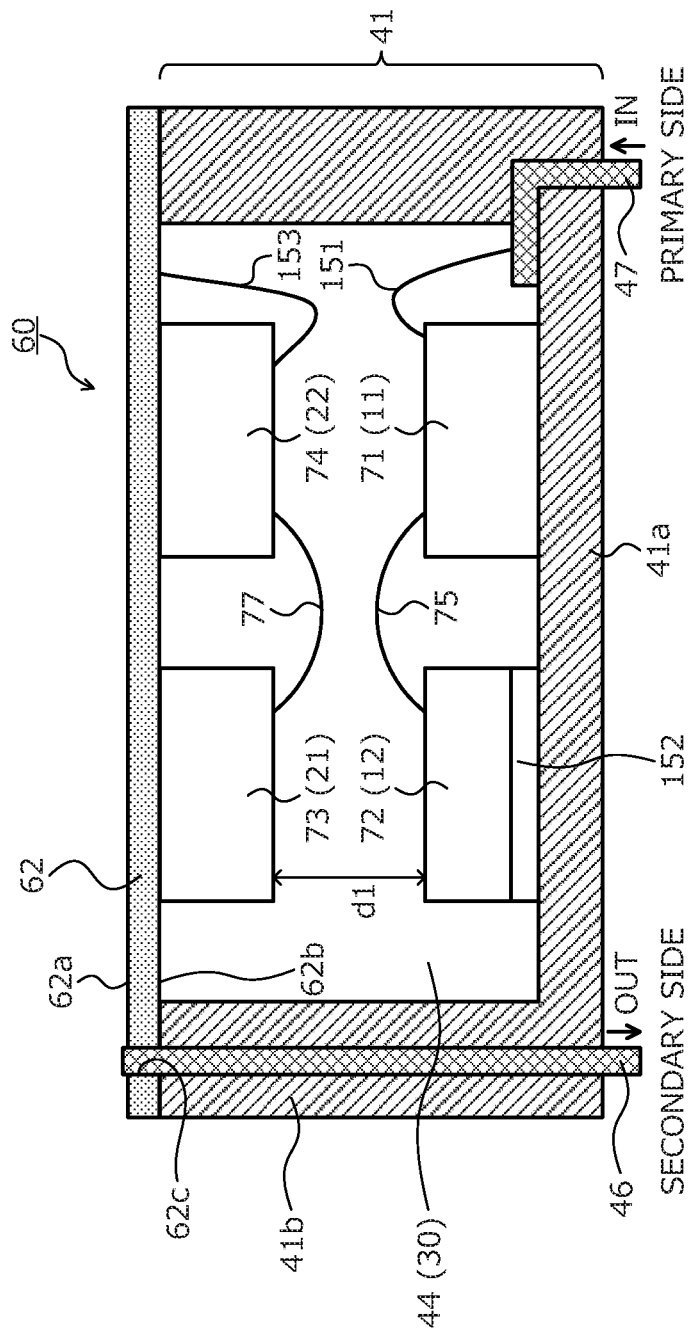
FIG. 9 is a cross-sectional diagram of a configuration of a signal transmitting device according to an eighth embodiment.

A configuration of the signal transmitting device according to an eighth embodiment will be described. FIG. 9 is a cross-sectional diagram of the configuration of a signal transmitting device according to the eighth embodiment. The circuit configuration of the signal transmitting device according to the eighth embodiment is a same as that of the signal transmitting device according to the first embodiment (see FIG. 1). The signal transmitting device according to the eighth embodiment differs from the signal transmitting device according to the third embodiment in that the arrangement positions of the actuator 10 and the pressure sensor 20 are interchanged with each other. The transmitting chip 71 and the piezoelectric chip 72 are arranged on the bottom face 41a of the package main body 41, and the sensor chip 73 and the receiving chip 74 are arranged on the base substrate 62.

For example, in the concave portion of the package main body 41, the back face of the transmitting chip 71 is joined to the bottom face 41a of the package main body 41. The front face electrode of the transmitting chip 71 is electrically connected to one end of the second external connection terminal 47 by a bonding wire 151. In the concave portion of the package main body 41, the back face of the piezoelectric chip 72 is joined to the bottom face 41a of the package main body 41 through the conductive buffer material 152. The transmitting chip 71 and the piezoelectric chip 72 are arranged to be separated from each other.

The deformation and the vibration of the piezoelectric chip 72 are absorbed by the conductive buffer material 152, whereby the deformation and the vibration of the piezoelectric chip 72 are not suppressed. Therefore, degradation of the pressure conversion efficiency of the piezoelectric chip 72 may be suppressed. Instead of the conductive buffer material 152, a concave portion may be provided on the bottom face 41a of the package main body 41 as in the seventh embodiment. Either the metal electrode 13a or the metal electrode 13b of the piezoelectric chip 72 is electrically connected to the transmitting chip 71 by the bonding wire 75. The other of the metal electrode 13a and the metal electrode 13b of the piezoelectric chip 72 (see FIG. 1) is electrically connected to the circuit pattern on the bottom face 41a of the package main body 41 through the conductive buffer material 152. The other of the metal electrode 13a and the metal electrode 13b of the piezoelectric chip 72 is electrically connected to the transmitting chip 71 by connecting the circuit pattern on the bottom face 41a and the front face electrode of the transmitting chip 71 to each other by a bonding wire not depicted.

The back face of the sensor chip 73 and the back face of the receiving chip 74 are joined to the back face 62b of the base substrate 62. The sensor chip 73 and the receiving chip 74 are arranged to be separated from each other. The front face electrodes (not depicted) of the sensor chip 73 and the receiving chip 74 are electrically connected to each other by, for example, the bonding wire 77 in the same manner as that of the third embodiment. The front face electrode of the receiving chip 74 is electrically connected to the circuit pattern on the front face 62a of the base substrate 62 through a through hole by a bonding wire 153, and is electrically connected to the first external connection terminal 46 through the circuit pattern on the front face 62a of the base substrate 62. The sensor chip 73, in the same manner as that of the third embodiment, is arranged securing the physical distance d1 to the piezoelectric chip 72 in the same first space 44 in which the piezoelectric chip 72 is provided.

The configuration of the package 60 is same as that of the third embodiment. In the eighth embodiment, the second external connection terminal 47 acts as the terminal on the primary side and the first external connection terminal 46 acts as the terminal on the secondary side. The external circuit (not depicted) on the primary side is electrically connected to one end of the second external connection terminal 47 and the various signals are input from the external circuit on the primary side into the second external connection terminal 47. The external circuit (not depicted) on the secondary side is electrically connected to one end of the first external connection terminal 46 and the output signal OUT is output from the first external connection terminal 46 to the external circuit on the secondary side.

As described, according to the eighth embodiment, effects similar to those of the first to the seventh embodiments may be achieved even when the arrangement positions of the piezoelectric chip and the sensor chip are interchanged with each other.

Figure 10:
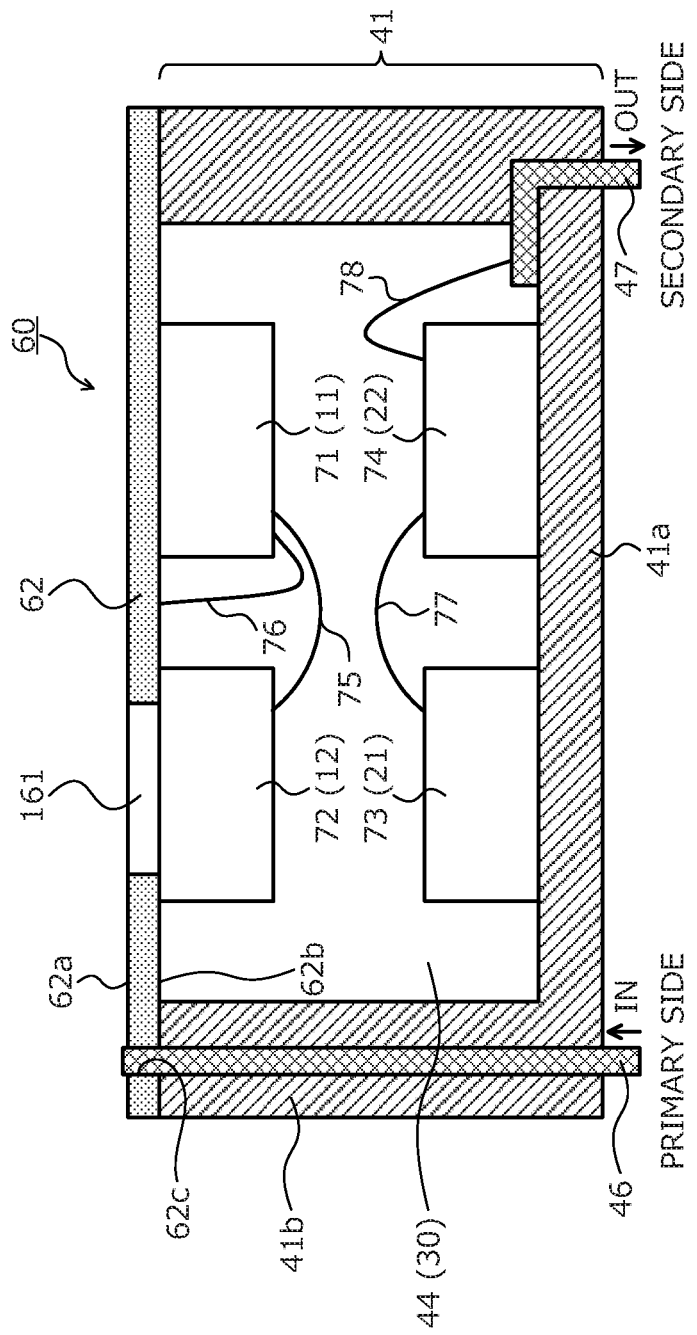
FIG. 10 is a cross-sectional diagram of a configuration of a signal transmitting device according to a ninth embodiment.

A configuration of the signal transmitting device according to a ninth embodiment will be described. FIG. 10 is a cross-sectional diagram of the configuration of a signal transmitting device according to the ninth embodiment. The circuit configuration of the signal transmitting device according to the ninth embodiment is a same as that of the signal transmitting device according to the first embodiment (see FIG. 1). The signal transmitting device according to the ninth embodiment differs from the signal transmitting device according to the third embodiment in that an opening 161 is present in a portion that faces the piezoelectric chip 72, of the base substrate 62.

The piezoelectric chip 72 is joined to the back face 62b of the base substrate 62 to close the opening 161 of the base substrate 62 whereby the airtightness of the first space 44 is maintained. The package cap 43 may also be provided to secure the airtightness of the first space 44 by joining the base substrate 62 and the piezoelectric chip 72 to each other, and the package main body 41 and the package cap 43 may be joined to each other in the same manner as those of the first embodiment. A portion in which the base substrate 62 and the piezoelectric chip 72 are not in contact with each other is formed by the opening 161 of the base substrate 62, whereby deformation and vibration of the piezoelectric chip 72 are not suppressed. Therefore, degradation of the pressure conversion efficiency of the piezoelectric chip 72 may be suppressed.

As described, according to the ninth embodiment, effects similar to those of the first to the eighth embodiments may be achieved.

Figure 11:
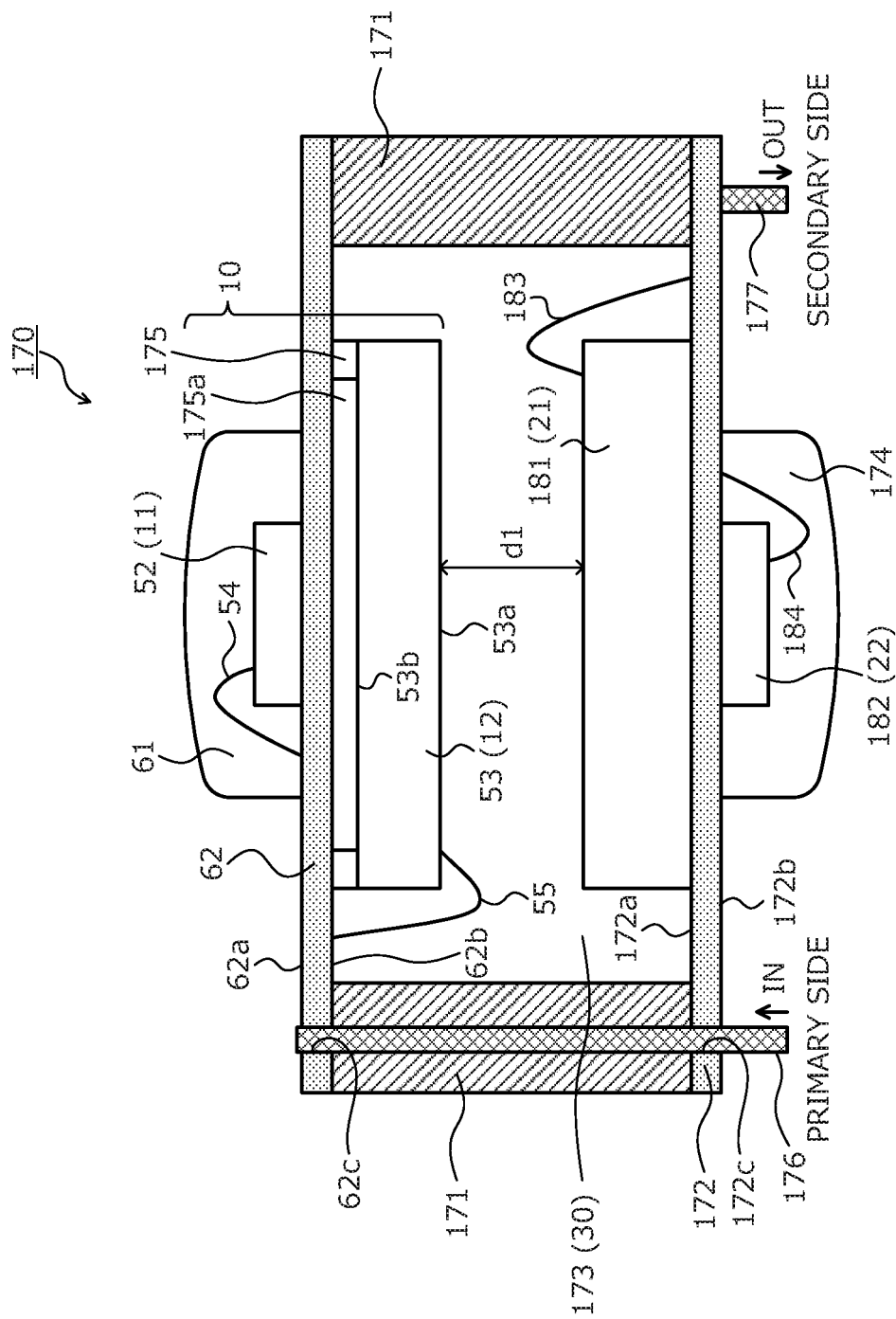
FIG. 11 is a cross-sectional diagram of a configuration of a signal transmitting device according to a tenth embodiment.

A configuration of the signal transmitting device according to a tenth embodiment will be described. FIG. 11 is a cross-sectional diagram of the configuration of a signal transmitting device according to the tenth embodiment. The circuit configuration of the signal transmitting device according to the tenth embodiment is a same as that of the signal transmitting device according to the first embodiment (see FIG. 1). The signal transmitting device according to the tenth embodiment differs from the signal transmitting device according to the fourth embodiment in the following two points.

The first point is that two base substrates (hereinafter, referred to as "first and second base substrates") 62 and 172 are bonded to each other through an interposer 171 to constitute a package 170. A space (the first space) 173 that is airtight and surrounded by the first and the second base substrates 62 and 172 and the interposer 171 is the pressure propagation region 30. The configuration of the interposer 171 is same as that of the fifth embodiment. In the first space 173, the back face 62b of the first base substrate 62 and the front face 172a of the second base substrate 172 face each other. The transmitting chip 52 and the piezoelectric chip 53 are joined to the first base substrate 62 to face each other sandwiching the first base substrate 62 therebetween in the same manner as those of the fourth embodiment. The piezoelectric chip 53 is arranged in the first space 173. The transmitting chip 52 is covered with the sealing resin 61 on the exterior of the package 170.

A sensor chip 181 and a receiving chip 182 are joined to the second base substrate 172 to face each other sandwiching the second base substrate 172 therebetween. The sensor chip 181 is arranged securing the physical distance d1 to the piezoelectric chip 53 in the same first space 173 in which the piezoelectric chip 53 is provided, in the same manner as that of the fifth embodiment. The back face of the sensor chip 181 is joined to the front face 172a of the second base substrate 172. The front face electrode (not depicted) of the sensor chip 181 is electrically connected to a circuit pattern on the front face 172a of the second base substrate 172 by a bonding wire 183.

The back face of the receiving chip 182 is joined to a back face 172b of the second base substrate 172. The front face electrode (not depicted) of the receiving chip 182 is electrically connected to the circuit pattern on the back face 172b of the second base substrate 172 by a bonding wire 184. The receiving chip 182 is covered with a sealing resin 174 on the exterior of the package 170. The circuit patterns on the front face 172a and the back face 172b of the second base substrate 172 are electrically connected to each other through a through hole not depicted, whereby the sensor chip 181 and the receiving chip 182 are electrically connected to each other.

The second point is that a conductive spacer 175 using a metal or an organic material is arranged between the first base substrate 62 and the piezoelectric chip 53. The electrode on the back face of the piezoelectric chip 53 is electrically joined to the circuit pattern on the back face 62c of the first base substrate 62 through the conductive spacer 175. A gap 175a is formed between the first base substrate 62 and the piezoelectric chip 53 by the conductive spacer 175, whereby deformation and vibration of the piezoelectric chip 53 are not suppressed. Therefore, degradation of the pressure conversion efficiency of the piezoelectric chip 53 may be suppressed.

A first external connection terminal 176 penetrates the interposer 171 in the depth direction. The plural first external connection terminals 176 are arranged in the same manner as those of the first embodiment. One end of the first external connection terminal 176 is exposed at the back face 172b of the second base substrate 172 through a through hole 172c of the second base substrate 172. The one end of the first external connection terminal 176 is electrically connected to the external circuit (not depicted) and the first power source 14 on the primary side (see FIG. 1) in the same manner as that of the fourth embodiment. The other end of the first external connection terminal 176 is exposed at the front face 62a of the first base substrate 62 through a through hole 62c of the first base substrate 62 in the same manner as that of the first embodiment.

The other end of the first external connection terminal 176 is electrically connected to the circuit pattern on the front face 62a of the first base substrate 62 in the same manner as that of the first embodiment. A second external connection terminal 177 is joined to the second base substrate 172. Plural second external connection terminals 177 are arranged in the same manner as those of the first embodiment. One end of the second external connection terminal 177 is electrically connected to an external circuit (not depicted) and the second power source 24 on the secondary side (see FIG. 1) in the same manner as that of the first embodiment. The other end of the second external connection terminal 177 is electrically connected to a receiving chip 182 through the circuit pattern on the back face 172b of the second base substrate 172.

A configuration may be employed that does not suppress deformation and vibration of the piezoelectric chip by forming a gap by the conductive spacer between the piezoelectric chip and the member to which the piezoelectric chip is joined by applying the tenth embodiment to each of the second to the sixth embodiments. The conductive spacer may be arranged instead of the concave portion of the bottom face of the package main body, the conductive buffer material, or the opening of the base substrate, by applying the tenth embodiment to each of the seventh to the ninth embodiments.

As described, according to the tenth embodiment, effects similar to those of the first to the ninth embodiments may be achieved even when the first space is formed only by the interposer and the base substrate.

Figure 13A:
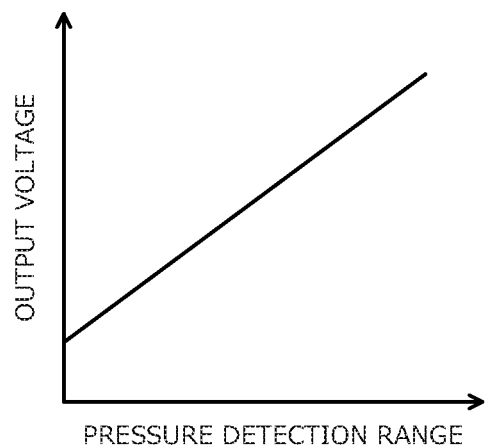
FIGS. 13A and 13B are explanatory diagrams of output characteristics and a configuration of a receiving circuit in a case where the analog output method is applied.
Figure 13B:
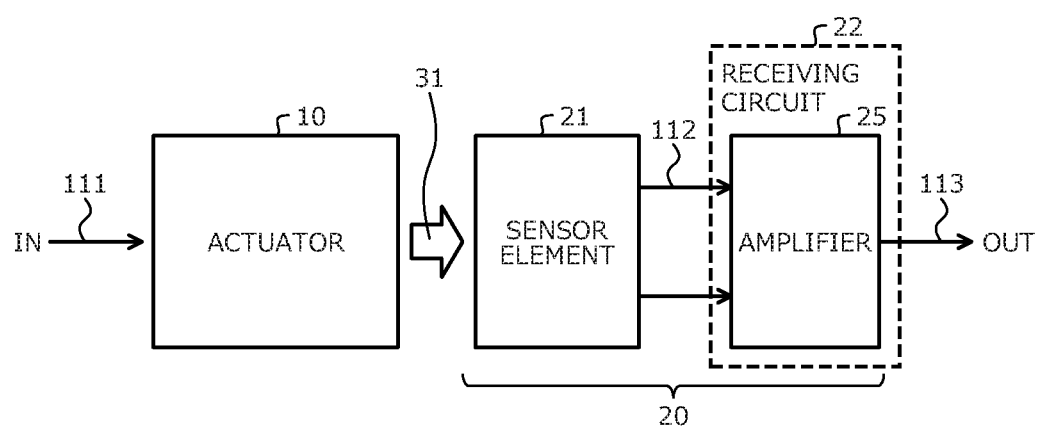

An operation of the signal transmitting device according to the present invention will be described below with reference to FIGS. 1, 2, 12, 13A, and 13B as an eleventh embodiment, taking an example of the case where an analog output method is applied. FIG. 12 is a time chart of an operation waveform produced in a case where the analog output method is applied. The axis of abscissa in FIG. 12 represents time and the axis of ordinate therein represents a voltage value (the amplitude) of an analog electrical signal. FIGS. 13A and 13B are explanatory diagrams of output characteristics and the configuration of a receiving circuit in a case where the analog output method is applied. FIG. 13A depicts linear characteristics (linearity) of an analog electrical signal and FIG. 13B depicts a block diagram of the receiving circuit 22 in a case where the analog output method is applied. The axis of abscissa of FIG. 13A represents a detection range of the pressure 31 (a pressure detection range) by the sensor element 21 and the axis of ordinate represents the voltage value of the output signal OUT (an output voltage) (similarly in FIGS. 15A and 15B).

As depicted in FIGS. 12 and 13B, the analog input signal IN is input from the external circuit (not depicted) on the primary side and is transmitted to the transmitting circuit 11 of the actuator 10. The transmitting circuit 11 operates (on) using the ground potential GND as the reference and the power source potential VCC of the first power source 14 as the highest potential, receives an input of the input signal IN, and outputs a first analog electrical signal 111. The first analog electrical signal 111 has a linear characteristic for the voltage value (the amplitude) to be continuously increased or reduced. For example, the first analog electrical signal 111 is a triangle wave electrical signal (an AC signal) that linearly increases at a predetermined angle corresponding to the voltage value of the input signal IN to exhibit a maximal value and that thereafter linearly decreases at a predetermined angle to exhibit a minimal value. The maximal value of the first analog electrical signal 111 may be, for example, the power source potential VCC of the first power source 14 (see FIG. 1) and the minimal value thereof may be the lowest potential of the first power source 14 (the ground potential GND).

The piezoelectric element 12 of the actuator 10 receives the first analog electrical signal 111 and is thereby driven (deformed or vibrated) to generate in the pressure propagation region 30, the pressure 31 that corresponds to the voltage value of the first analog electrical signal 111. The pressure 31 is propagated to the sensor element 21 of pressure sensor 20 through the insulating medium of the pressure propagation region 30. The sensor element 21 detects the pressure 31 generated in the pressure propagation region 30 and converts the pressure 31 into a second analog electrical signal 112 having a voltage value that continuously increases or decreases in proportion to an increase or a decrease of the pressure 31. The second analog electrical signal 112 has the same linear characteristic (not depicted) as that of the first analog electrical signal 111 by the receiving circuit 11 (see FIG. 1).

The receiving circuit 22 of the pressure sensor 20 includes, for example, an amplifier 25 and operates (on) using the lowest potential VS of the second power source 24 (see FIG. 1) as the reference and using the power source potential VB of the second power source 24 as a highest potential. The amplifier 25 amplifies the second analog electrical signal 112 converted by the sensor element 21 at a predetermined gain and outputs a third analog electrical signal 113 that has the same linear characteristics as that of the second analog electrical signal 112 (see FIGS. 13A and 13B). The third analog electrical signal 113 is an AC signal that has the same linear characteristics as that of the first analog electrical signal 111 by the transmitting circuit 11. For example, the maximal value of the third analog electrical signal 113 may be the power source potential VB of the second power source 24 and the minimal value thereof may be the lowest potential VS of the second power source 24. The third analog electrical signal 113 is output from the second external connection terminal 47 (see FIG. 2) to the external circuit (not depicted) on the secondary side, as an analog output signal OUT.

The signal transmission is executed from the primary side to the secondary side by propagating the pressure 31 between the piezoelectric element 12 of the actuator 10 and the sensor element 21 of the pressure sensor 20 as described above. For the signal transmission by the pressure 31, the physical distance d1 is secured in the pressure propagation region 30 between the piezoelectric element 12 of the actuator 10 and the sensor element 21 of the pressure sensor 20 (see FIG. 2 and the like) and isolation is established therebetween for direct current (DC) with a high dielectric breakdown voltage. The input signal IN and the output signal OUT are insulated from each other in terms of DC. The signal transmission with high insulation is enabled from the piezoelectric element 12 of the actuator 10 to the sensor element 21 of the pressure sensor 20.

Figure 15A:
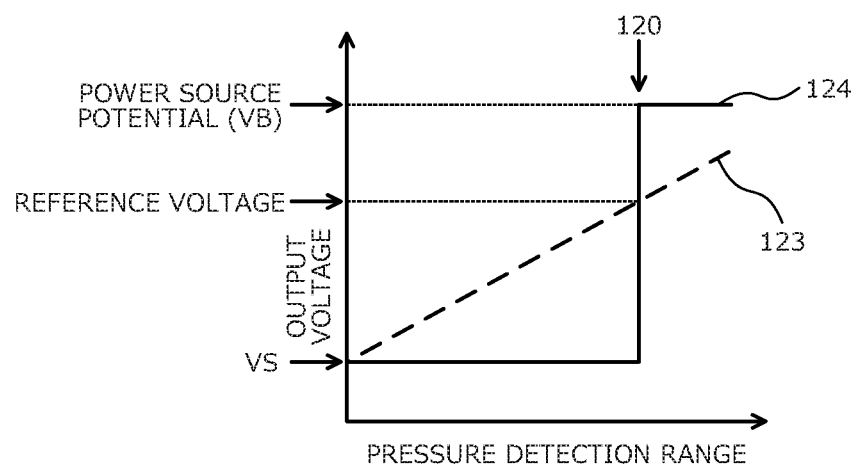
FIGS. 15A and 15B are explanatory diagrams of output characteristics and a configuration of the receiving circuit for a case where the digital output method is applied.
Figure 15B:
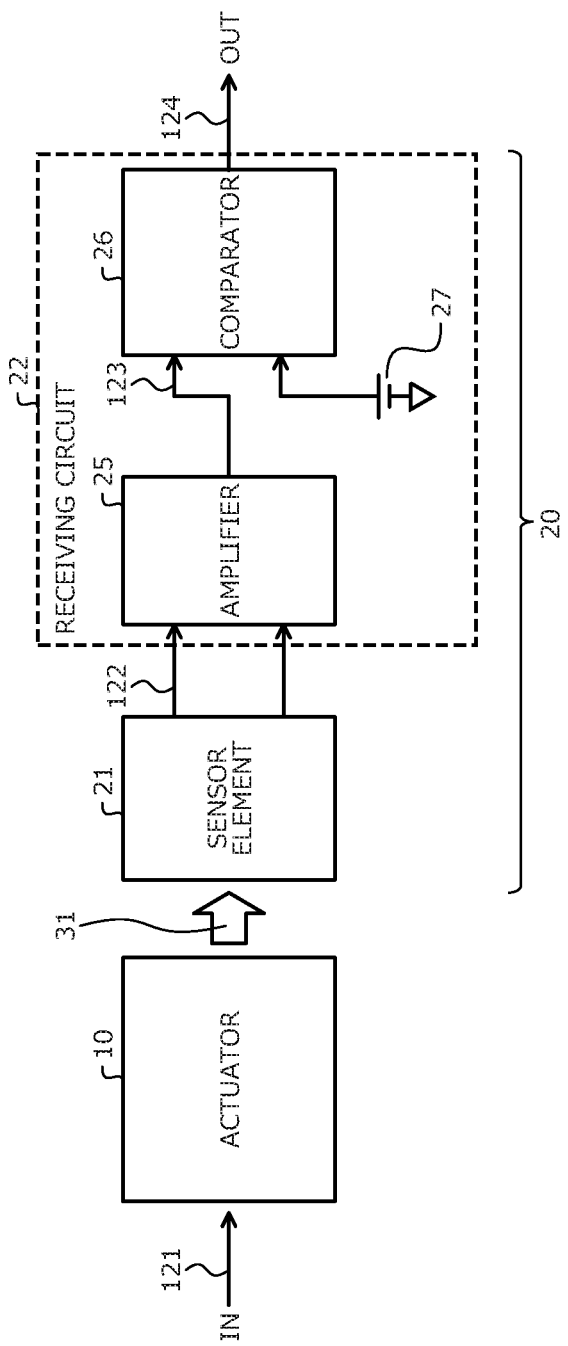

The signal transmission by the pressure 31 is applicable not only to the analog output method but also to the digital output method. An operation of the signal transmitting device according to the present invention will be described with reference to FIGS. 1, 14, 15A, and 15B, for a case of application to the digital output method. FIG. 14 is a time chart of an operation waveform acquired when the digital output method is applied. The axis of abscissa in FIG. 14 represents time and the axis of ordinate therein represents the voltage value (the amplitude) of a digital electrical signal (the same will be applied to FIG. 16). FIGS. 15A and 15B are explanatory diagrams of the output characteristics and the configuration of the receiving circuit for a case where the digital output method is applied. FIG. 15A depicts the non-linearity of a digital electrical signal and FIG. 15B depicts a block diagram for the digital output method.

As depicted in FIGS. 14 and 15B, a digital input signal IN is input from the external circuit (not depicted) on the primary side and is transmitted to the transmitting circuit 11 of the actuator 10. The transmitting circuit 11 operates using the ground potential GND as the reference and using the power source potential VCC of the first power source 14 as a highest potential. The transmitting circuit 11 receives an input of the input signal IN, and outputs a first digital electrical signal 121 with an amplitude, at a frequency, and in a phase based on a predetermined modulation method. The first digital electrical signal 121 is, for example, a rectangular-wave electrical signal having non-linear characteristics represented by two values including a value indicating a maximal value when an input of the input signal IN at a high (H) level is received and a value indicating a minimal value when an input of the input signal IN at a low (L) level is received. The maximal value and the minimal value of the first digital electrical signal 121 are, for example, equal to those of the analog output method.

The piezoelectric element 12 of the actuator 10 (see FIG. 1) is driven (turned on) when the first digital electrical signal 121 exhibits the maximal value, and generates the pressure 31 that corresponds to the voltage value of the first digital electrical signal 121 in the pressure propagation region 30. The piezoelectric element 12 is turned off when the first digital electrical signal 121 exhibits the minimal value. The pressure 31 generated in the pressure propagation region 30 is propagated to the sensor element 21 of the pressure sensor 20 through the insulating medium of the pressure propagation region 30. The sensor element 21 detects the pressure 31 generated in the pressure propagation region 30 and converts the pressure 31 into a second digital electrical signal 122 that is discretely increased or decreased corresponding to increases or decreases of the pressure 31.

The receiving circuit 22 of the pressure sensor 20 includes, for example, the amplifier 25 and a comparator (comparator) 26, and operates using the lowest potential VS of the second power source 24 as the reference and using the power source potential VB of the second power source 24 as a highest potential. The amplifier 25 amplifies the second digital electrical signal 122 converted by the sensor element 21 at a predetermined gain and outputs a third digital electrical signal 123 that has a linear property. The comparator 26 demodulates the third digital electrical signal 123 in accordance with a demodulation method that corresponds to the modulation method, and outputs a fourth digital electrical signal 124 that has a non-linear property.

For example, the comparator 26 compares the voltage value of the third digital electrical signal 123 amplified by the amplifier 25 and the reference voltage of a reference voltage circuit 27 with each other. The reference voltage of the reference voltage circuit 27 is a value that is based on an output voltage (the voltage value of the second digital electrical signal 122) of the sensor element 21 that corresponds to a pressure (hereinafter, referred to as "reference pressure") to be the reference to binarize the pressure 31 generated in the pressure propagation region 30. The output voltage of the comparator 26 (that is, the fourth digital electrical signal 124) represents the power source voltage (the power source potential VB of the second power source 24) when the voltage value of the third digital electrical signal 123 is equal to or higher than the reference voltage, and represents, for example, the lowest potential VS of the second power source 24 when the voltage value of the third digital electrical signal 123 is lower than the reference voltage (see FIG. 15A).

The fourth digital electrical signal 124 output from the comparator 26 has non-linear characteristics similar to the first digital electrical signal 121 by the transmitting circuit 11, and is a rectangular-wave electrical signal represented by two values of a maximal value and a minimal value (FIG. 14). The maximal value and the minimal value of the fourth digital electrical signal 124 are, for example, equal to those of the analog output method. The fourth digital electrical signal 124 is output from the second external connection terminal 47 to the external circuit (not depicted) on the secondary side as a digital output signal OUT.

The digital output method is useful for, for example, a driver for driving the gate of a switching element such as a MOSFET or an IGBT constituting an inverter.

Figure 16:
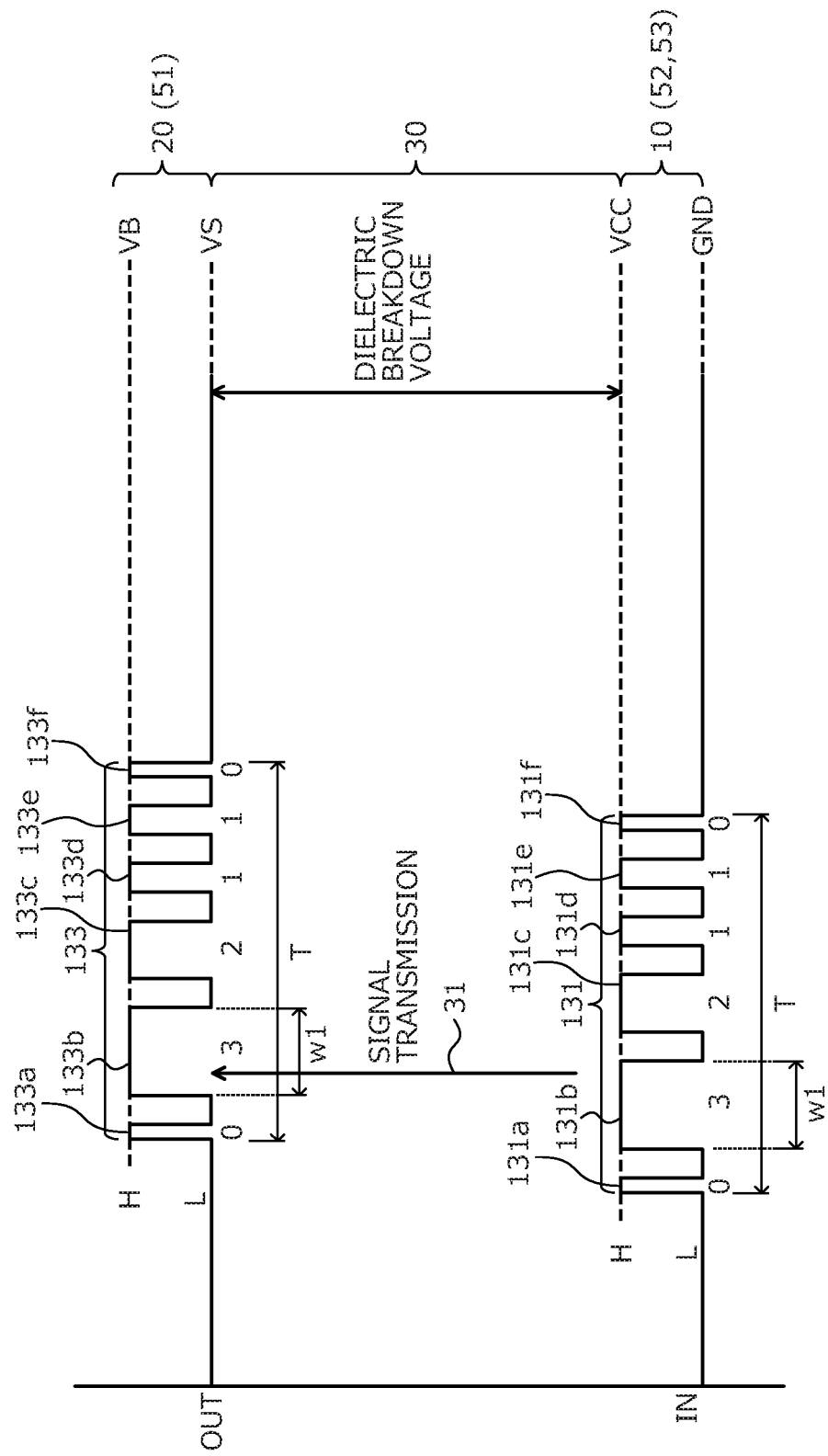
FIG. 16 is a time chart of another example of an operation waveform acquired when the digital output method is applied.

An output signal OUT exhibiting pseudo-linearity may be output by applying the digital output method. FIG. 16 is a time chart of another example of the operation waveform acquired when the digital output method is applied. As depicted in FIG. 16, digital input signals IN at the high level and the low level are alternately input repeatedly within a predetermined time period T from the external circuit (not depicted) on the primary side, and are transmitted to the transmitting circuit 11 of the actuator 10. The digital input signals IN for plural cycles are transmitted to the transmitting circuit 11 within the predetermined time period T. In this case, the time width w1 of the high level input signal IN is set by reducing or increasing stepwise, increasing stepwise and thereafter reducing, or the like, the input intervals (time differences) of the low level input signal IN.

The transmitting circuit 11 outputs a first digital electrical signal 131 that has non-linear characteristics for the plural cycles (for example, denoted by reference numerals "131a" to "131f" in temporal order on the time axis) within the predetermined time period T. The maximal value and the minimal value of the cycles 131a to 131f of the first digital electrical signal 131 are, for example, equal to those of the digital output method. The data values of the time widths (the amplitudes) w1 of the cycles 131a to 131f are assigned based on the input intervals of the low level input signal IN. For example, the data values of the time widths w1 of the cycles 131a to 131f of the input signal IN are denoted by reference numerals 0, 3, 2, 1, 1, 0 in temporal order on the time axis. The magnitude relation of the time widths w1 of the cycles 131a to 131f of the input signal IN is, for example, the reference numeral 0<the reference numeral 1<the reference numeral 2<the reference numeral 3.

The piezoelectric element 12 of the actuator 10 is driven by the first digital electrical signal 131 and the pressure 31 is transmitted to the sensor element 21 of the pressure sensor 20 in the same manner as that in a case where the digital output method is applied. The pressure 31 is converted by the sensor element 21 into the second analog electrical signal (not depicted), the second analog electrical signal is amplified by the amplifier 25 of the receiving circuit 22 and is output as a third analog electrical signal 133. The receiving circuit 22 does not include the comparator 26. The configuration of the receiving circuit 22 is same as that in a case where the analog output method is applied (see FIG. 13B). The third analog electrical signal 133 is a rectangular-wave electrical signal that has the same non-linear characteristics as that of the first digital electrical signal 131 by the transmitting circuit 11.

The third analog electrical signal 133 is the rectangular-wave electrical signal having the plural cycles (denoted by, for example, reference numerals "133a" to "133f" in temporal order on the time axis) consecutively within the predetermined time period T. The third analog electrical signal 133 is output from the second external connection terminal 47 to the external circuit (not depicted) on the secondary side, as the output signal OUT. The data values of the time widths w1 of the cycles 133a to 133f of the third analog electrical signal 133 are respectively equal to those of the cycles 131a to 131f of the first digital electrical signal 131 by the transmitting circuit 11. Based on the magnitude of each of the data values of the time widths w1 of the cycles 131a to 131f of the input signal IN, the third analog electrical signal 133 is output as an analog output signal OUT that is for one continuous cycle and has pseudo-linear characteristics for the plural cycles (133a to 133f) as the one cycle. In other words, in the present specification and claims, the term "pseudo-linear" refers to digital signals that oscillate between discrete voltage values, corresponding to high and low digital values, and which emulate a continuous slope by varying a duration of the high- and low-assertion states of the digital signal, as shown in FIG. 16.

As described, according to the eleventh embodiment, effects similar to those of the first to the tenth embodiments may be achieved.

Figure 20:
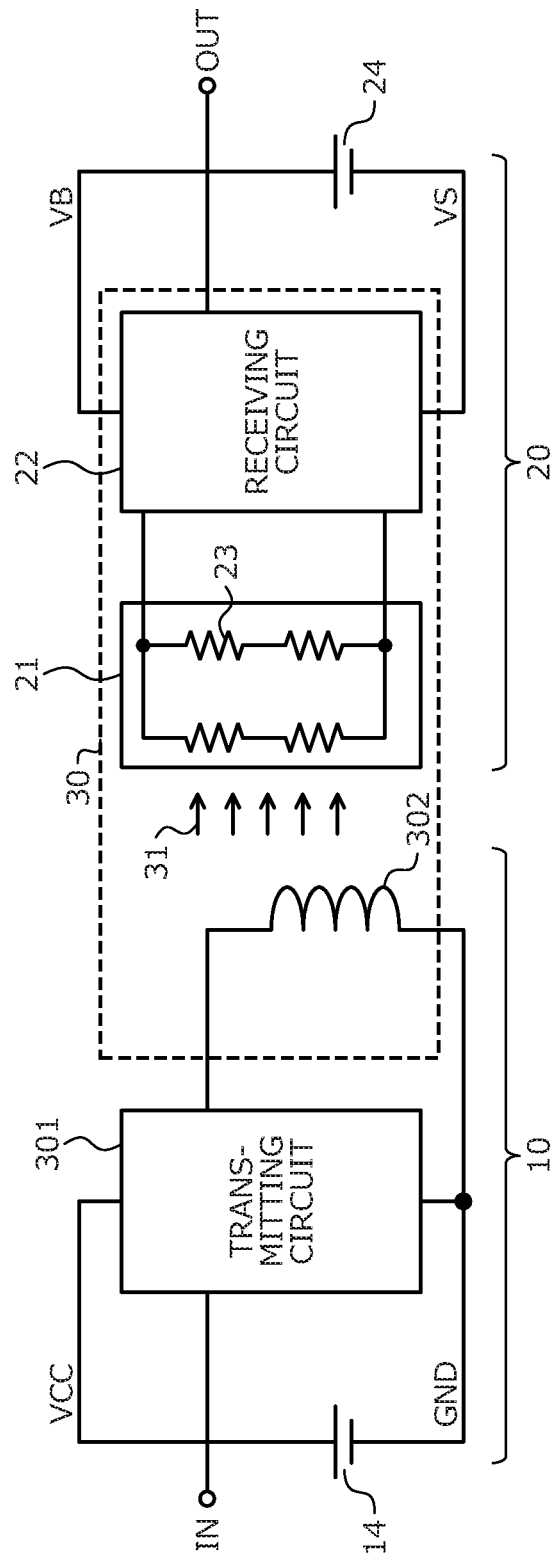
FIG. 20 is a circuit diagram of a circuit configuration of a signal transmitting device according to a twelfth embodiment.

A configuration of a signal transmitting device according to a twelfth embodiment will be described. FIG. 20 is a circuit diagram of the circuit configuration of the signal transmitting device according to the twelfth embodiment. The signal transmitting device according to the twelfth embodiment differs from the signal transmitting device according to the first embodiment in that the actuator 10 including a solenoid valve 302 is used instead of the piezoelectric element. As depicted in FIG. 20, the actuator 10 includes a transmitting circuit 301 and the solenoid valve 302. The first power source 14 has electric power to the extent that the first power source 14 may supply a voltage necessary for driving the transmitting circuit 301 and a current necessary for driving the solenoid valve 302. The configuration and the operation of the pressure sensor 20 are same as those of the first embodiment.

For example, the transmitting circuit 301 is an integrated circuit that operates using, for example, the ground potential GND to be the lowest potential of the first power source 14 as the reference and using the power source potential VCC of the first power source 14 as a highest potential in the same manner as that of the first embodiment. The transmitting circuit 301 is, for example, an open-loop current control circuit that receives an input of an input signal IN, transmits an electrical signal, and supplies a current to the solenoid valve 302 to drive the solenoid valve 302. For example, the transmitting circuit 301 supplies the current to a solenoid coil (a fixed unit including a wound coil) of the solenoid valve 302, and generates a magnetic field corresponding to an excitation current of the solenoid coil to move linearly in one direction, a plunger (a movable element including a magnetic body) that is arranged on the inner side of the solenoid coil (on the inner side of the wound wire) to enable movement of the plunger.

When the transmitting circuit 301 supplies the current to the solenoid valve 302, the transmitting circuit 301 drives the solenoid valve 302 to execute either operation of introducing (pulling) the plunger into the inner side of the solenoid coil to close the solenoid valve 302, or extruding (pushing) the plunger from the inner side of the solenoid coil to open the solenoid valve 302. The transmitting circuit 301 may have a function of controlling the amount of current to be supplied to the solenoid valve 302 to avoid excessive flow of current through the solenoid coil whereby the solenoid valve 302 may fail due to heat generation.

The transmitting circuit 301 controls the amount of current supplied to the solenoid valve 302 such that the current (an introduction current) flowing through the solenoid coil becomes maximal when the plunger is introduced into the inner side of the solenoid coil. In addition, the transmitting circuit 301 controls the amount of current supplied to the solenoid valve 302 such that the amount of current (retaining current) flowing through the solenoid coil is smaller than that of the introduction current when the plunger is retained (held) in a state where the plunger is completely introduced in the inner side of the solenoid coil. The transmitting circuit 301 may be a closed-loop current control (for example, PWM control) circuit that includes a feedback function of controlling the inductance of the solenoid coil by controlling the current flowing through the solenoid coil.

The solenoid valve 302 is an electromagnetic valve that converts electrical energy (current) generated in the solenoid coil into mechanical kinetic energy using the principles of an electromagnet to move the plunger linearly. One end of the solenoid coil is connected to the transmitting circuit 301 and the other end of the solenoid coil is connected to the lowest potential of the first power source 14. The force that acts on the plunger when the current is supplied from the transmitting circuit 301 is in either for the direction to introduce the plunger into the inner side of the solenoid coil or the direction to extrude the plunger from the inner side of the solenoid coil. A mechanism to move the plunger in the direction opposite to the above (that is, a mechanism that moves the plunger when the supply of the current by the transmitting circuit 301 is discontinued and the magnetic field by the solenoid coil disappears) is, for example, the weight of the plunger or an acting force applied by an elastic body such as a spring.

For example, it is assumed that, when current is supplied from the transmitting circuit 301, the solenoid valve 302 is closed, that is, the plunger moves in the direction for the plunger to be introduced into the inner side of the solenoid coil. In this case, a mechanism that moves the plunger of the solenoid valve 302 to a predetermined position where the plunger protrudes from the inner side of the solenoid coil when the supply of the current is discontinued from the transmitting circuit 301 to the solenoid valve 302 is, for example, a free fall of the plunger. Positional change occurring with the free fall of the plunger of the solenoid valve 302 from the inner side of (above) the solenoid coil to the predetermined position (under) where the plunger protrudes from the inner side of the solenoid coil is converted into the pressure 31. The magnitude of the pressure 31 may be adjusted using the weight of the plunger.

On the other hand, it is assumed that, when the supply of the current is discontinued from the transmitting circuit 301 to the solenoid valve 302, the plunger of the solenoid valve 302 moves in the direction for the plunger to be introduced into the inner side of the solenoid coil. In this case, the plunger is introduced into the inner side of the solenoid coil by, for example, a force generated when the length of an elastic body such as a spring attached to the plunger returns from an elongated state to a natural length. When the current is supplied from the transmitting circuit 301 to the solenoid valve 302, the torque (the force to extrude or introduce) of the solenoid valve 302 is set using the amount of the current flowing through the solenoid coil, the number of turns of the solenoid coil, and the like such that the plunger of the solenoid valve 302 overcomes the force of the elastic body, such as a spring, to move in the direction for the plunger to be extruded from the inner side of the solenoid coil.

Figure 21:
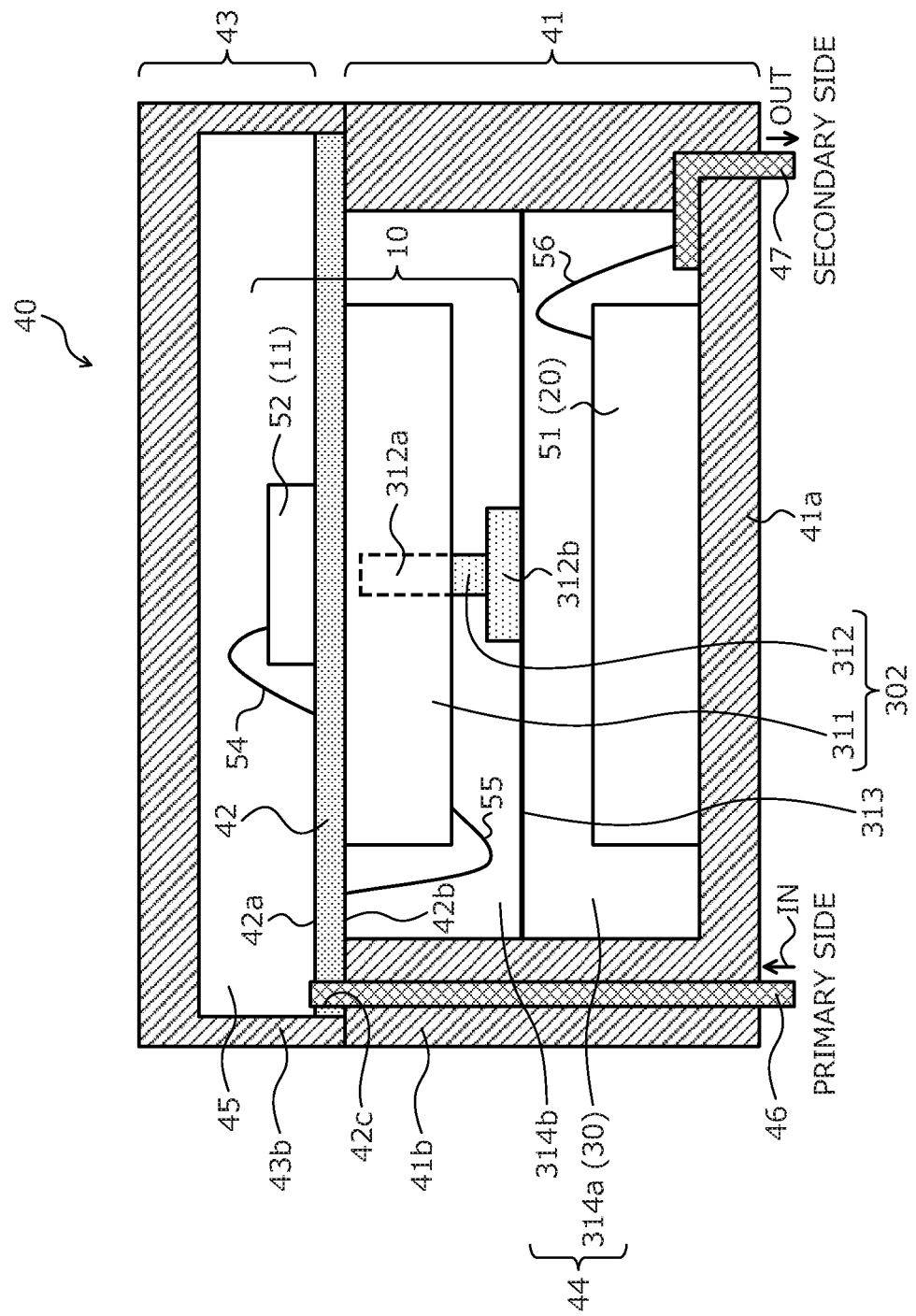
FIG. 21 is a cross-sectional diagram of a configuration of the package applied to FIG. 20.

FIG. 21 is a cross-sectional diagram of the configuration of the package 40 applied to FIG. 20. Inside the package 40, an insulating substrate having the solenoid coil 311 of the solenoid valve 302 formed thereon instead of the piezoelectric chip is attached to the back face 42*b* of the base substrate 42. One end of the solenoid coil 311 is connected to the circuit pattern on the back face 42*b* of the base substrate 42 by the bonding wire 55 and is electrically connected to the transmitting chip 52 through the circuit pattern. The other end of the solenoid coil 311 is connected to the lowest potential of the first power source 14 through the circuit pattern on the back face 42*b* of the base substrate 42. The solenoid valve 302 faces the pressure sensor IC chip 51 through the insulating medium that constitutes the pressure propagation region 30. The circuit pattern on the front face 42*a* of the base substrate 42 and the circuit pattern on the back face 42*b* of the base substrate 42 are electrically connected properly to each other by a conductive substance filling the via hole not depicted.

On the inner side of the solenoid coil 311, a plunger 312 of the solenoid valve 302 is arranged to be movable. The solenoid valve 302 may be that of a pulling type that introduces the plunger 312 into the inner side of the solenoid coil 311 when the current is supplied from the transmitting circuit 301, or may be that of a pushing type that extrudes the plunger 312 from the inner side of the solenoid coil 311 when the current is supplied from the transmitting circuit 301. The plunger 312 includes a plunger main body 312*a* that has a substantially circular column-like shape and that is introduced into the inner side of the solenoid coil 311. In FIG. 21, the portion of the plunger main body 312*a* positioned in the solenoid coil 311 is indicated by a dotted line and the portion positioned outside the solenoid coil 311 is indicated by hatching (similarly in FIGS. 22 to 26).

An end portion 312*b* of the plunger 312 toward the pressure sensor IC chip 51 may have a flat plat-like shape perpendicularly intersecting an axial direction of the plunger main body 312*a* and a flat face whose area is larger than that of a bottom face of the plunger main body 312*a*. When the plunger 312 is introduced into the inner side of the solenoid coil 311, the end portion 312*b* toward the pressure sensor IC chip 51 is in point contact or surface contact with a movable sheet 313 described later. In FIG. 21, the movable sheet 313 is indicated by a thick line (similarly in FIGS. 21 to 24). When the plunger 312 is extruded from the inner side of the solenoid coil 311, the plunger 312 applies to the movable sheet 313, a force in the direction to push the movable sheet 313 to the side of the pressure sensor IC chip 51 whereby the pressure 31 is generated in the pressure propagation region 30 through the movable sheet 313.

The movable sheet 313 is arranged between the solenoid valve 302 and the pressure sensor IC chip 51. The movable sheet 313 divides the first space 44 of the package 40 into a space 314a toward the pressure sensor IC chip 51 and a space 314b toward the solenoid valve 302. Of the first space 44 divided by the movable sheet 313, the space 314a with the pressure sensor IC chip 55 is the pressure propagation region 30. The movable sheet 313 is, for example, a resin film or a rubber sheet that has a substantially rectangular planar shape and an elastic modulus enabling curvature to the side of the pressure sensor IC chip 51 in a convex shape whose summit is a point in contact with the plunger 312. The movable sheet 313 is attached to, for example, the side wall 41b of the package main body 41 such that the airtightness of the pressure propagation region 30 is secured. By a force applied by the plunger 312 that is extruded from the inner side of the solenoid coil 311, the movable sheet 313 is moved toward the pressure sensor IC chip 51 with the point of the movable sheet 313 bonded to the side wall 41b of the package main body 41 as a fulcrum.

As described, according to the twelfth embodiment, effects similar to those of the first to the eleventh embodiments may be achieved even when the solenoid valve is arranged instead of the piezoelectric element because the pressure may be generated in the pressure propagation region by the solenoid valve.

Figure 22:
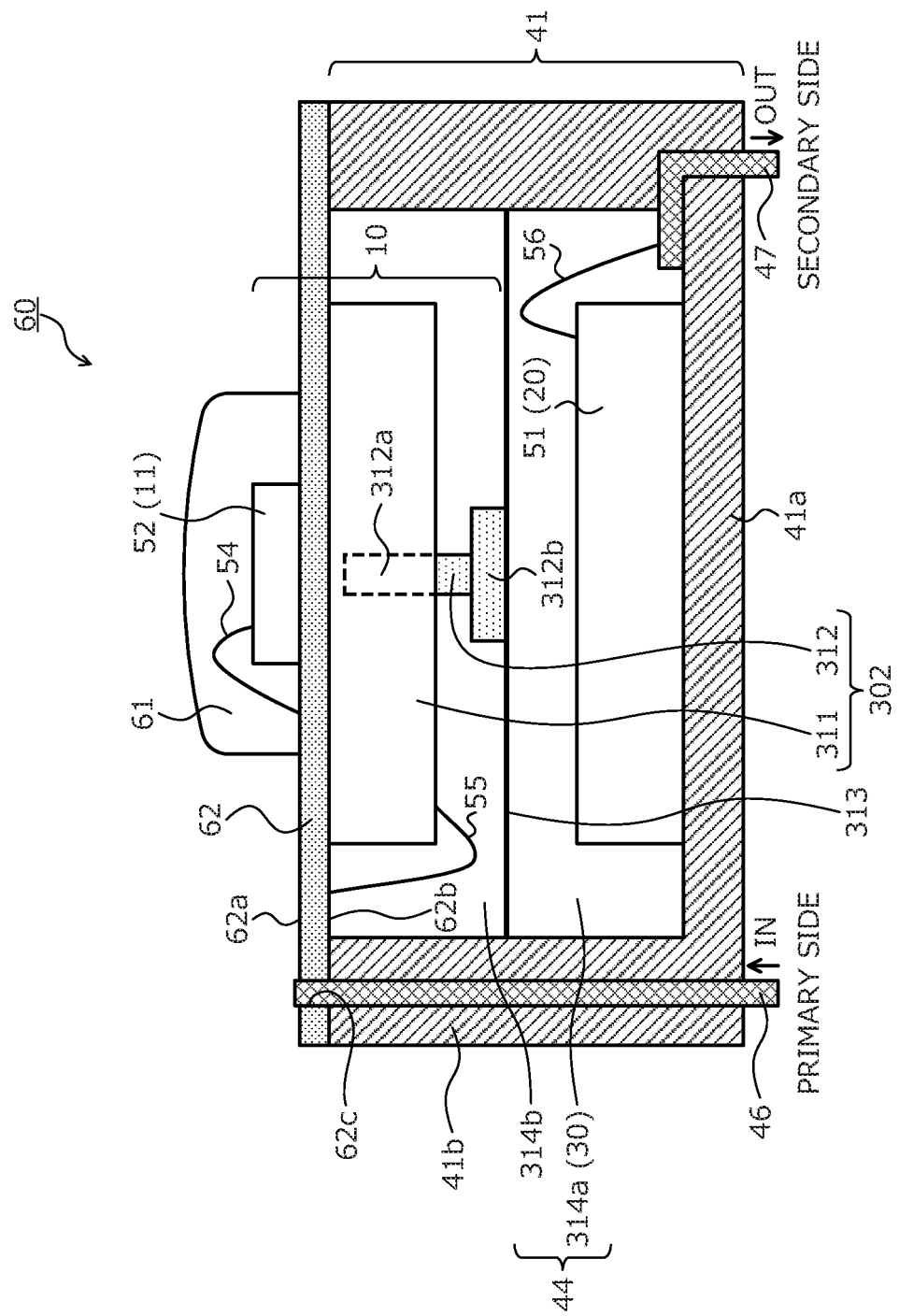
FIG. 22 is a cross-sectional diagram of a circuit configuration of a signal transmitting device according to a thirteenth embodiment.

A configuration of a signal transmitting device according to a thirteenth embodiment will be described. FIG. 22 is a cross-sectional diagram of the circuit configuration of the signal transmitting device according to the thirteenth embodiment. The circuit configuration of the signal transmitting device according the thirteenth embodiment is same as that of the signal transmitting device according the twelfth embodiment (see FIG. 20). The signal transmitting device according the thirteenth embodiment is a signal transmitting device formed by applying the twelfth embodiment to the signal transmitting device according to the second embodiment (see FIG. 3). Instead of the piezoelectric chip, the solenoid valve 302 and the movable sheet 313 are arranged in the first space 44 of the package 60 having the configuration in which no package cap is provided, the solenoid valve 302 and the movable sheet 313 being arranged in the same manner as those of the twelfth embodiment.

As described, according to the thirteenth embodiment, effects similar to those of the first to the twelfth embodiments may be achieved.

Figure 23:
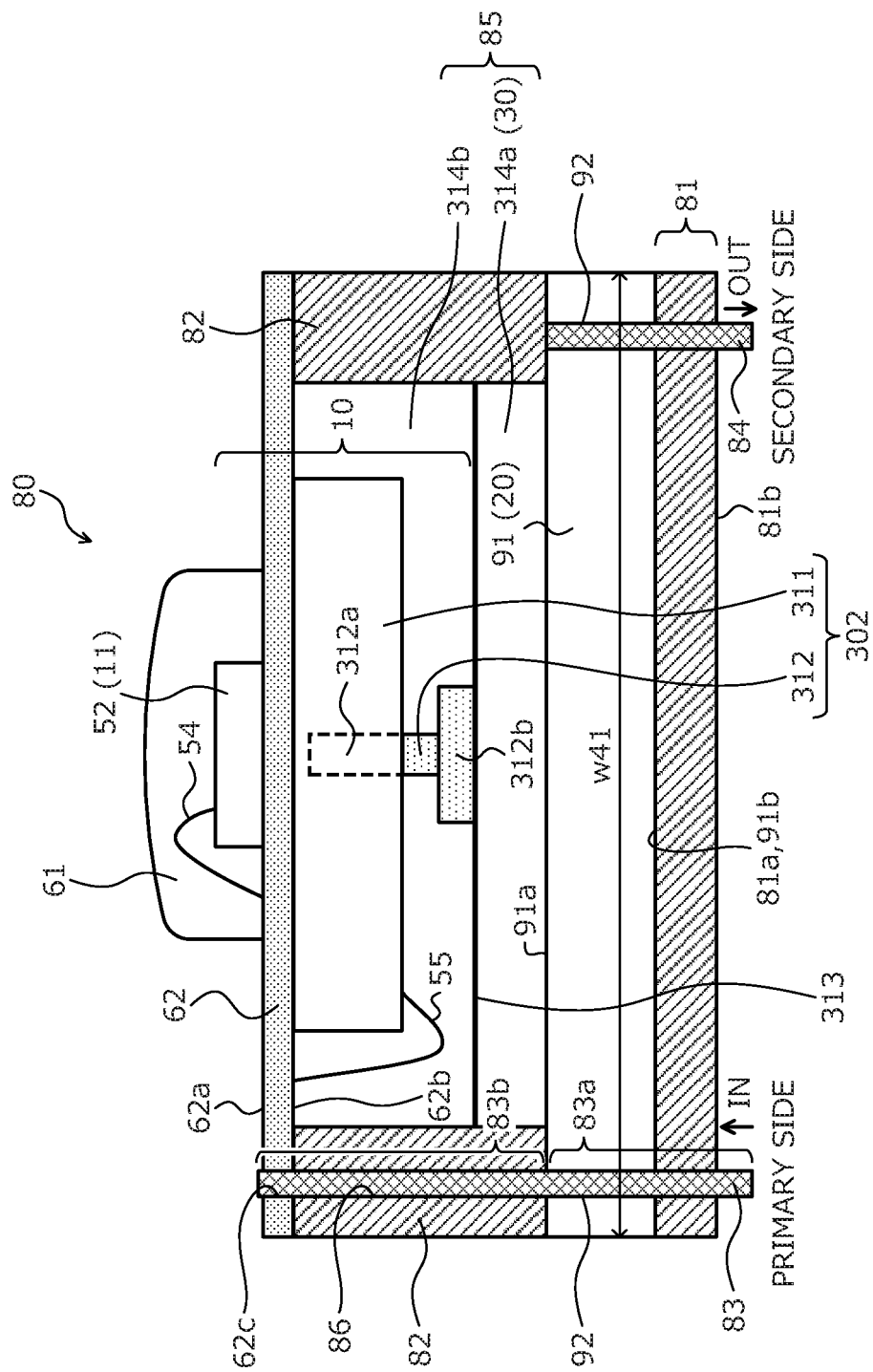
FIG. 23 is a cross-sectional diagram of a circuit configuration of a signal transmitting device according to a fourteenth embodiment.

A configuration of a signal transmitting device according to a fourteenth embodiment will be described. FIG. 23 is a cross-sectional diagram of the circuit configuration of the signal transmitting device according to the fourteenth embodiment. The circuit configuration of the signal transmitting device according the fourteenth embodiment is same as that of the signal transmitting device according the twelfth embodiment (see FIG. 20). The signal transmitting device according the fourteenth embodiment is a signal transmitting device formed by applying the twelfth embodiment to the signal transmitting device according to the fourth embodiment (see FIG. 5). Instead of the piezoelectric chip, the solenoid valve 302 and the movable sheet 313 are arranged in the same manner as those of the twelfth embodiment, the solenoid valve 302 and the movable sheet 313 being arranged in the first space 85 of the package 80 formed by bonding the package main body 81 and the base substrate 62 to each other through the interposer 82. The movable sheet 313 is bonded to, for example, the interposer 82 such that the airtightness of the pressure propagation region 30 is secured.

As described, according to the fourteenth embodiment, effects similar to those of the first to the thirteenth embodiments may be achieved.

Figure 24:
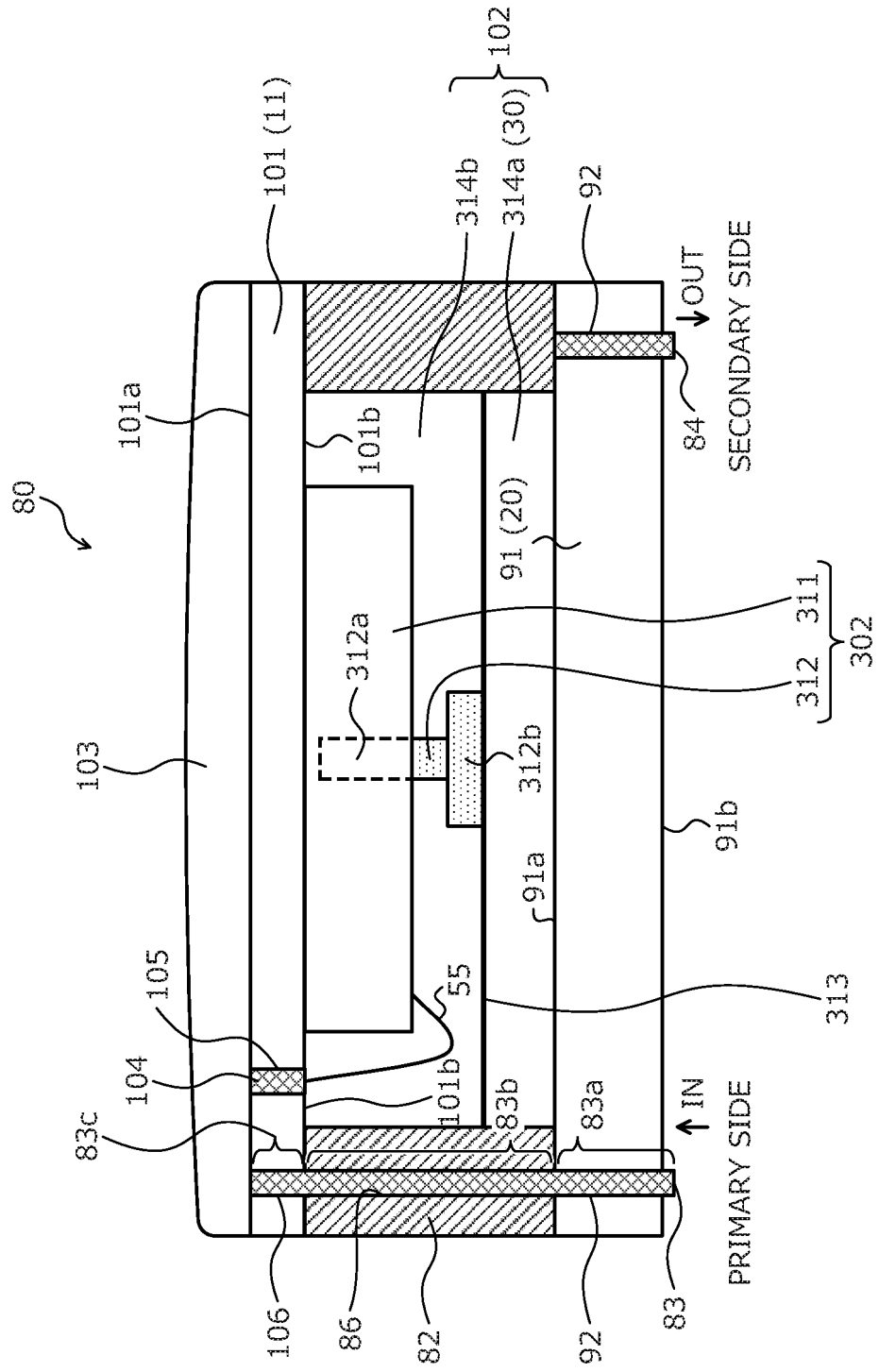
FIG. 24 is a cross-sectional diagram of a circuit configuration of a signal transmitting device according to a fifteenth embodiment.

A configuration of a signal transmitting device according to a fifteenth embodiment will be described. FIG. 24 is a cross-sectional diagram of the circuit configuration of the signal transmitting device according to the fifteenth embodiment. The circuit configuration of the signal transmitting device according the fifteenth embodiment is same as that of the signal transmitting device according the twelfth embodiment (see FIG. 20). The signal transmitting device according the fifteenth embodiment is a signal transmitting device formed by applying the twelfth embodiment to the signal transmitting device according to the fifth embodiment (see FIG. 6). The solenoid valve 302 and the movable sheet 313 are arranged in the same manner as those of the twelfth embodiment instead of the piezoelectric chip in the first space 102 of the package 80 constituted only by the interposer 82 that is arranged between the pressure sensor IC chip 91 and the transmitting chip 101. The movable sheet 313 is bonded to, for example, the interposer 82 such that the airtightness of the pressure propagation region 30 is secured.

As described, according to the fifteenth embodiment, effects similar to those of the first to the fourteenth embodiments may be achieved.

A configuration of a signal transmitting device according to a sixteenth embodiment will be described. FIG. 25 is a cross-sectional diagram of the circuit configuration of the signal transmitting device according to the sixteenth embodiment. The circuit configuration of the signal transmitting device according the sixteenth embodiment is same as that of the signal transmitting device according the twelfth embodiment (see FIG. 20). The signal transmitting device according to the sixteenth embodiment differs from the signal transmitting device according to the fifteenth embodiment in that the airtightness of the pressure propagation region 30 is secured by the plunger 312 of the solenoid valve 302 instead of the movable sheet.

For example, an end portion 312c of the plunger 312 facing the pressure sensor IC chip 91, has a flat plate-like shape perpendicularly intersecting the axis direction of the plunger main body 312a, has a flat face whose area is larger than that of the bottom face of the plunger main body 312a, and is in contact with the inner wall of the interposer 82. Side faces (facing in the four directions) of the end portion 312c are in contact with the inner wall of the interposer 82 such that the airtightness of the pressure propagation region 30 is secured and the operation of the plunger 312 is not obstructed. The end portion 312c of the plunger 312 divides the first space 102 of the package 80 into the space 314a to be the pressure propagation region 30 toward the pressure sensor IC chip 91 and the space 314b toward the solenoid valve 302. The plunger 312 directly generates the pressure 31 in the overall pressure propagation region 30 when the plunger 312 is extruded from the inner side of the solenoid coil 311.

As described, according to the sixteenth embodiment, effects similar to those of the first to the fifteenth embodiments may be achieved even when the airtightness of the pressure propagation region is secured by another member instead of the movable sheet.

A configuration of a signal transmitting device according to a seventeenth embodiment will be described. FIG. 26 is a cross-sectional diagram of the circuit configuration of the signal transmitting device according to the seventeenth embodiment. The circuit configuration of the signal transmitting device according the seventeenth embodiment is same as that of the signal transmitting device according the twelfth embodiment (see FIG. 20). The signal transmitting device according to the seventeenth embodiment differs from the signal transmitting device according to the fifteenth embodiment in that the airtightness of the pressure propagation region 30 is secured by a second interposer 315 instead of the movable sheet.

For example, the second interposer 315 having, for example, a substantially rectangular planar shape, and whose four sides are bonded to the inner wall of the interposer (hereinafter, referred to as "first interposer") 82 constituting the package 80 is provided between the solenoid valve 302 and the pressure sensor IC chip 91. The second interposer 315 divides the first space 102 of the package 80 into the space 314a to be the pressure propagation region 30 toward the pressure sensor IC chip 91 and the space 314b toward the solenoid valve 302. In a portion of the second interposer 315 facing the plunger 312, the second interposer 315 has an opening 315a that has a substantially same planar shape as that of the end portion 312b of the plunger 312 (the end portion 312b toward the pressure sensor IC chip 91).

The opening 315a of the second interposer 315 is closed by the end portion 312b of the plunger 312 of the solenoid valve 302. The airtightness of the pressure propagation region 30 is secured by the second interposer 315 and the plunger 312. The opening 315a of the second interposer 315 has a width enabling the airtightness of the pressure propagation region 30 to be secured without obstructing movement of the plunger 312 of the solenoid valve 302. When the plunger 312 is extruded from the inner side of the solenoid coil 311, the plunger 312 directly generates the pressure 31 in the pressure propagation region 30 through the opening 315a of the second interposer 315.

As described, according to the seventeenth embodiment, effects similar to those of the first to the sixteenth embodiments may be achieved even when the airtightness of the pressure propagation region is secured by another member instead of the movable sheet.

The operation of the signal transmitting device according to each of the twelfth to the seventeenth embodiments is same as the operation of the signal transmitting device according to the eleventh embodiment except that the pressure 31 is generated in the pressure propagation region 30 by the solenoid valve 302 instead of the piezoelectric element. The actuator 10 including the solenoid valve 302 instead of the piezoelectric element may be used by applying the twelfth embodiment to the signal transmitting device according to each of the third, the seventh, the eighth, and the tenth embodiments.

Figure 27A:
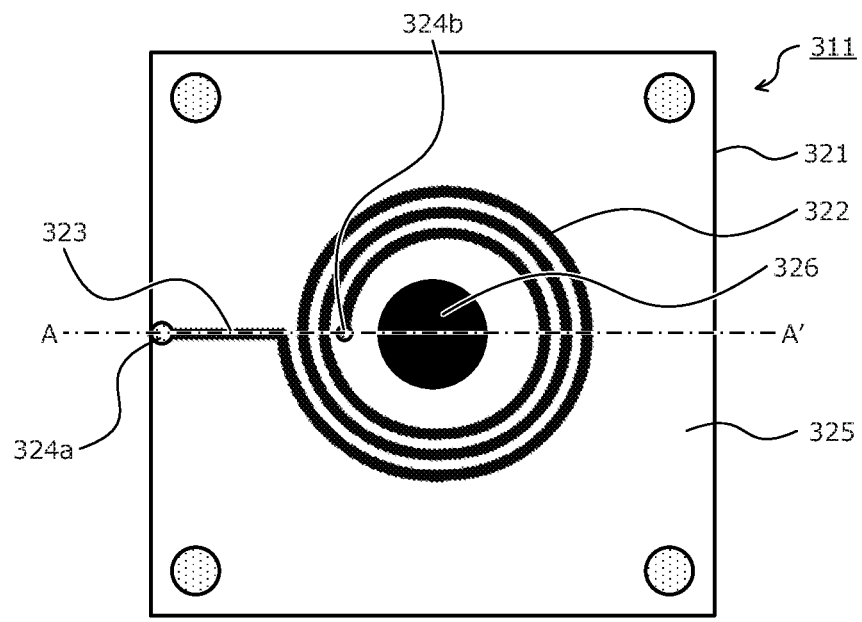
FIGS. 27A, 27B, and 27C are explanatory diagrams of the configuration of a portion of a signal transmitting device according to an eighteenth embodiment.
Figure 27B:
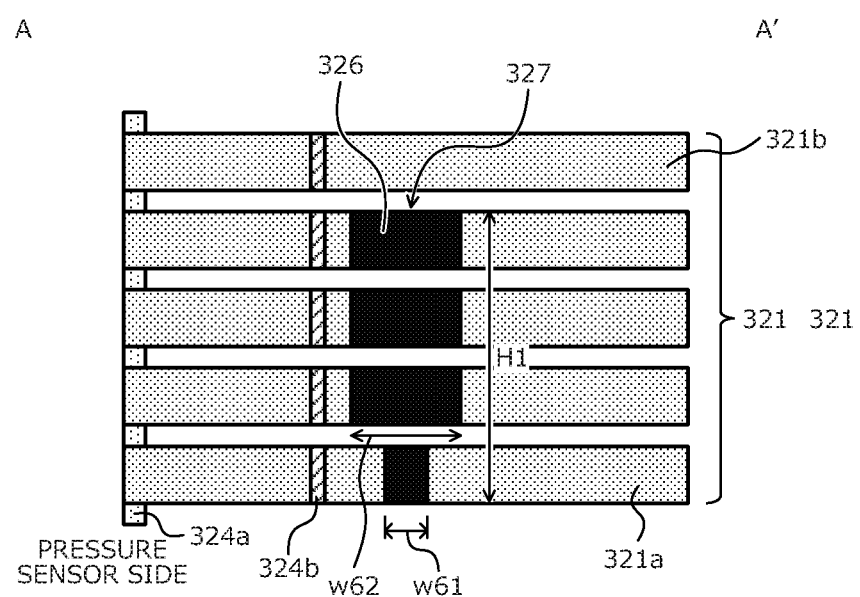
Figure 27C:
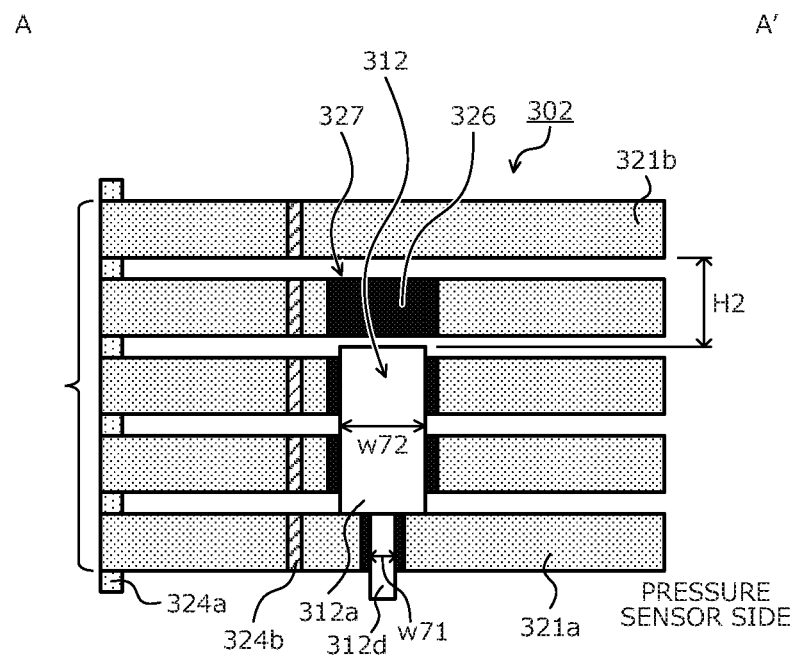

An example of a configuration of the solenoid valve 302 of the signal transmitting device according to each of the twelfth to the seventeenth embodiments will be described as an eighteenth embodiment. FIGS. 27A, 27B, and 27C are explanatory diagrams of the configuration of a portion of the signal transmitting device according to the eighteenth embodiment. FIG. 27A depicts a planar layout of the solenoid coil 311 without the plunger 312 mounted thereon. FIG. 27B depicts a cross-sectional view of the solenoid coil 311 without the plunger 312 mounted thereon. FIG. 27C depicts a cross-sectional view of the solenoid coil 311 with the plunger 312 mounted thereon. In FIG. 27A, a spiral coil 322 is indicated by a thick line and an opening 326 of an insulating substrate 321 is indicated by a black circle. In FIGS. 27B and 27C, the opening 326 of the insulating substrate 321 is indicated by a black rectangle and the spiral coil 322 is not depicted.

As depicted in FIG. 27A, the solenoid coil 311 includes the spiral coil 322 formed on each of both principal surfaces of the insulating substrate 321, and a lead wire 323, and land portions 324a and 324b of the spiral coil 322. The lead wire 323 of the spiral coil 322 is provided to be in contact with the end portion (the end of the spiral) on the outer side of the spiral coil 322. The one land portion 324a of the spiral coil 322 is in contact with the lead wire 323 and the other land portion 324b is provided at the end portion (the start of the spiral) on the inner side of the spiral coil 322. A reference numeral "325" denotes a heat conductive layer to externally dissipate the heat generated in the spiral coil 322. The plural insulating substrates 321 each including the spiral coils 322, the lead wires 323, and the land portions 324a and 324b are stacked on each other to constitute the solenoid coil 311 (FIG. 27B).

The land portions 324b on the inner sides of the spiral coils 322 on the front face and the back face of the same insulating substrate 321 are connected to each other by a conductive material filling a via hole. Of the different insulating substrates 321, the land portions 324a on the outer sides of the spiral coils 322 facing each other are electrically connected to each other by, for example, a solder bump (not depicted). The hollow solenoid coil 311 having the plural spiral coils 322 therein arranged in a circular column-like form is constituted by stacking on each other, the plural insulating substrates 321 each having the spiral coils 322 formed on both principal surfaces thereof. In the insulating substrate 321, the opening 326 having a planar shape of, for example, a circular shape is formed in a central portion of the spiral coil 322. A diameter w61 of the opening 326 of an insulating substrate 321a arranged nearest to the pressure sensor 20 (see FIG. 20) may be, for example, smaller than a diameter w62 of the opening 326 of another insulating substrate 321. The opening 326 is not provided in the insulating substrate 321 b that is arranged most separated from the pressure sensor 20.

The openings 326 of the plural insulating substrates 321 face each other in the depth direction (the direction perpendicularly intersecting the principal surfaces of the insulating substrates 321) and constitute a hollow portion 327 having a predetermined depth H1 spanning through the plural insulating substrates 321 in the central portion of the spiral coils 322. The plunger 312 is inserted into the hollow portion 327 (FIG. 27C). The hollow portion 327 has a depth H1 to completely accommodate the plunger 312 inside the hollow portion 327. The hollow portion 327 has a region having a predetermined depth H2 for the plunger 312 to be movable therein such that the plunger 312 is movable in the depth direction. The plunger 312 includes the plunger main body 312a having, for example, a substantially circular column-like shape. When the plunger 312 is at a position nearest to the pressure sensor 20 in the hollow portion 327, an end portion 312d toward the pressure sensor 20 protrudes outside the solenoid coil 311.

A diameter w72 of the plunger main body 312a of the plunger 312 is larger than the diameter w61 of the opening 326 of the insulating substrate 321a that is arranged nearest to the pressure sensor (FIG. 27C), and is smaller than the diameter w62 of the opening 326 of the other insulating substrates 321. An end portion 213d of the plunger 312 toward the pressure sensor 20 has, for example, a circular column-like shape whose axial direction is same as that of the plunger main body 312a and whose diameter w71 is smaller than that of the plunger main body 312a. The end portion 213d toward the pressure sensor 20 has a diameter that is smaller than the diameter w61 of the opening 326 of the insulating substrate 321a arranged nearest to the pressure sensor 20. When the plunger 312 is at a position nearest to the pressure sensor 20 in the hollow portion 327, the plunger main body 312a is held in contact with the insulating substrate 321a that is arranged nearest to the pressure sensor 20 and is thereby retained in the hollow portion 327.

In particular, when current is supplied to the solenoid valve 302, the plunger 312 is completely introduced into the inside of the hollow portion 327 to be retained therein. In addition, for example, when the supply of the current to the solenoid valve 302 is discontinued, the plunger 312 is moved to a position nearest to the pressure sensor 20 in the hollow portion 327 by, for example, the self-weight of the plunger 312 causing the end portion 312d on the side of the pressure sensor 20 to protrude outside the solenoid coil 311. The solenoid valve 302 exemplified in the eighteenth embodiment (see FIG. 27C) is that of the pulling type, introducing the plunger 312 into the inner side of the solenoid coil 311 when the current is supplied thereto. When the plunger 312 is at a position nearest to the pressure sensor 20 in the hollow portion 327, the highest pressure 31 is generated in the pressure propagation region 30 (see FIG. 20) and is propagated to the pressure sensor 20.

The configuration of the solenoid valve 302 depicted in FIG. 27 is an example, and the connection method for the plural spiral coils 322, the shapes of the hollow portion 327 and the plunger 312, and the like may variously be modified. For example, the diameter of the hollow portion 327 may be set to be uniform in the depth direction, and the plunger 312 may have the end portion toward the pressure sensor 20, formed to have a flat plate-like shape that perpendicularly intersects the axial direction of the plunger main body 312a and to have a flat face of a larger area than that of the bottom face of the plunger main body 312a. The solenoid valve 302 depicted in FIG. 27 may be that of the pushing type, extruding the plunger 312 from the inner side of the solenoid coil 311 when the current is supplied. When the solenoid valve 302 of the pushing type is employed, as above, the plunger 312 suffices to be introduced into the inside of the hollow portion 327 using an elastic body such as a spring. With the pulling type or the pushing type, the restoring force of the movable sheet 313 (see FIGS. 21 to 24) attached to the side wall of the package main body may be used as the force to return the plunger 312 to the original position after displacement.

As described, according to the eighteenth embodiment, the eighteenth embodiment is applicable to the twelfth to the seventeenth embodiments and effects similar to those of the first to the seventeenth embodiments may be achieved.

The present invention is not limited to the embodiments and may be modified variously within a scope not departing from the spirit of the present invention. For example, although description of the embodiments has been made taking, as an example, a case where the signal transmission is executed from the primary side to the secondary side, the signal may be transmitted from the secondary side to the primary side. Further, although the arrangement of the first and the second external connection terminals has been described in the embodiments taking, as an example, a case where the terminals are electrically connected to the external circuit at the bottom face of the package main body (or the back face of the pressure sensor IC chip), the arrangement of the first and the second external connection terminals may variously be modified. For example, one end of each of the first and the second external connection terminals may be externally exposed from the side wall of the package main body 41 (or the interposer) laterally bent in, for example, a substantially L-shape, or may be externally exposed from the package cap.

Although the second external connection terminal and the pressure sensor IC chip (or the receiving chip) are electrically connected to each other by wire bonding in the embodiments, these components may be electrically connected by wireless bonding using, for example, bumps (protrusion-like terminals). Instead of the pressure sensor IC chip of the first and the second embodiments, the sensor chip and the receiving chip may be used in the same manner as those of the third embodiment. Replacing the pressure sensor IC chip in each of the first, the second, and the fourth to the sixth embodiments with a sensor chip, the receiving chip may be arranged in a region of the front face of the sensor chip (the face exposed in the first space) other than in the sensor element. In the third embodiment, the receiving chip may be arranged in a region of the front face of the sensor chip other than in the sensor element. In the embodiments, although the insulating medium fills the first space entirely (the pressure propagation region), it suffices for at least the pressure between the piezoelectric element and the sensor element to be maintained.

According to the embodiments, a physical distance may be secured between the piezoelectric element (the passive element) of the actuator and the sensor element of the pressure sensor that are arranged in the same space. The dielectric breakdown voltage between the actuator and the pressure sensor may be set by the distance between the piezoelectric element and the sensor element (the distance between the passive element and the first semiconductor substrate). The distance between the piezoelectric element and the sensor element may be set without being constrained by the chip size, and the dielectric breakdown voltage between the actuator and the pressure sensor may be set variously based on the magnitude of the applied voltage.

According to the signal transmitting device of the present invention, an effect is achieved in that signal transmission with high insulation may be executed between components that are integrated in a single module.

As described, the signal transmitting device according to the present invention is useful for a signal transmitting device that transmits signals mutually between the primary side and the secondary side in a state where the primary side and the secondary side are electrically insulated from each other, and is especially suitable for a module that drives a switching element.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A signal transmitting device comprising:
   a transmitting circuit configured to receive an input signal, and to transmit a first electrical signal based on the input signal;
   a passive element configured to generate a pressure based on the first electrical signal;
   a first semiconductor device including a sensor element configured to detect the pressure, the sensor element converting the pressure into a second electrical signal, the sensor element separated from the passive element by a predetermined distance;

a receiving circuit configured to output, to a secondary side terminal, an output signal that is based on the second electrical signal;

an insulating medium that electrically insulates the passive element and the sensor element from each other, the insulating medium filling a pressure propagation region between the passive element and the first semiconductor device, the pressure being propagated from the passive element to the sensor element through the insulating medium;

a package member including a concave portion in which the first semiconductor device is arranged; and a base substrate on which the passive element is arranged, wherein the base substrate is arranged at a position to close the concave portion such that the passive element is arranged inside the concave portion of the package member, the base substrate being bonded to the package member, signal transmission is performed from the transmitting circuit to the receiving circuit by propagation of the pressure from the passive element, through the insulating medium, to the sensor element, and the pressure propagation region is a space surrounded by the package member and the base substrate.

2. The signal transmitting device according to claim 1, wherein the transmitting circuit receives the input signal in an analog form and transmits the first electrical signal, an amplitude of the first electrical signal increases and decreases in a continuous-sloped manner corresponding to the input signal, and the receiving circuit outputs the second electrical signal as the output signal, the receiving circuit outputting the second electrical signal to the secondary side terminal, such that an amplitude of the second electrical signal increases and decreases based on the first electrical signal and has a slope corresponding to the slope of the first electrical signal.

3. The signal transmitting device according to claim 1, wherein the transmitting circuit receives the input signal in a digital form having discrete voltage values representing different digital states, and transmits the first electrical signal, such that an amplitude of the first electrical signal increases and decreases in discrete increments corresponding to the discrete voltage values, the sensor element generates the second electrical signal such that an amplitude of the second electrical signal increases and decreases in discrete increments corresponding to the first electrical signal, and the receiving circuit compares a voltage value of the second electrical signal with a reference voltage and outputs the output signal, such that an amplitude of the output signal increases and decreases in discrete increments corresponding to the second electrical signal.

4. The signal transmitting device according to claim 1, wherein the transmitting circuit, sensor element, and receiving circuit are configured such that one cycle of the output signal has a same duration as one cycle of the input signal.

5. The signal transmitting device according to claim 1, wherein the transmitting circuit receives the input signal in a digital form for plural cycles in a predetermined time period and transmits the first electrical signal for the plural cycles, an amplitude of the first electrical signal discretely increasing or decreasing non-linearly, and the receiving circuit outputs the output signal such that an amplitude of the output signal continuously increases or decreases in a pseudo-linear manner for one cycle that includes plural cycles of the second electrical signal, an amplitude of the second electrical signal discretely increasing or decreasing based on non-linearity of the first electrical signal for the plural cycles.

6. The signal transmitting device according to claim 1, wherein the passive element and the sensor element face each other in the pressure propagation region.

7. The signal transmitting device according to claim 1, further comprising a high hardness member bonded to the passive element, the high hardness member being positioned between the passive element and the sensor element, the high hardness member containing a material having a hardness higher than a hardness of the insulating medium.

8. The signal transmitting device according to claim 1, further comprising a second semiconductor device including the transmitting circuit, wherein the second semiconductor device is arranged on the base substrate to be separated from the passive element.

9. The signal transmitting device according to claim 1, further comprising a first external connection terminal integrally formed with the package member, wherein a first end of the first external connection terminal is exposed from a bottom face of the package member to an exterior, the first end being electrically connected to an external circuit on a primary side, and a second end of the first external connection terminal penetrates a through hole of the base substrate, the second end being electrically connected to the transmitting circuit through the through hole of the base substrate.

10. The signal transmitting device according to claim 1, wherein the receiving circuit is provided in the first semiconductor device including the sensor element.

11. The signal transmitting device according to claim 1, further comprising a third semiconductor device including the receiving circuit, wherein the third semiconductor device is arranged on a face of the package member, the face on which the first semiconductor device is arranged, the third semiconductor device being separated from the first semiconductor device.

12. The signal transmitting device according to claim 1, further comprising a second external connection terminal integrally formed with the package member, wherein a first end of the second external connection terminal is exposed from a bottom face of the package member to an exterior, the first end being electrically connected to an external circuit on a secondary side, and wherein a second end of the second external connection terminal is exposed in the pressure propagation region, the second end being electrically connected to the receiving circuit.

13. The signal transmitting device according to claim 1, wherein the passive element is formed by a piezoelectric and ferroelectric material that generates the pressure by deforming or vibrating when the first electrical signal is received, or the passive element has a movable element constituted by a magnetic body that generates the pressure by being moved when the first electrical signal is received and a magnetic field is generated or when the first electrical signal is discontinued and the magnetic field disappears.

14. A signal transmitting device, comprising:
a transmitting circuit configured to receive an input signal, and to transmit a first electrical signal based on the input signal;
a passive element configured to generate a pressure based on the first electrical signal;
a first semiconductor device including a sensor element configured to detect the pressure, the sensor element converting the pressure into a second electrical signal, the sensor element separated from the passive element by a predetermined distance;
a receiving circuit configured to output, to a secondary side terminal, an output signal that is based on the second electrical signal;
an insulating medium that electrically insulates the passive element and the sensor element from each other, the insulating medium filling a pressure propagation region between the passive element and the first semiconductor device, the pressure being propagated from the passive element to the sensor element through the insulating medium;
a package member in which the first semiconductor device is arranged;
a base substrate on which the passive element is arranged; and
a relaying member joining the first semiconductor device and the base substrate to each other, wherein
signal transmission is performed from the transmitting circuit to the receiving circuit by propagation of the pressure from the passive element, through the insulating medium, to the sensor element; and
the pressure propagation region is a space surrounded by the first semiconductor device, the base substrate, and the relaying member.

15. The signal transmitting device according to claim 14, further comprising
a first external connection terminal integrally formed with the package member, wherein
a first end of the first external connection terminal is exposed from the package member to an exterior, the first end being electrically connected to an external circuit on a primary side, and
a second end of the first external connection terminal penetrates, a through hole of the base substrate, the second end being electrically connected to the transmitting circuit through the through hole of the base substrate.

16. The signal transmitting device according to claim 14, further comprising
a second external connection terminal integrally formed with the package member, wherein
a first end of the second external connection terminal is exposed from the package member to an exterior, the first end being electrically connected to an external circuit on a secondary side, and
a second end of the second external connection terminal is electrically connected to the receiving circuit through a via of the first semiconductor device.

17. A signal transmitting device, comprising:
a transmitting circuit configured to receive an input signal, and to transmit a first electrical signal based on the input signal;
a passive element configured to generate a pressure based on the first electrical signal;
a first semiconductor device including a sensor element configured to detect the pressure, the sensor element converting the pressure into a second electrical signal, the sensor element separated from the passive element by a predetermined distance;
a receiving circuit configured to output, to a secondary side terminal, an output signal that is based on the second electrical signal;
an insulating medium that electrically insulates the passive element and the sensor element from each other, the insulating medium filling a pressure propagation region between the passive element and the first semiconductor device, the pressure being propagated from the passive element to the sensor element through the insulating medium;
a second semiconductor device including the transmitting circuit; and
a relaying member having a frame-like planar shape, the relaying member joining the first semiconductor device and the second semiconductor device to each other, wherein
signal transmission is performed from the transmitting circuit to the receiving circuit by propagation of the pressure from the passive element, through the insulating medium, to the sensor element; and
the pressure propagation region is a space surrounded by the first semiconductor device, the second semiconductor device, and the relaying member.

18. The signal transmitting device according to claim 17, further comprising
a first external connection terminal penetrating a via of the first semiconductor device, a through hole of the relaying member, and a via of the second semiconductor device, wherein
a first end of the first external connection terminal is exposed from the via of the first semiconductor device to an exterior, the first end being electrically connected to an external circuit on a primary side, and
a second end of the first external connection terminal is electrically connected to the transmitting circuit through the via of the second semiconductor device.

19. The signal transmitting device according to claim 17, further comprising
a second external connection terminal penetrating a via of the first semiconductor device, wherein
a first end of the second external connection terminal is electrically connected to an external circuit on a secondary side, and
a second end of the second external connection terminal is electrically connected to the receiving circuit through a via of the first semiconductor device.

* * * * *